US012804956B2

(12) United States Patent
Lin et al.

(10) Patent No.: US 12,804,956 B2
(45) Date of Patent: Nov. 17, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Jhon-Jhy Liaw, Zhudong Township, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 631 days.

(21) Appl. No.: 18/170,416

(22) Filed: Feb. 16, 2023

(65) Prior Publication Data

US 2024/0079500 A1 Mar. 7, 2024

Related U.S. Application Data

(60) Provisional application No. 63/404,269, filed on Sep. 7, 2022.

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |

(52) U.S. Cl.

CPC ....... *H10D 30/6757* (2025.01); *H10D 30/014* (2025.01); *H10D 30/43* (2025.01); *H10D 30/6735* (2025.01); *H10D 62/121* (2025.01); *H10D 64/017* (2025.01)

(58) Field of Classification Search

CPC ........... H10D 30/6757; H10D 30/6735; H10D 62/121

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |

(Continued)

*Primary Examiner* — Amar Movva

(74) *Attorney, Agent, or Firm* — Cooper Legal Group, LLC

(57) ABSTRACT

Semiconductor structures and methods for forming the same are provided. The semiconductor structure includes a plurality of first horizontal nanostructures formed over a substrate, and a plurality of second horizontal nanostructures adjacent to the first horizontal nanostructures. The semiconductor structure includes a dielectric wall formed between the first horizontal nanostructures and the second horizontal nanostructures. The semiconductor structure also includes a vertical nanostructure between the dielectric wall and the first horizontal nanostructures, and the vertical nanostructure is connected to and in direct contact with the dielectric wall. The semiconductor structure includes a gate structure surrounding the first horizontal nanostructures, the second horizontal nanostructures and the vertical nanostructure.

20 Claims, 48 Drawing Sheets

(56) References Cited

U.S. PATENT DOCUMENTS

| | | | | |
|---|---|---|---|---|
| 9,576,814 | B2 | 2/2017 | Wu et al. | |
| 9,608,116 | B2 | 3/2017 | Ching et al. | |
| 2014/0332859 | A1* | 11/2014 | Colinge | H10D 30/014 257/288 |
| 2021/0043763 | A1* | 2/2021 | Jung | H10D 30/62 |

* cited by examiner

SEMICONDUCTOR STRUCTURE AND METHOD FOR FORMING THE SAME

CROSS REFERENCE TO RELATED APPLICATIONS

This application claims the benefit of U.S. Provisional Application No. 63/404,269 filed on Sep. 7, 2022, and the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2 to 2N-2 show cross-sectional representations of various stages of manufacturing the semiconductor structure shown along line B-B' in FIG. 1F, in accordance with some embodiments.

FIGS. 4A-1 to 4K-1 show cross-sectional representations of various stages of manufacturing the semiconductor structure shown along line A-A' in FIG. 3F, in accordance with some embodiments.

FIGS. 4A-2 to 4K-2 show cross-sectional representations of various stages of manufacturing the semiconductor structure shown along line B-B' in FIG. 3F, in accordance with some embodiments.

FIG. 4K'-2 shows a cross-sectional view of a semiconductor structure, in accordance with some embodiments.

DETAILED DESCRIPTION

Figure 1A:
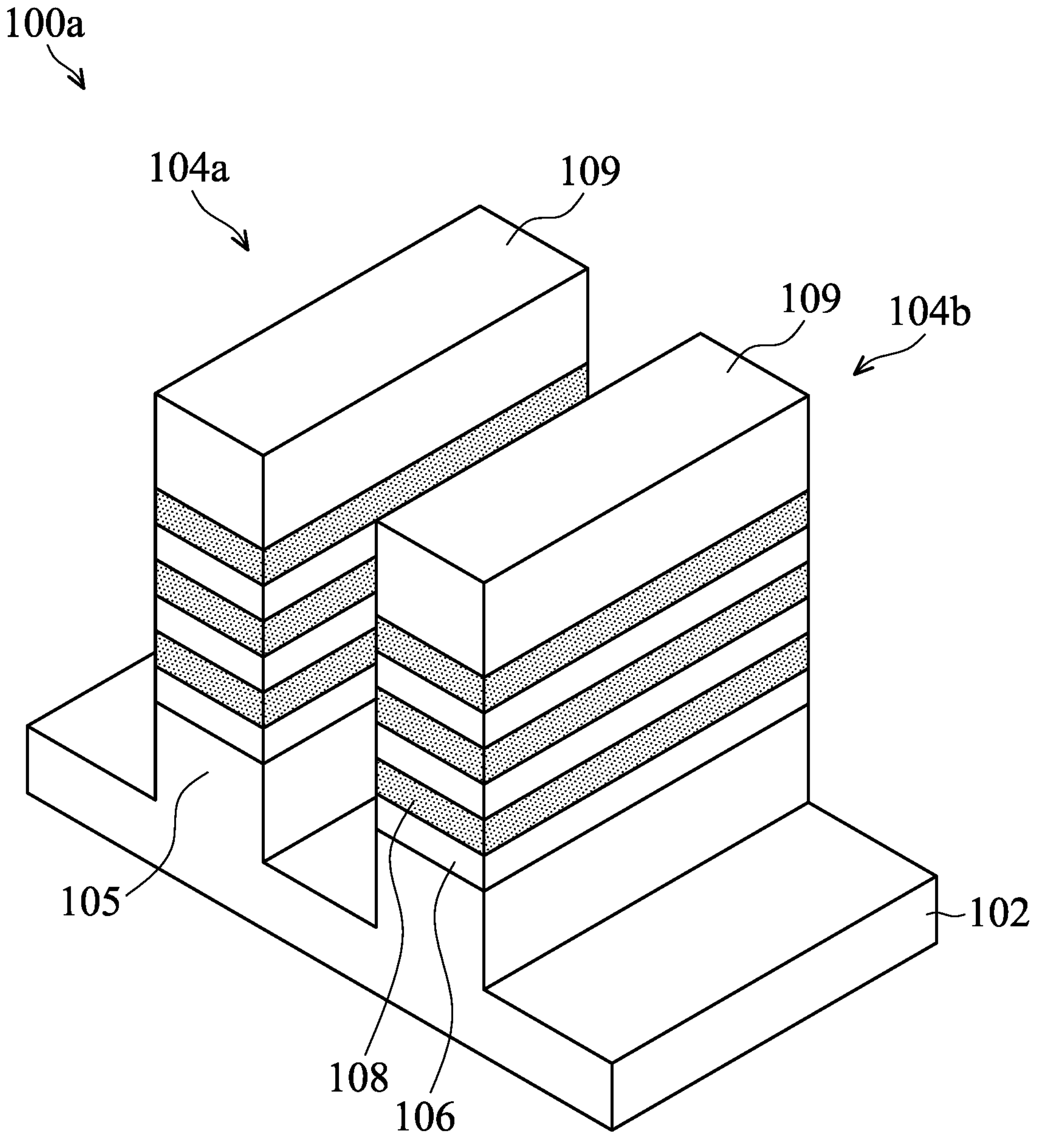
FIGS. 1A to 1F show perspective views of intermediate stages of manufacturing a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a plurality of first horizontal nanostructures and a plurality of second horizontal nanostructures, and a plurality of vertical nanostructures. A dielectric wall is between the first horizontal nanostructures and the second horizontal nanostructures. The first horizontal nanostructures and the second horizontal nanostructures are connected to the vertical nanostructures. The first horizontal nanostructures, the second horizontal nanostructures, and the vertical nanostructures are wrapped by the gate structure. The S/D structure is adjacent to the gate structure. In addition to horizontal nanostructures, the vertical nanostructures provide additional channel area. Therefore, the effective width Weff of the semiconductor structure includes the widths of the vertical layer (or vertical nanostructure) and widths of the horizontal nanostructures. Since the effective width Weff of the semiconductor structure is increased, the on-state current (Ion) of the semiconductor structure is improved. Therefore, the performance of the semiconductor structure is improved. Source/drain (S/D) region(s) S/D structures may refer to a source or a drain, individually or collectively dependent upon the context.

FIGS. 1A to 1F show perspective views of intermediate stages of manufacturing a semiconductor structure 100*a* in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiments, the first semiconductor layers 106 and the second semiconductor layers 108 independently include silicon (Si), germanium (Ge), silicon germanium ($Si_{1-x}Gex$, $0.1<x<0.7$, the value x is the atomic percentage of germanium (Ge) in the silicon germanium), indium arsenide (InAs), indium gallium arsenide (InGaAs), indium antimonide (InSb), or another applicable material.

The first semiconductor layers 106 and the second semiconductor layers 108 are made of different materials having different lattice constants. In some embodiments, the first semiconductor layer 106 is made of silicon (Si), and the second semiconductor layer 108 is made of silicon germanium ($Si_{1-x}Gex$, $0.1<x<0.7$). In some other embodiments, the first semiconductor layer 106 is made of silicon germanium ($Si_{1-x}Gex$, $0.1<x<0.7$), and the second semiconductor layer 108 is made of silicon (Si).

It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

As shown in FIG. 1A, the first semiconductor material layers 106 and the second semiconductor material layers 108 are patterned to form a semiconductor material stack over a fin structure 105, in accordance with some embodiments. The semiconductor material stack includes a first stack structure 104*a* and a second stack structure 104*b* above the fin structure 105.

In some embodiments, the patterning process includes forming a mask structure 109 over the semiconductor material stack, and etching the semiconductor material stack and the underlying substrate 102 through the mask structure. In some embodiments, the mask structure 109 is a multilayer structure including a pad oxide layer and a nitride layer formed over the pad oxide layer. The pad oxide layer may be made of silicon oxide, which is formed by thermal oxidation or chemical vapor deposition (CVD), and the nitride layer may be made of silicon nitride, which is formed by chemical vapor deposition (CVD), such as low-temperature chemical vapor deposition (LPCVD) or plasma-enhanced CVD (PECVD).

Figure 1B:
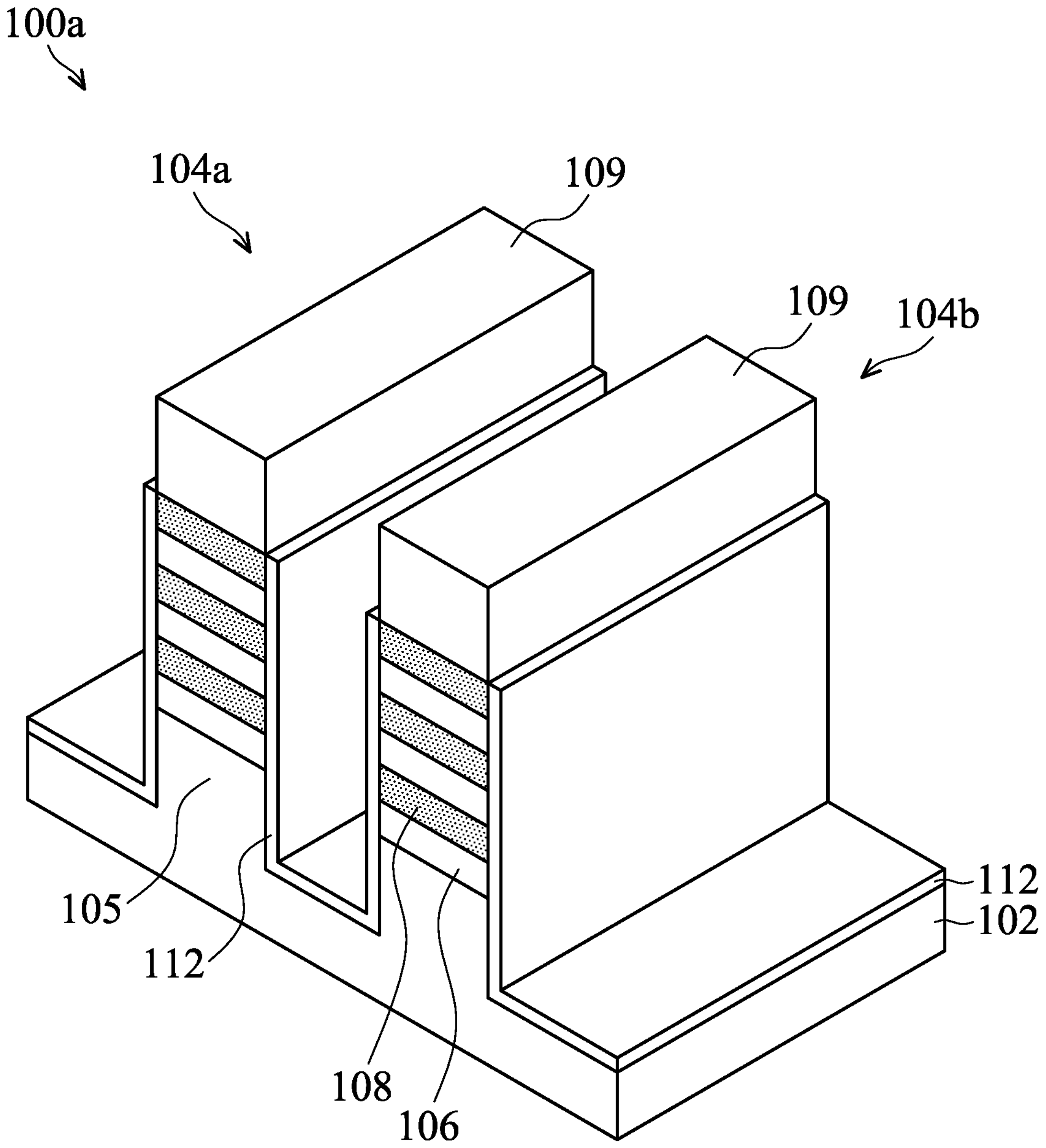

As shown in FIG. 1B, after the first stack structure 104*a* and the second stack structure 104*b* are formed, a vertical layer 112 is formed over the sidewall of the first stack structure 104*a* and the second stack structure 104*b*, in accordance with some embodiments. In addition, the vertical layer 112 is formed over the structure 105 and the substrate 102.

In some embodiments, the second semiconductor material layers 108 and the vertical layer 112 are made of different materials. In some embodiments, the vertical layer 112 includes silicon (Si), germanium (Ge), silicon germanium ($Si_{1-x}Gex$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the vertical layer 112 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1C:
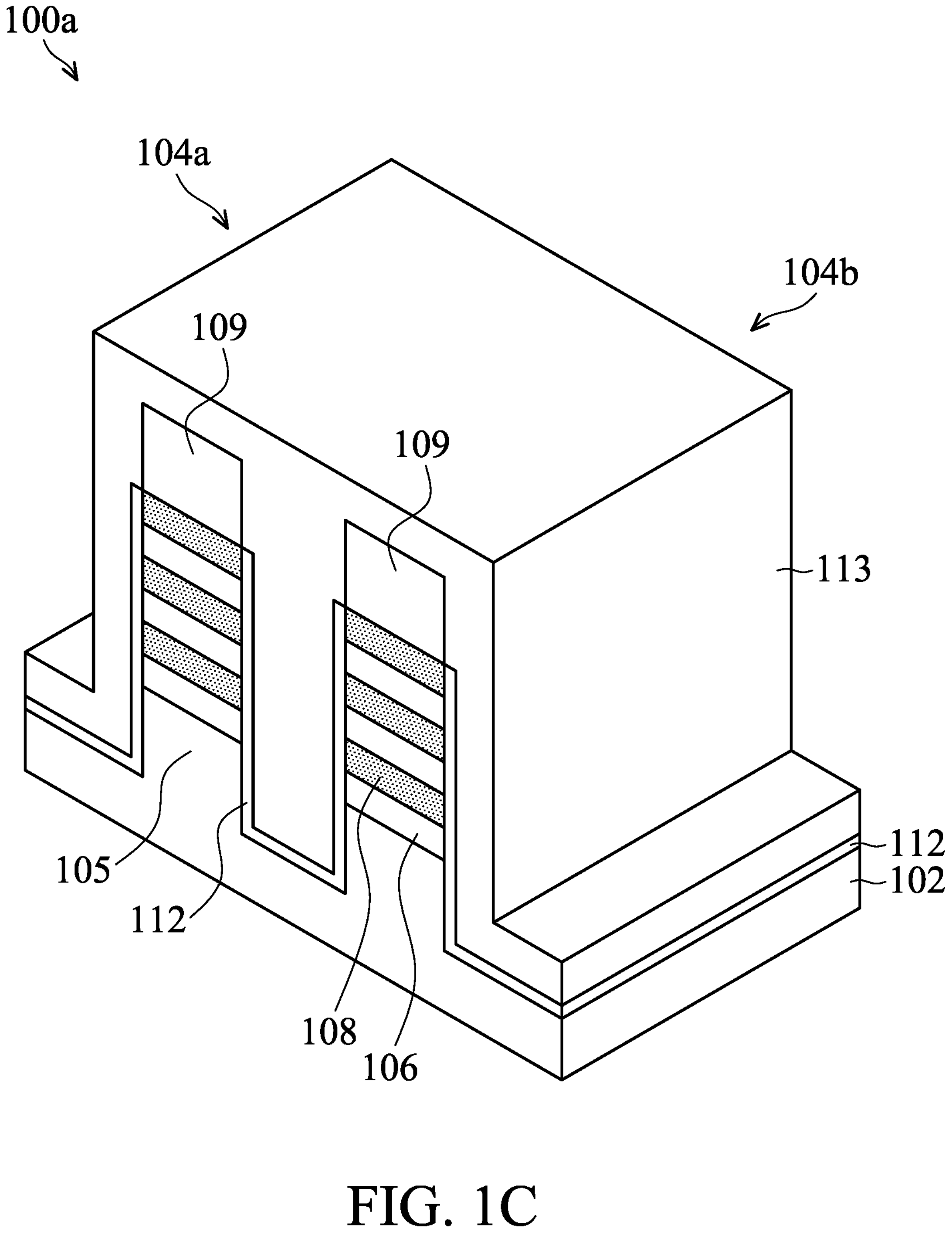

Afterwards, as shown in FIG. 1C, a dielectric layer 113 is formed over the mask structure 109, the first stack structure 104*a*, the second stack structure 104*b*, and the vertical layer 112, in accordance with some embodiments.

In some embodiments, the dielectric layer 113 is made of SiN, SiCN, SiOC, SiOCN or applicable material. In some embodiments, the dielectric layer 113 is made of high-k dielectric material with a K value greater than 6 (>6). The high-k dielectric material may include hafnium oxide ($HfO_2$), zirconium oxide ($ZrO_2$), aluminum oxide ($Al_2O_3$), hafnium alumina oxide (HfAlOx), hafnium silicon oxide (HfSiOx), hafnium silicon oxynitride, hafnium tantalum oxide (HfTaOx), hafnium titanium oxide (HfTiOx), hafnium zirconium oxide (HfZrOx), or the like. In some embodiments, the dielectric layer 113 is formed by chemical vapor deposition (CVD), atomic vapor deposition (ALD), physical vapor deposition (PVD), another suitable method, or a combination thereof.

Figure 1D:
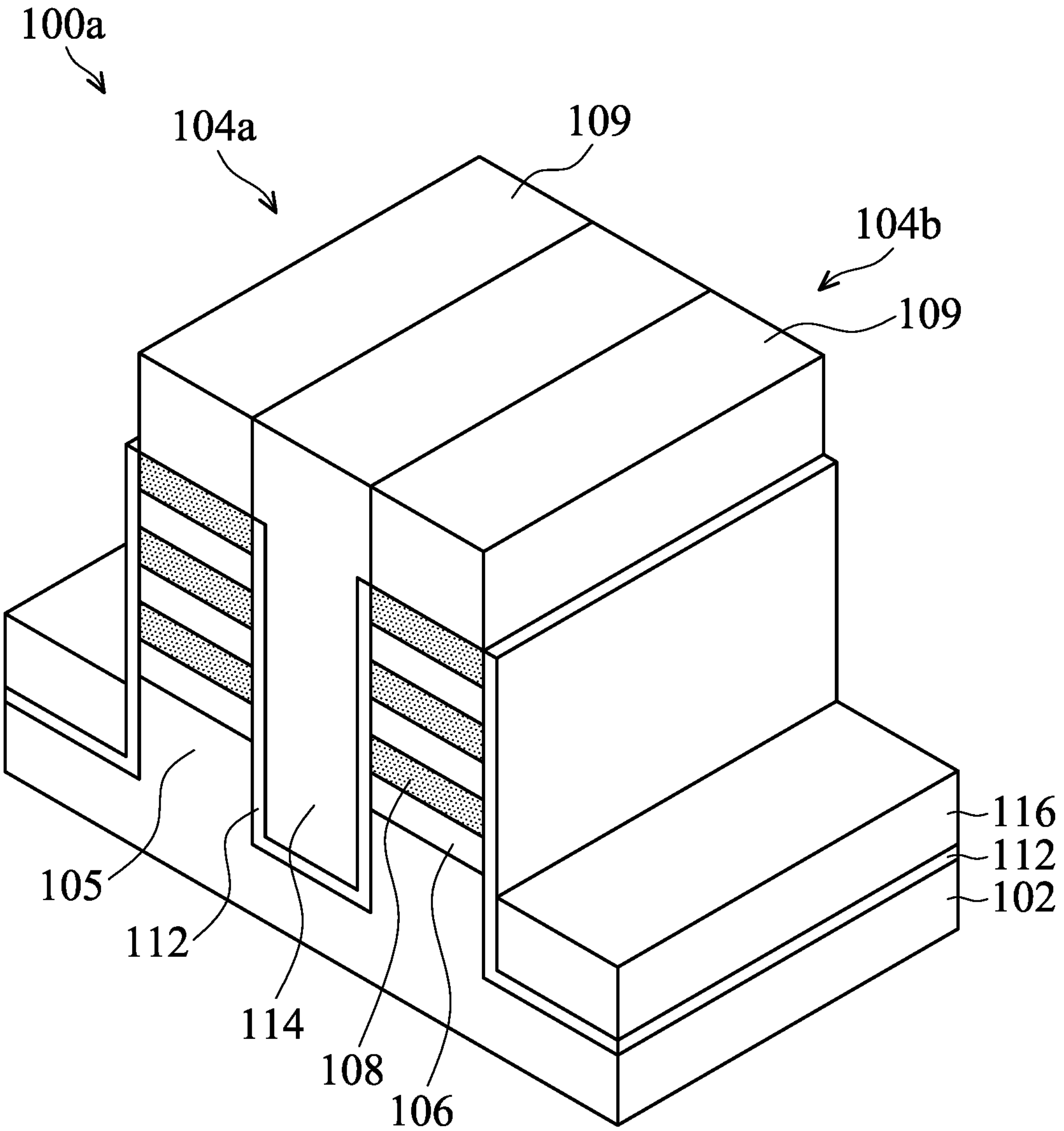

Next, as shown in FIG. 1D, a portion of the dielectric layer 113 is removed to form a dielectric wall 114 between the first stack structure 104*a* and the second stack structure 104*b*, in accordance with some embodiments. The mask structure 109 is used to protect the dielectric wall 114 from being removed.

The dielectric wall 114 is connected to and in direct contact with the vertical layer 112. The vertical layer 112 has a U-shaped structure to surround the dielectric wall 114. In some embodiments, the top surface of the dielectric wall 114 is substantially leveled with the top surface of the mask structure 109.

Afterwards, an isolation structure 116 is formed around the first stack structure 104*a* and the second stack structure 104*b*, in accordance with some embodiments. The isolation structure 116 is configured to electrically isolate active regions (e.g. the first stack structure 104*a* or the second stack structure 104*b*) of the semiconductor structure 100*a* and is also referred to as shallow trench isolation (STI) feature in accordance with some embodiments. In some embodiments, a bottom portion of the dielectric wall 114 is lower than the top surface of the isolation structure 116. In some embodiments, the bottom surface of the dielectric wall 114 is substantially leveled with the bottom surface of the isolation structure 116.

The isolation structure 116 may be formed by depositing an insulating layer over the substrate 102 and recessing the insulating layer so that the first stack structure 104*a* and the second stack structure 104*b* are protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1E:
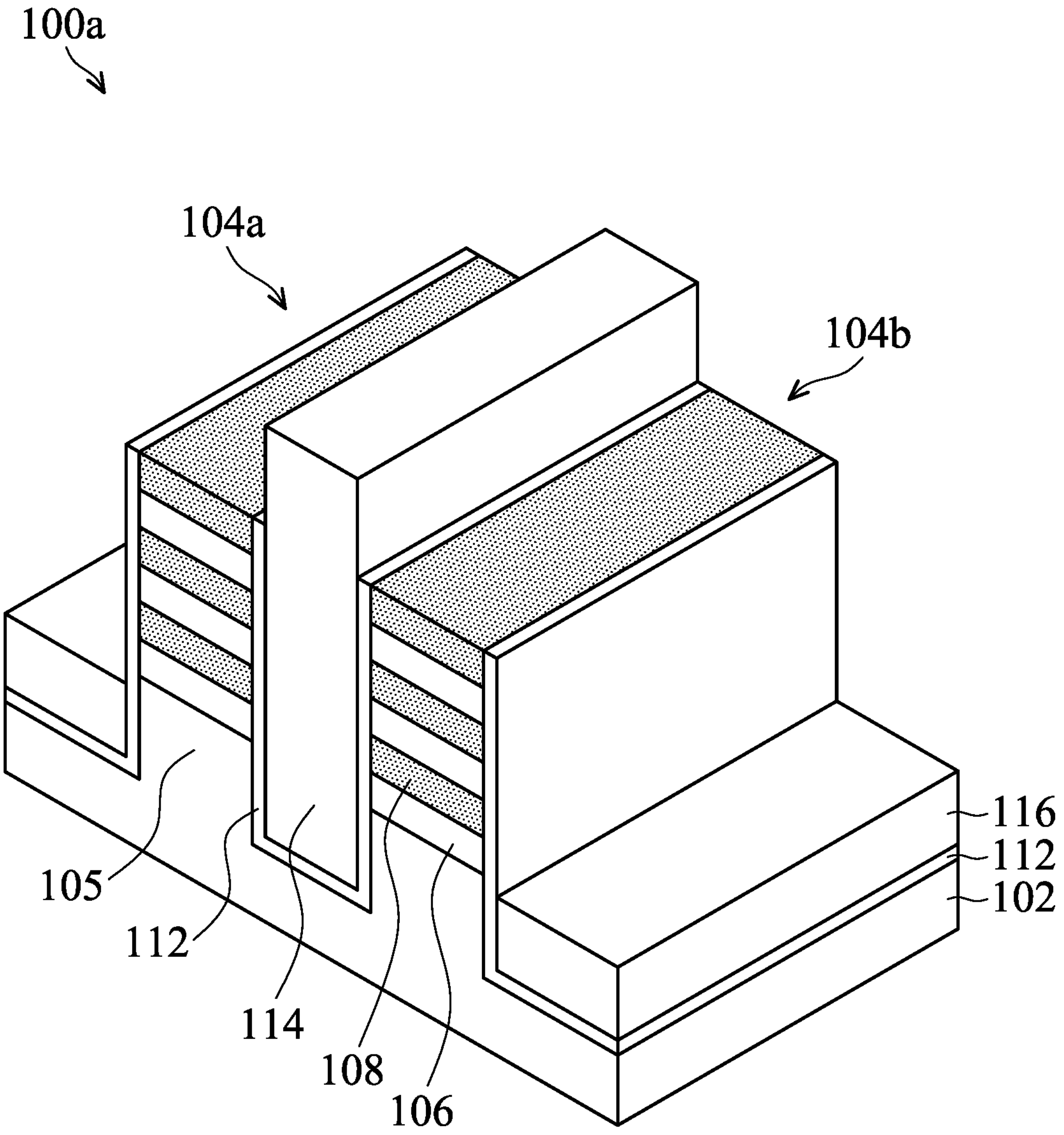

Afterwards, as shown in FIG. 1E, the mask structure 109 is removed to form the dielectric wall 114 above the first stack structure 104*a* and the second stack structure 104*b*, in accordance with some embodiments. In some embodiments, the mask structure 109 is removed by an etching process, such as wet etching process or dry etching process. The top surface of the dielectric wall 114 is higher than the topmost surface of the first semiconductor layer 108 of the first stack structure 104*a*. In addition, the top surface of the dielectric wall 114 is higher than the top surface of the vertical layer 112.

Figure 1F:
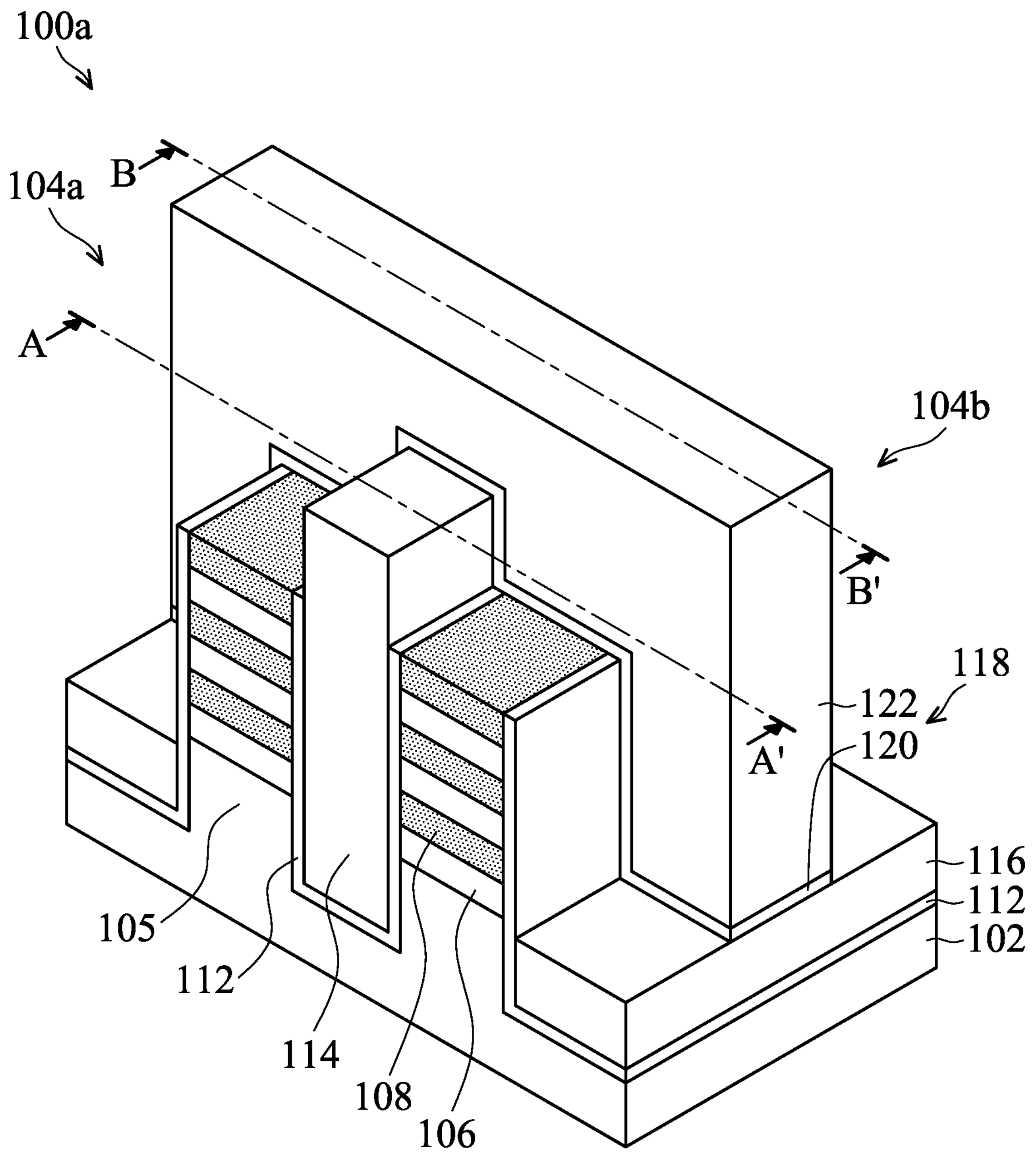

Next, as shown in FIG. 1F, a dummy gate structure 118 is formed across the first stack structure 104*a* and the second stack structure 104*b* and extends over the isolation structure 116, in accordance with some embodiments. The dummy gate structures 118 may be used to define the source/drain (S/D) regions and the channel regions of the resulting semiconductor structure 100*a*. In some embodiments, the dummy gate structures 118 include a dummy gate dielectric layer 120 and a dummy gate electrode layer 122.

In some embodiments, the dummy gate dielectric layer 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 120 is formed using thermal oxidation, chemical vapor deposition (CVD), atomic vapor deposition (ALD), physical vapor deposition (PVD), another suitable method, or a combination thereof. In some embodiments, the dummy gate electrode layer 122 includes polycrystalline-silicon (poly-Si), poly-crystalline silicon-germanium (poly-SiGe), metallic nitrides, metallic silicides, metals, or a combination thereof. In some embodiments, the dummy gate electrode layer 122 is formed using chemical vapor deposition (CVD), physical vapor deposition (PVD), or a combination thereof.

Figures 1, 2A:
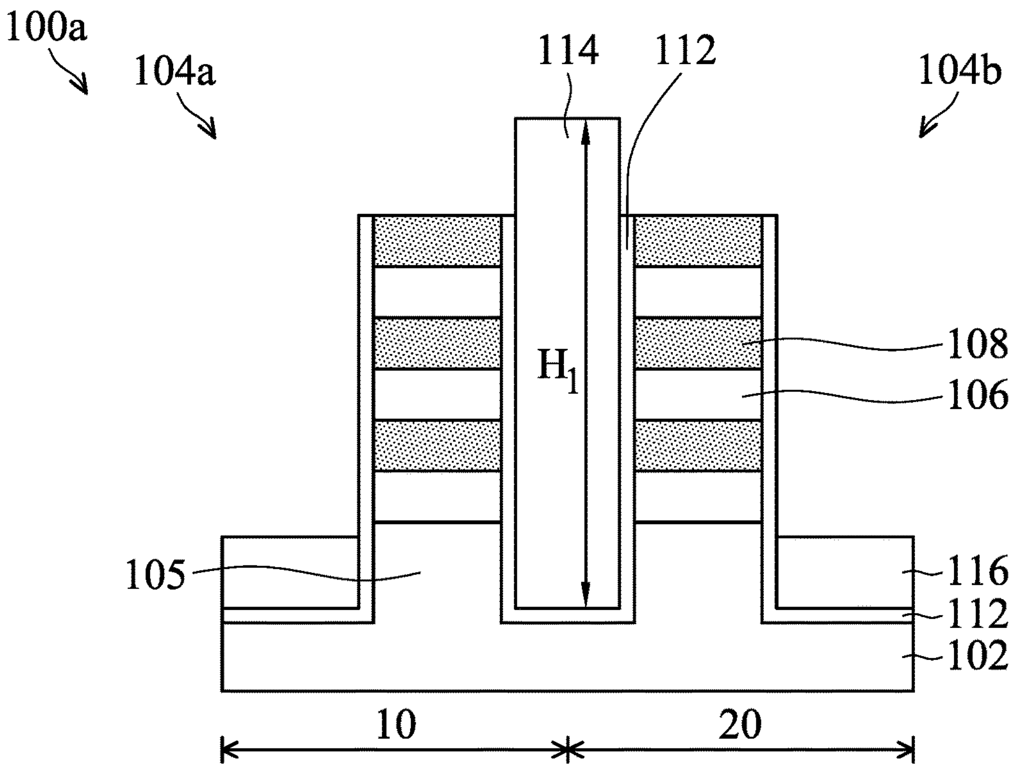
FIGS. 2A-1 to 2N-1 show cross-sectional representations of various stages of manufacturing the semiconductor structure shown along line A-A' in FIG. 1F, in accordance with some embodiments.
Figures 2, 2A:
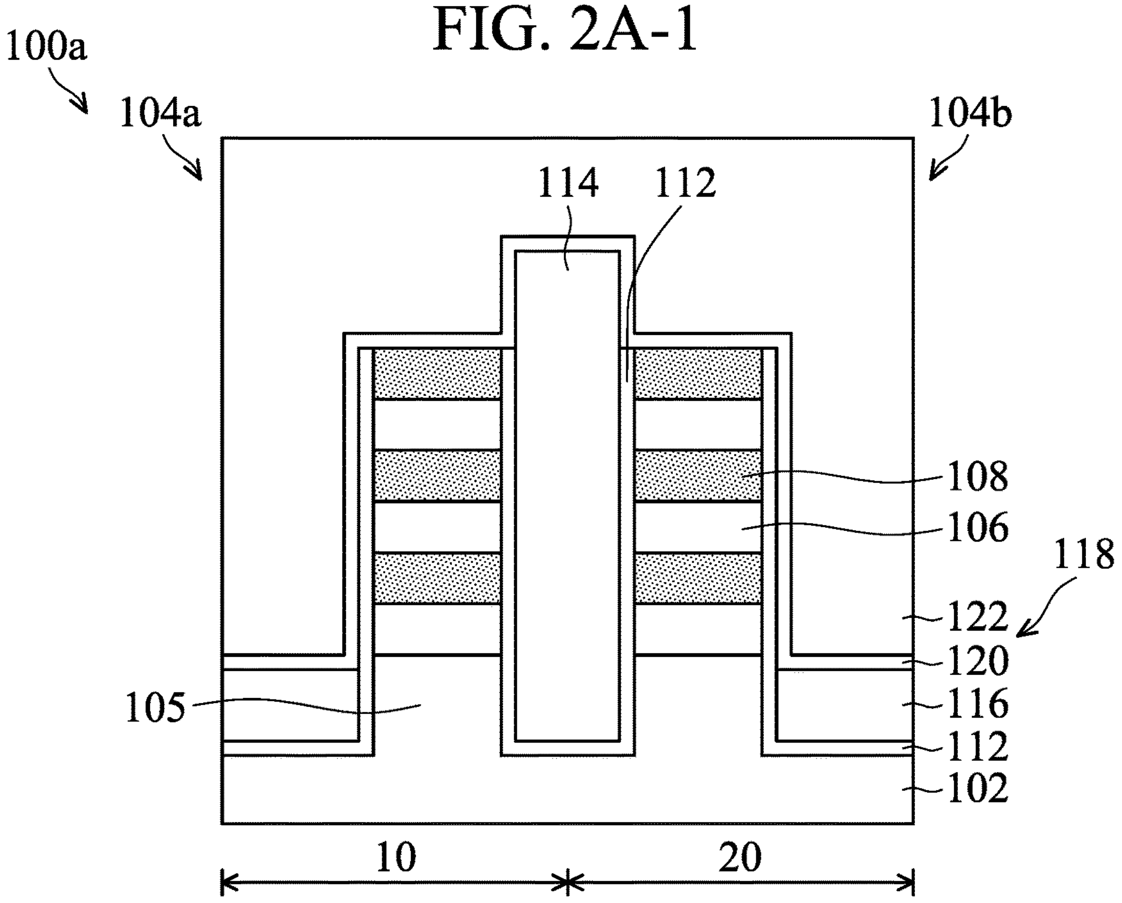
Figures 1, 2B:
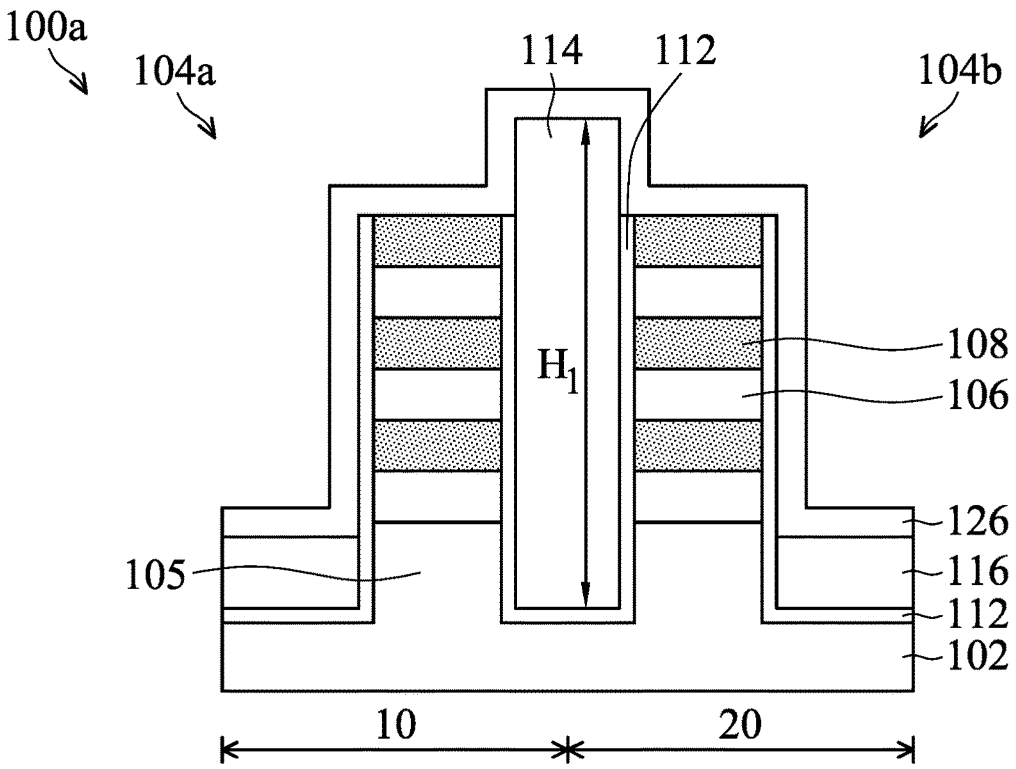
Figures 2, 2B:
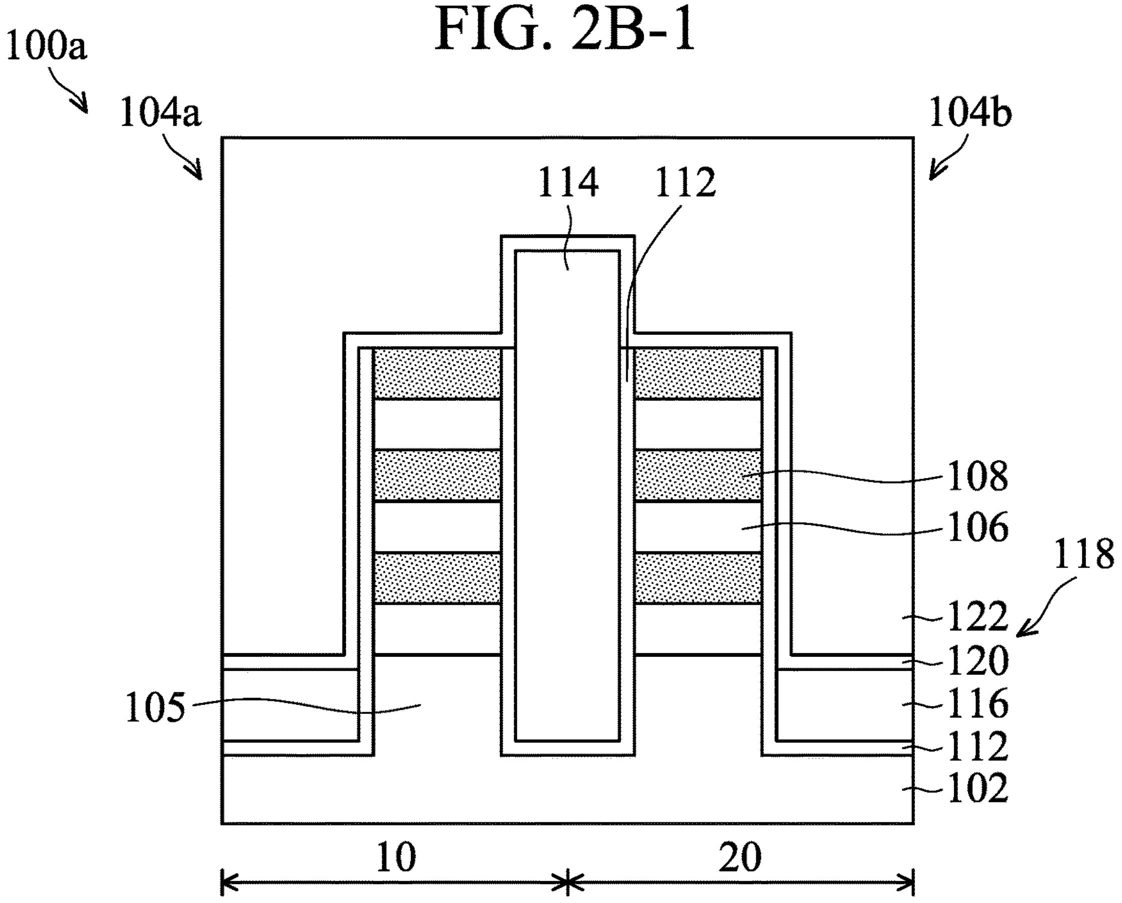
Figures 1, 2C:
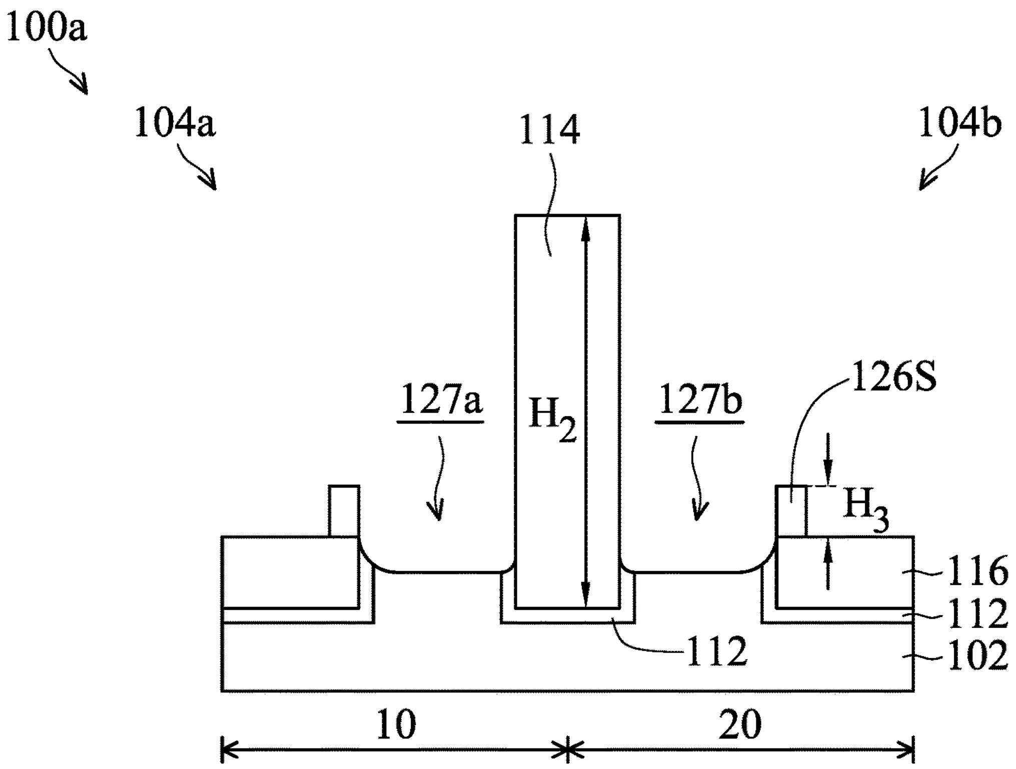
Figures 2, 2C:
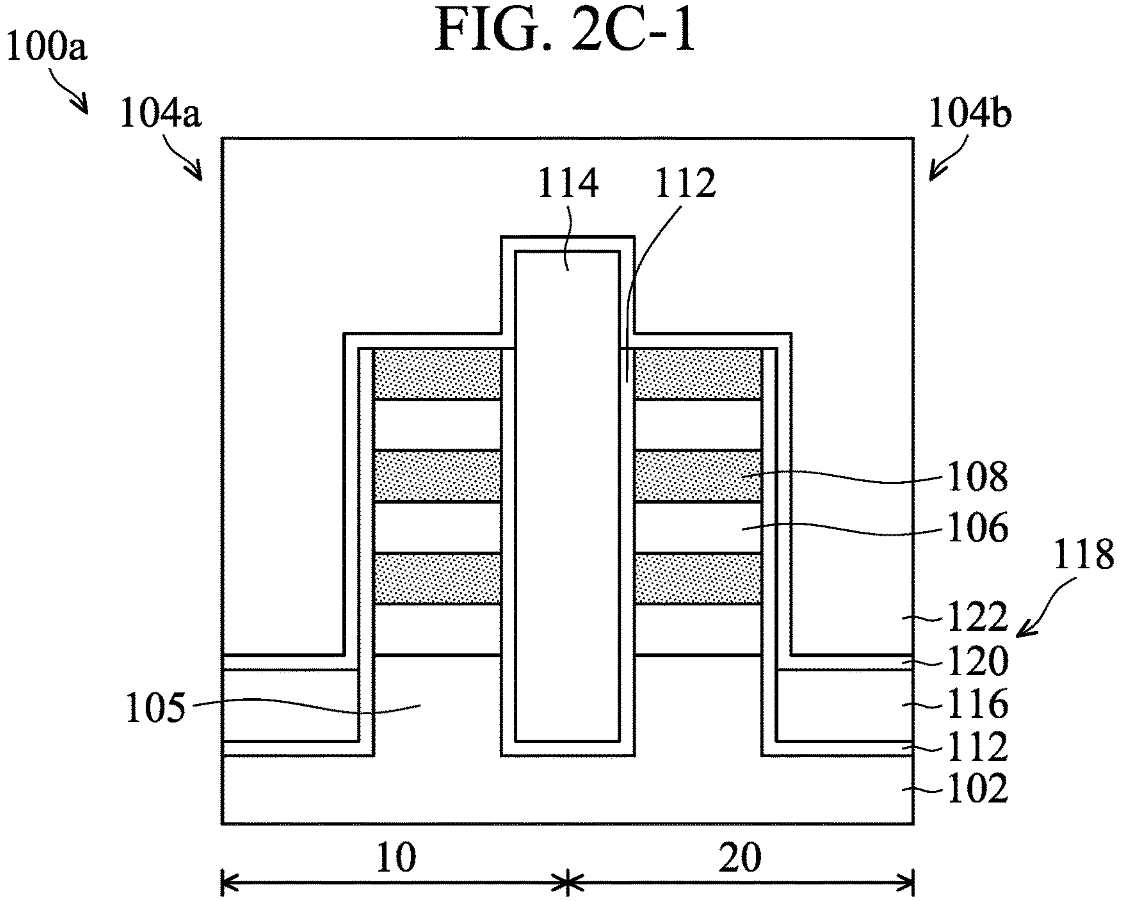
Figures 1, 2D:
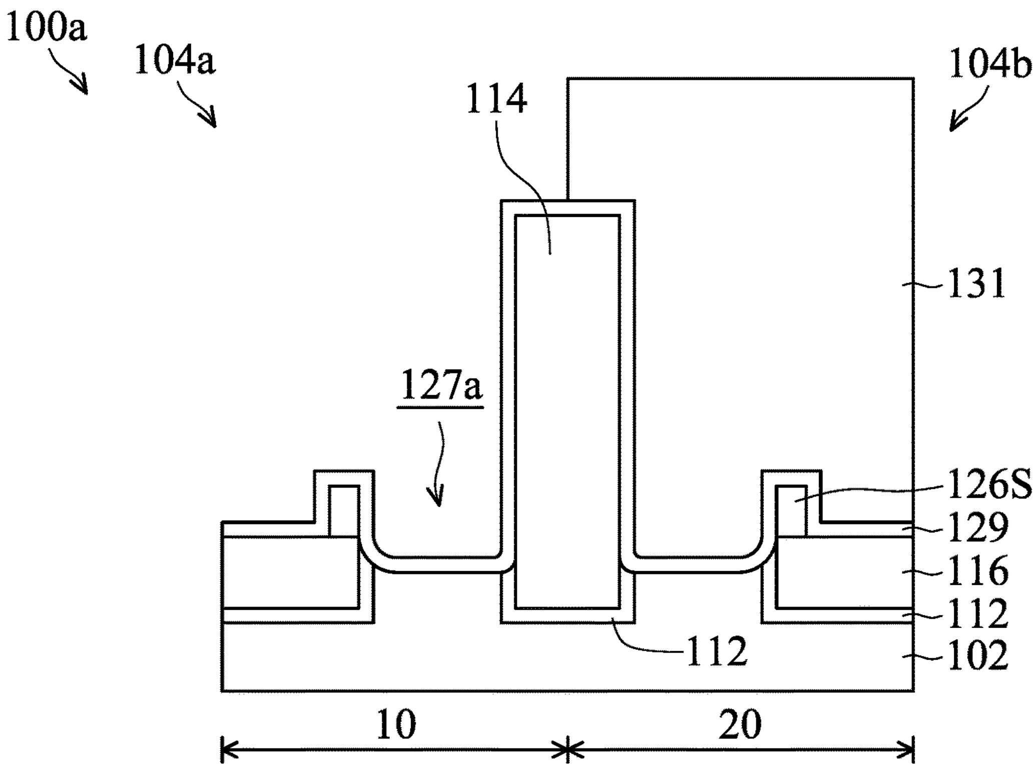
Figures 2, 2D:
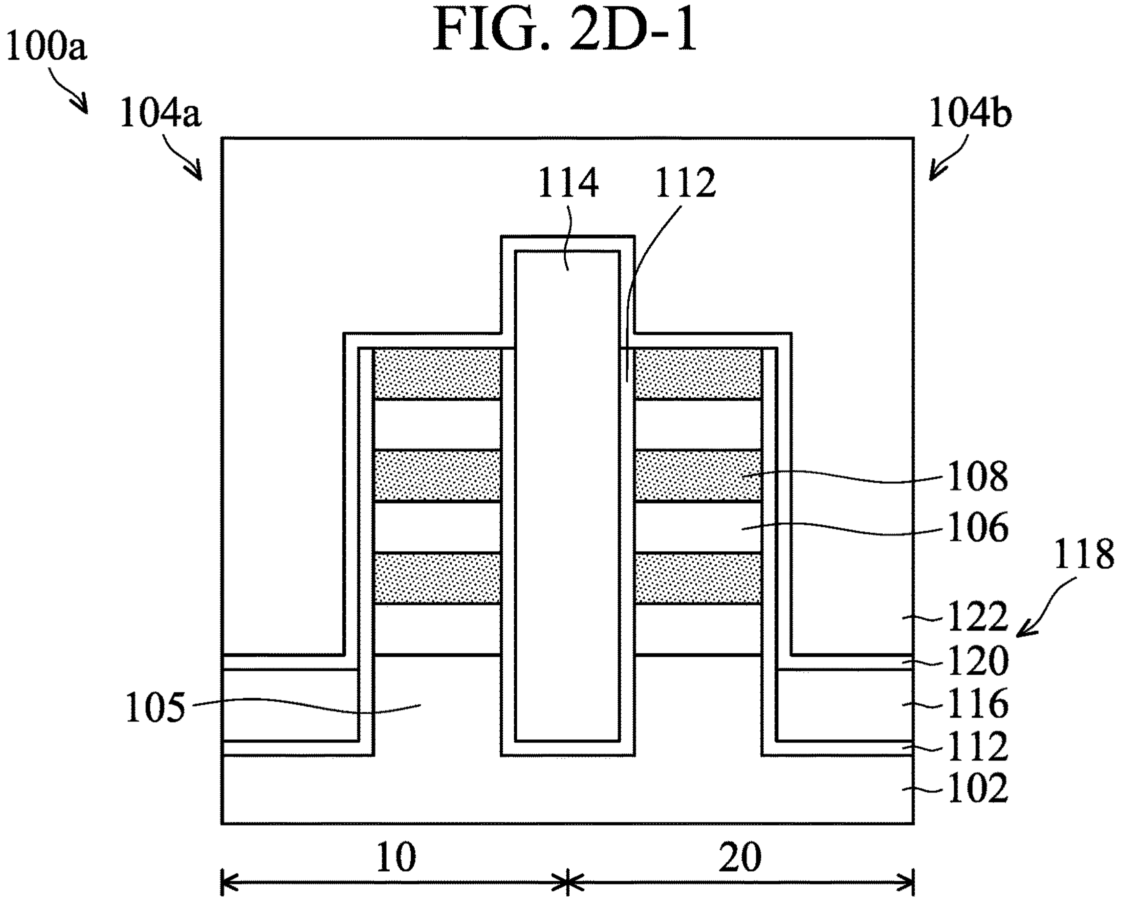
Figures 1, 2E:
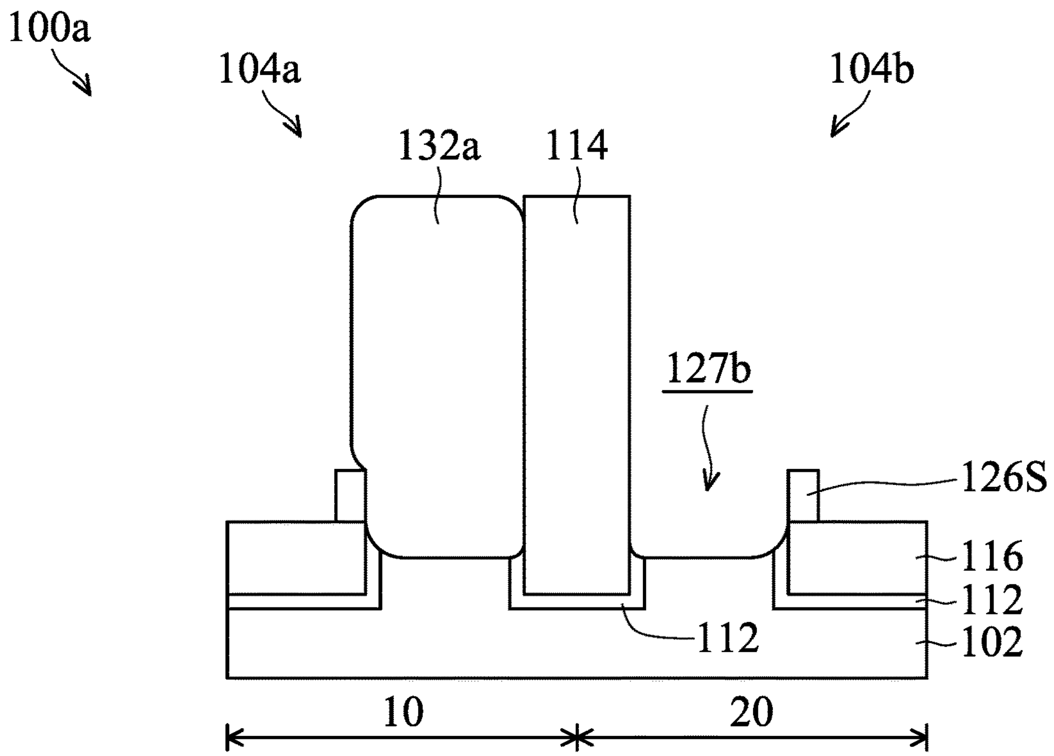
Figures 2, 2E:
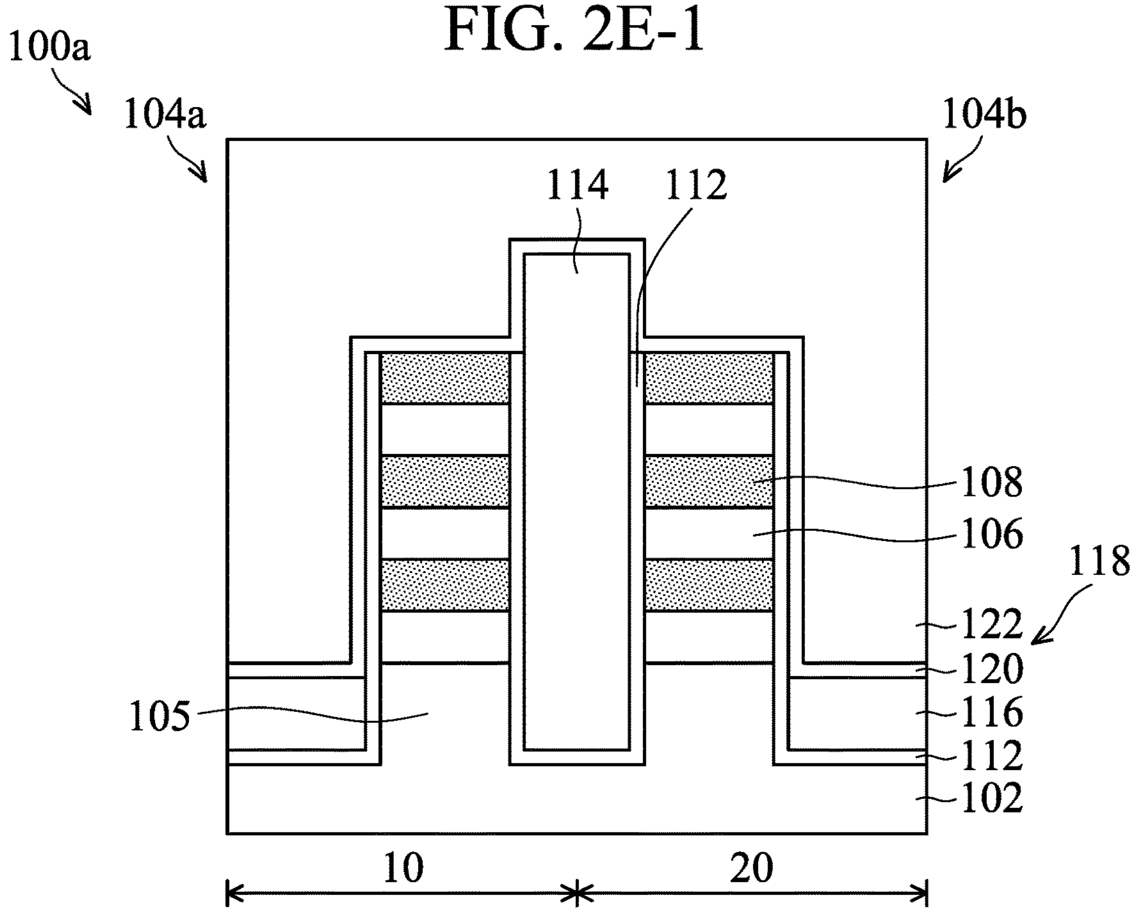
Figures 1, 2F:
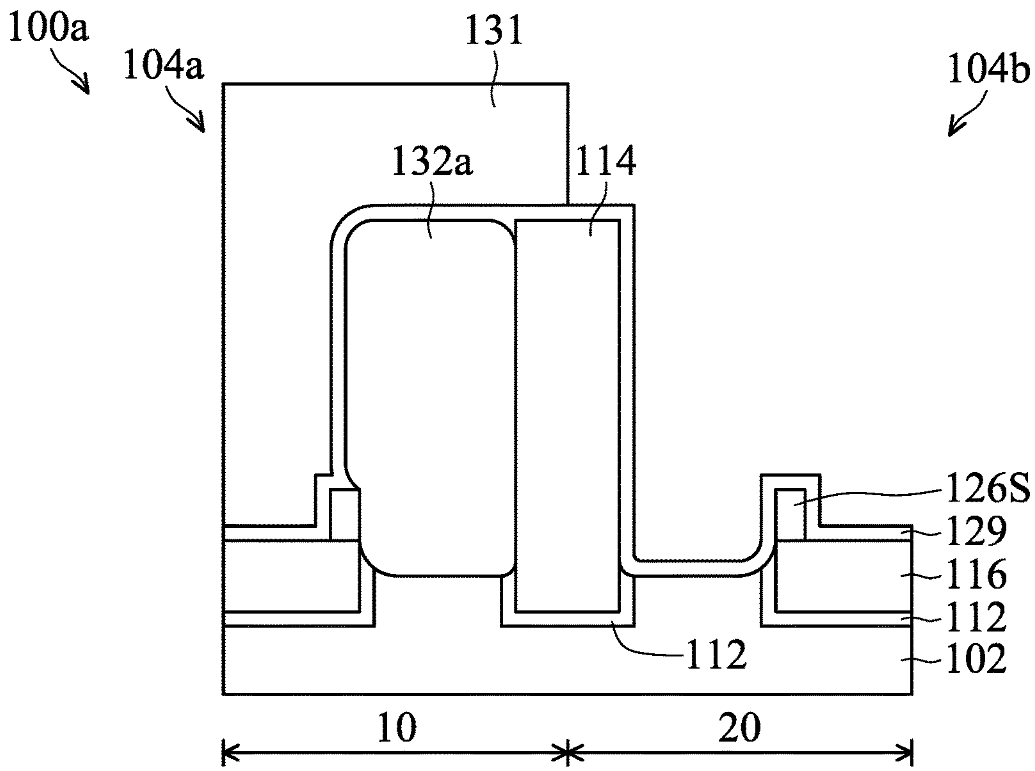
Figures 2, 2F:
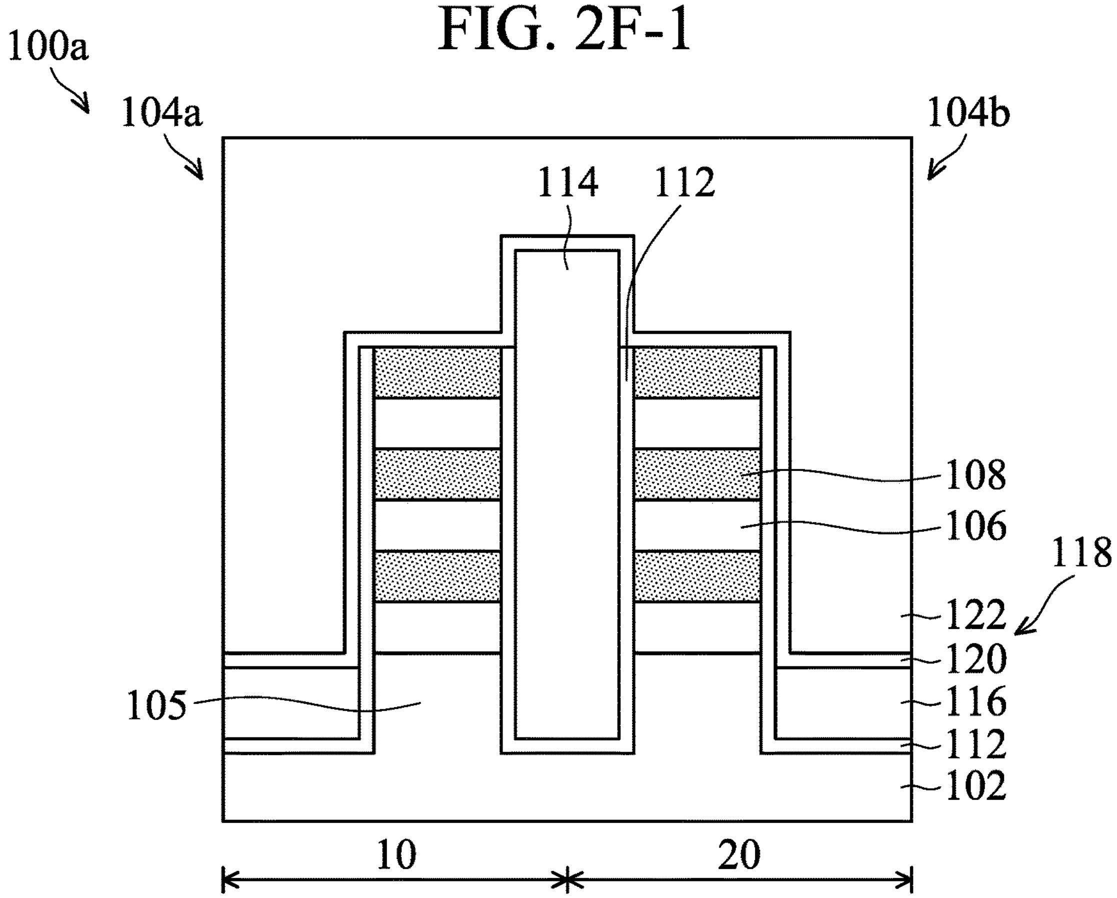
Figures 1, 2G:
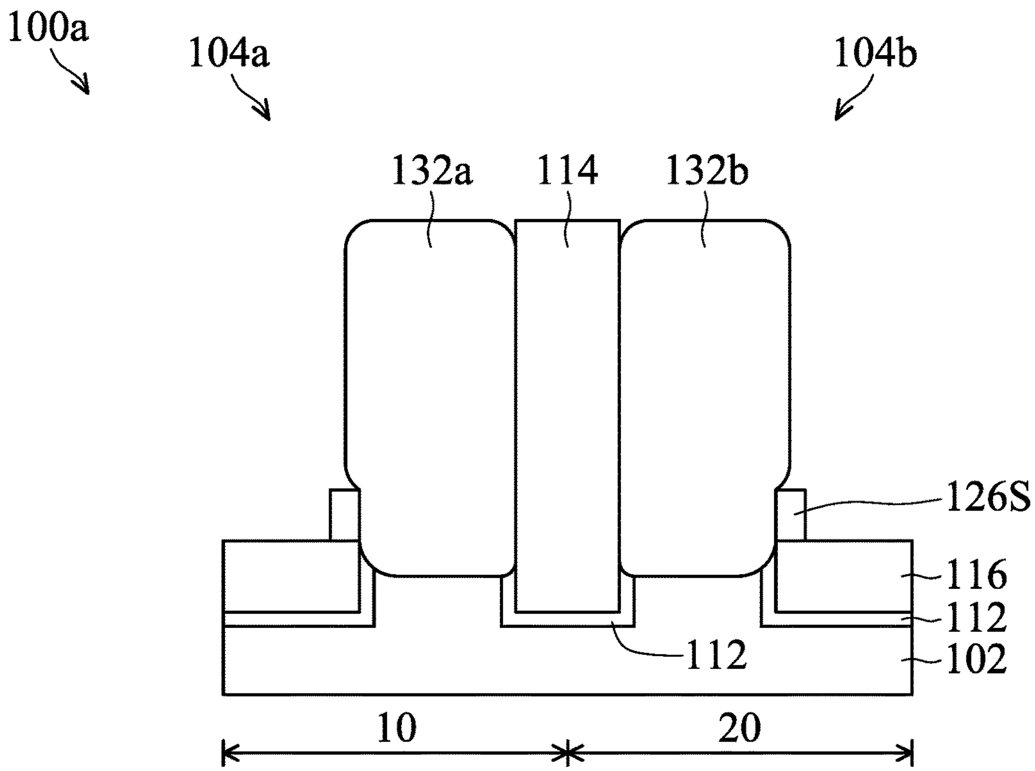
Figures 2, 2G:
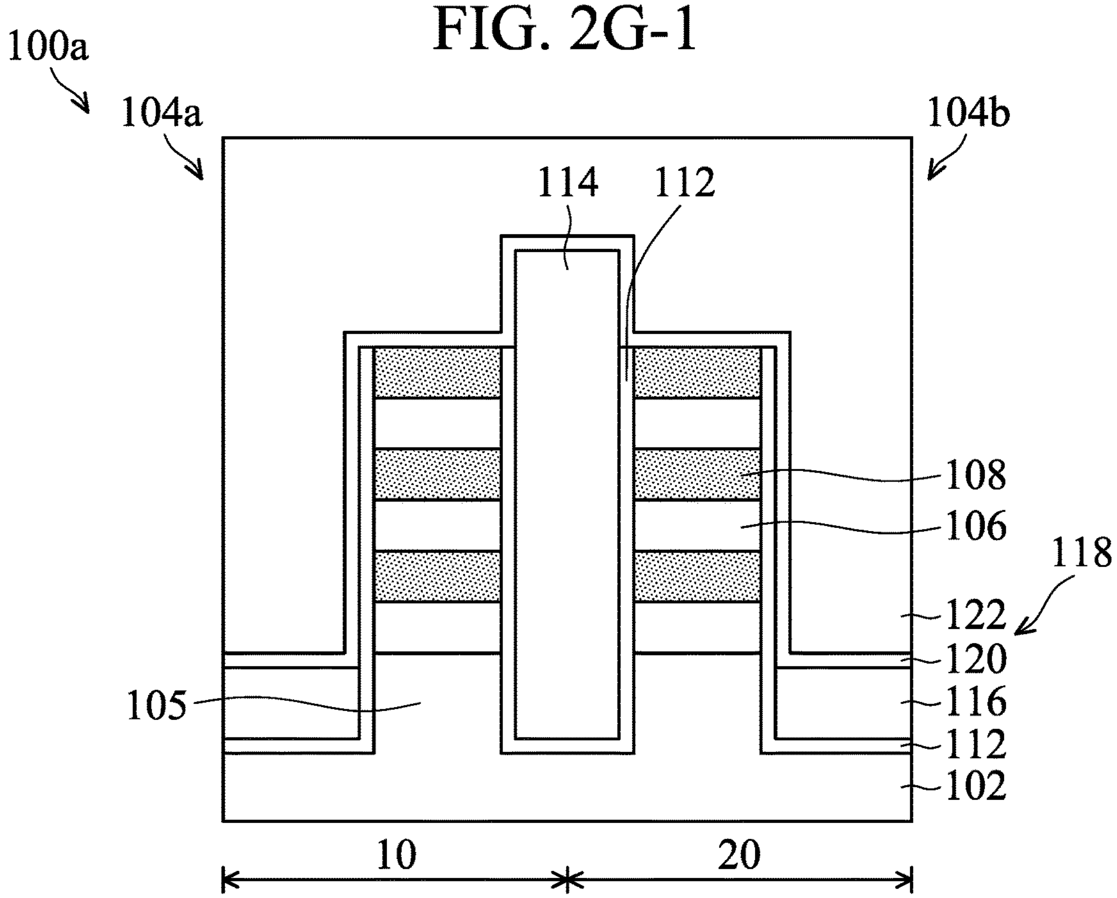
Figures 1, 2H:
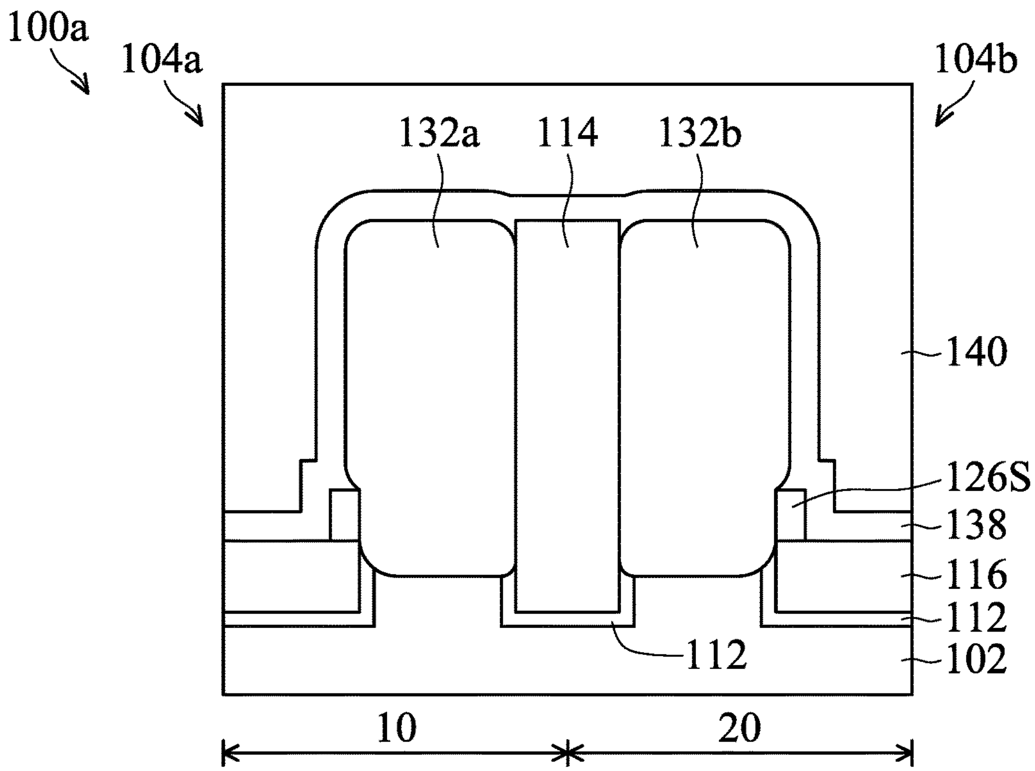
Figures 2, 2H:
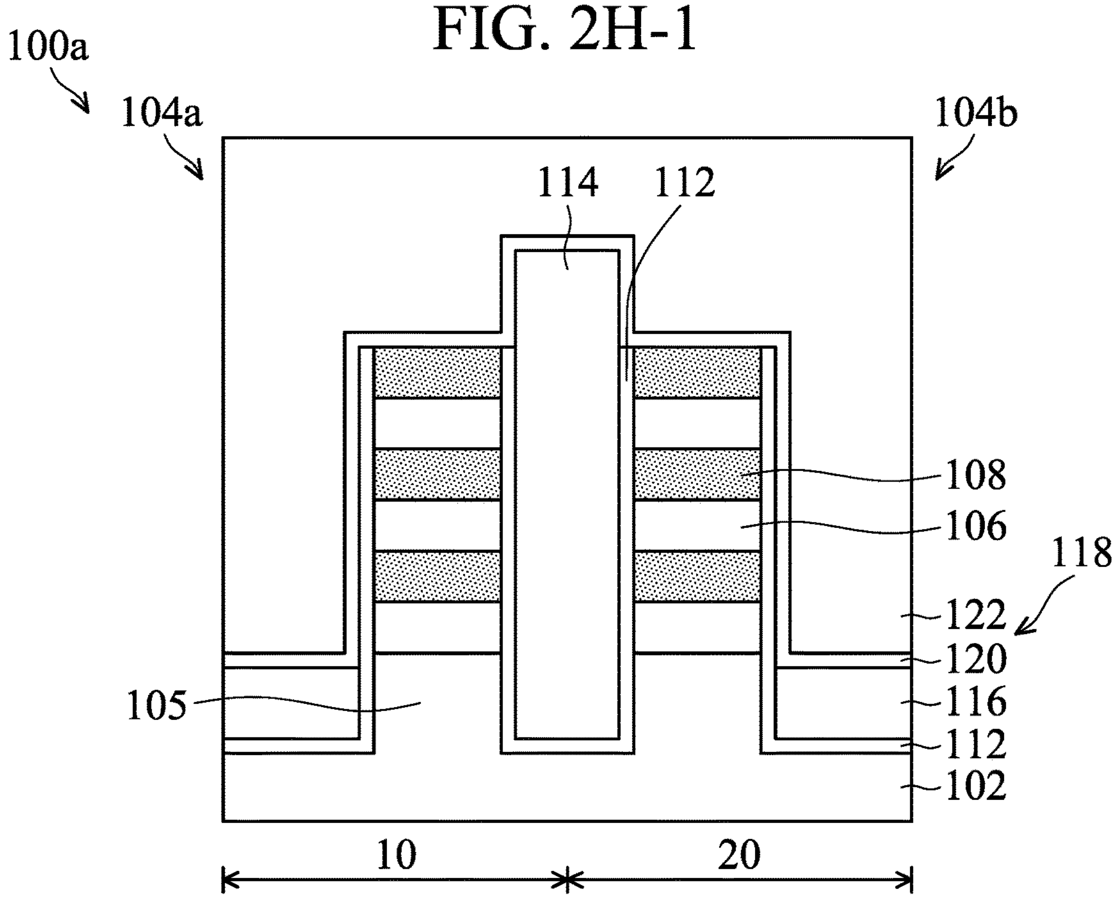
Figures 1, 2I:
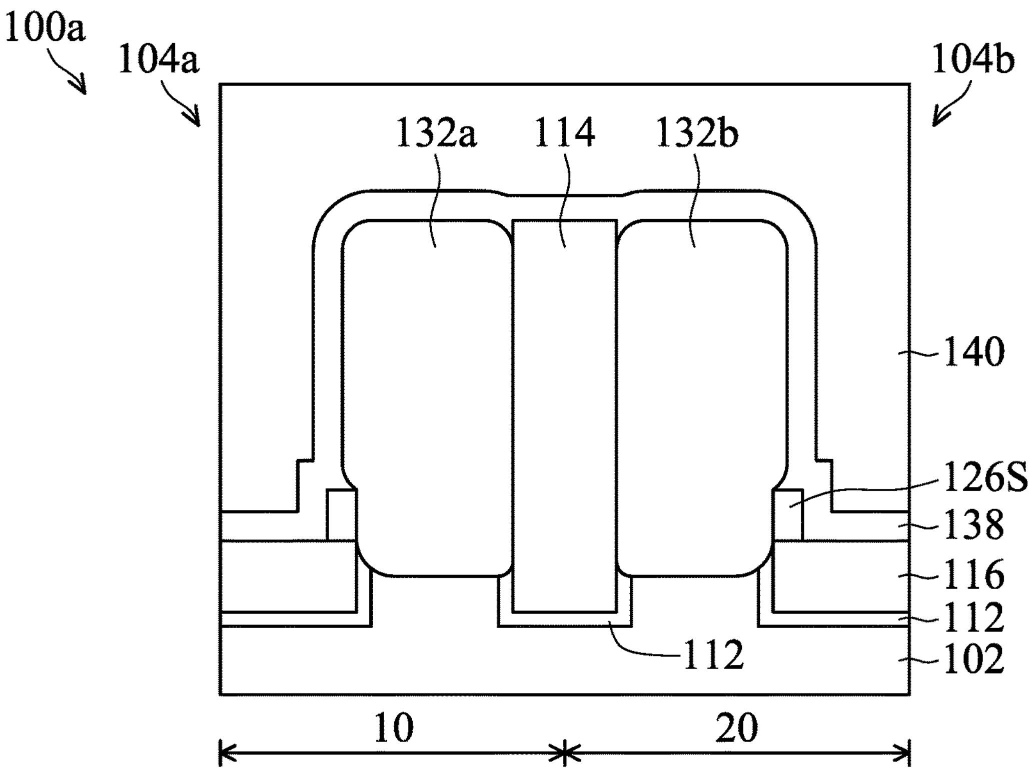
Figures 2, 2I:
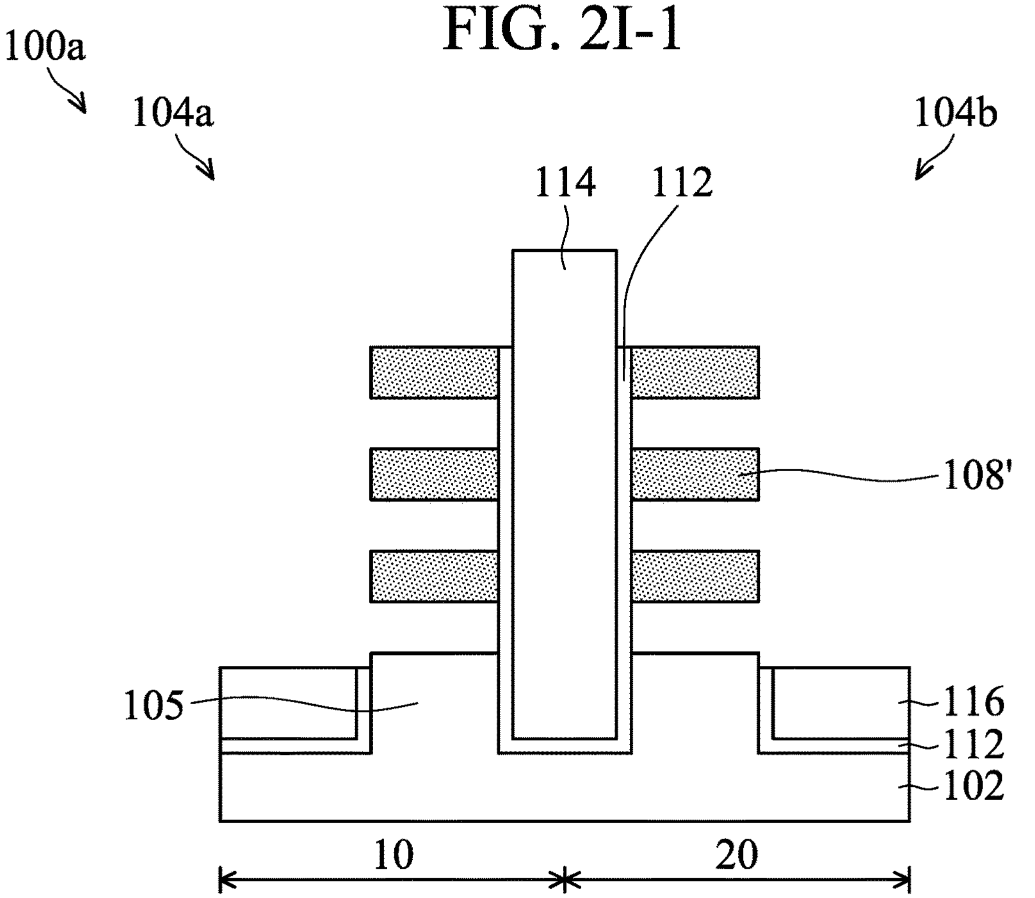
Figures 1, 2J:
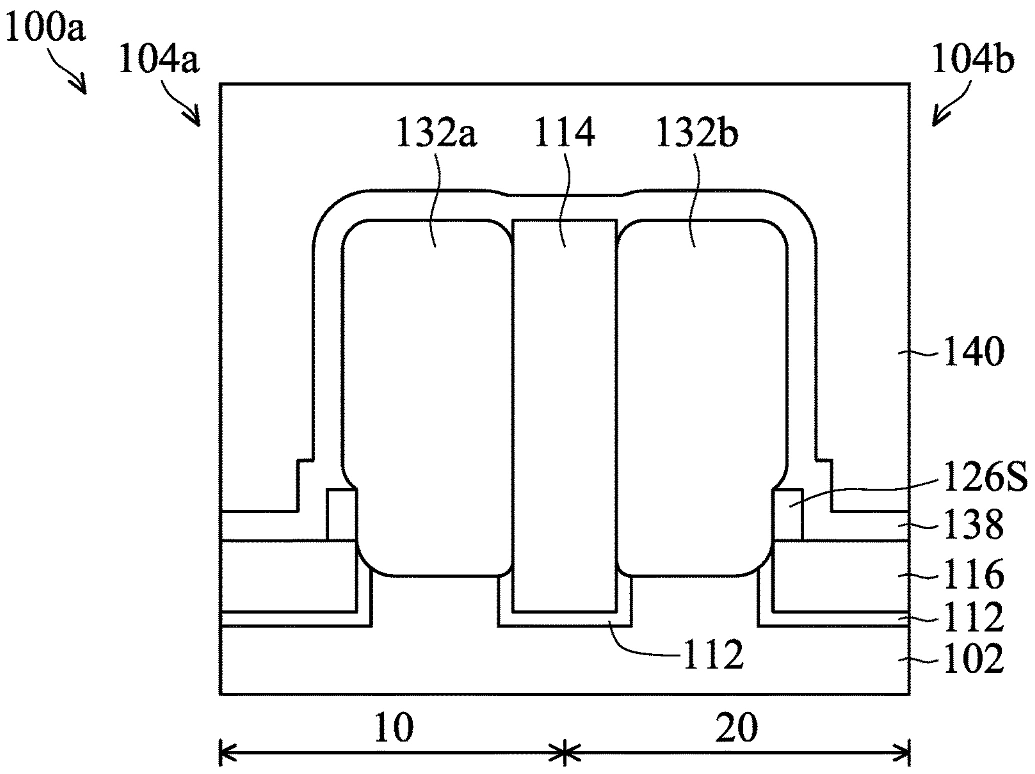
Figures 2, 2J:
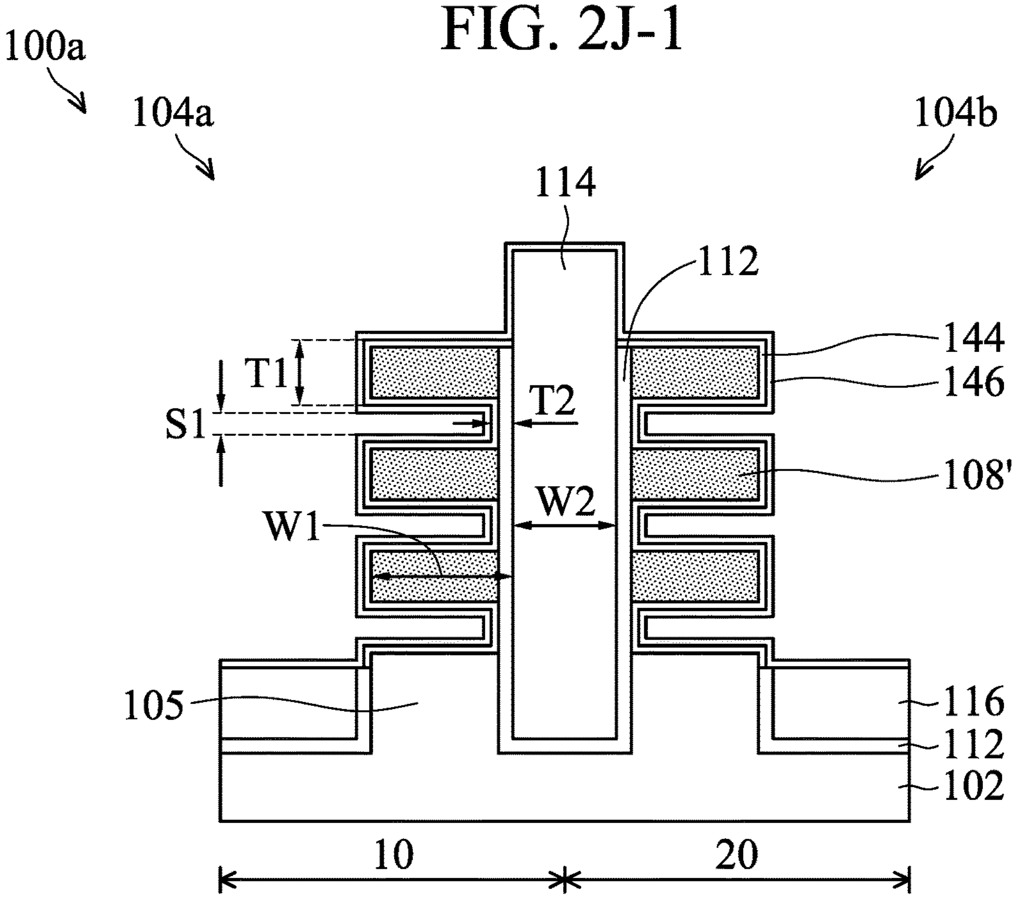
Figures 1, 2K:
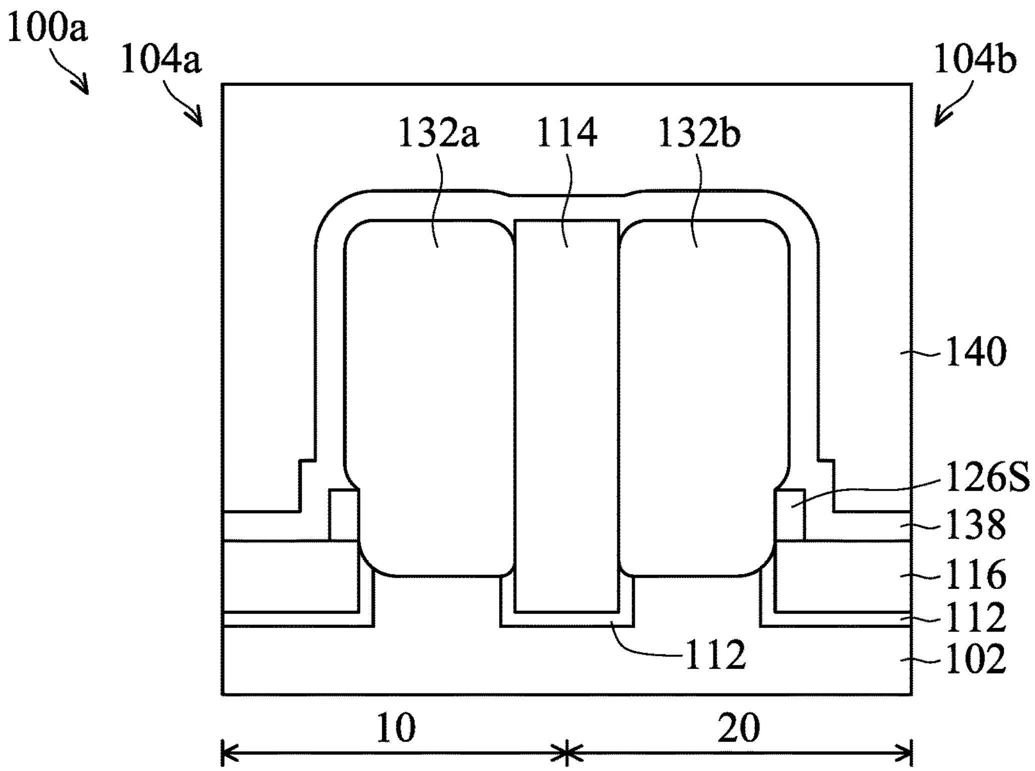
Figures 2, 2K:
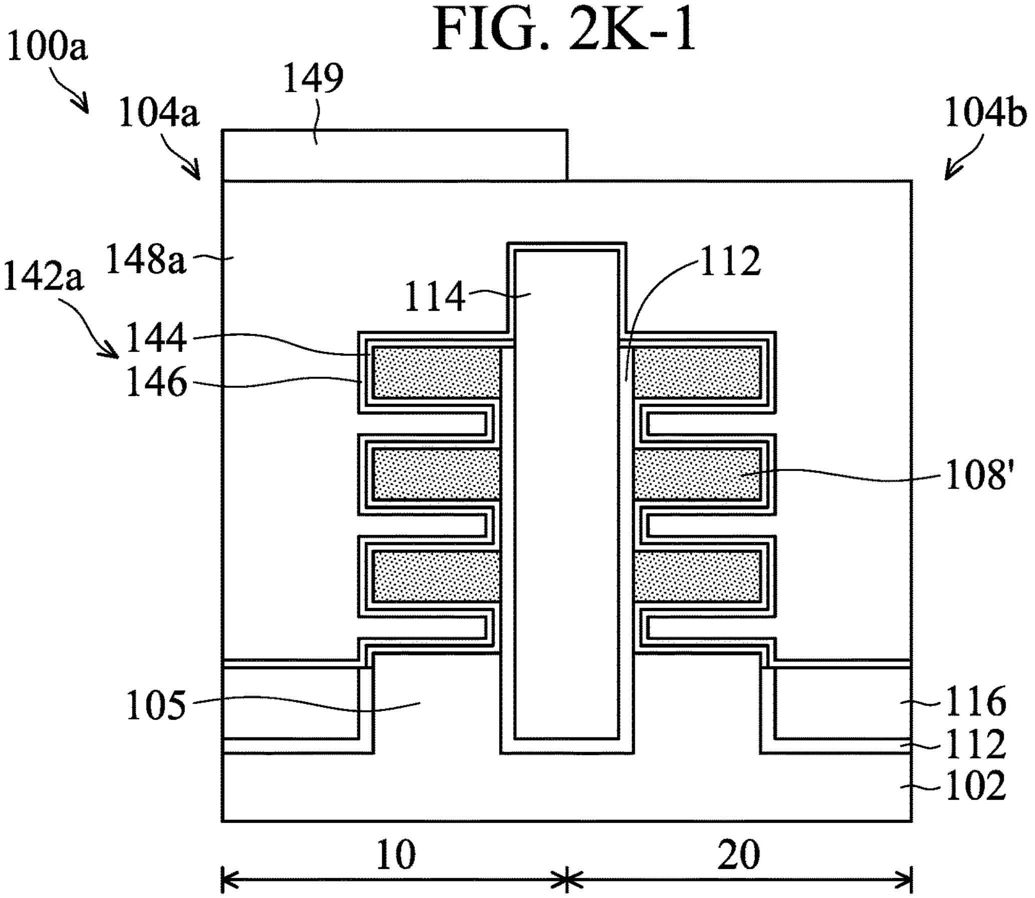
Figures 1, 2L:
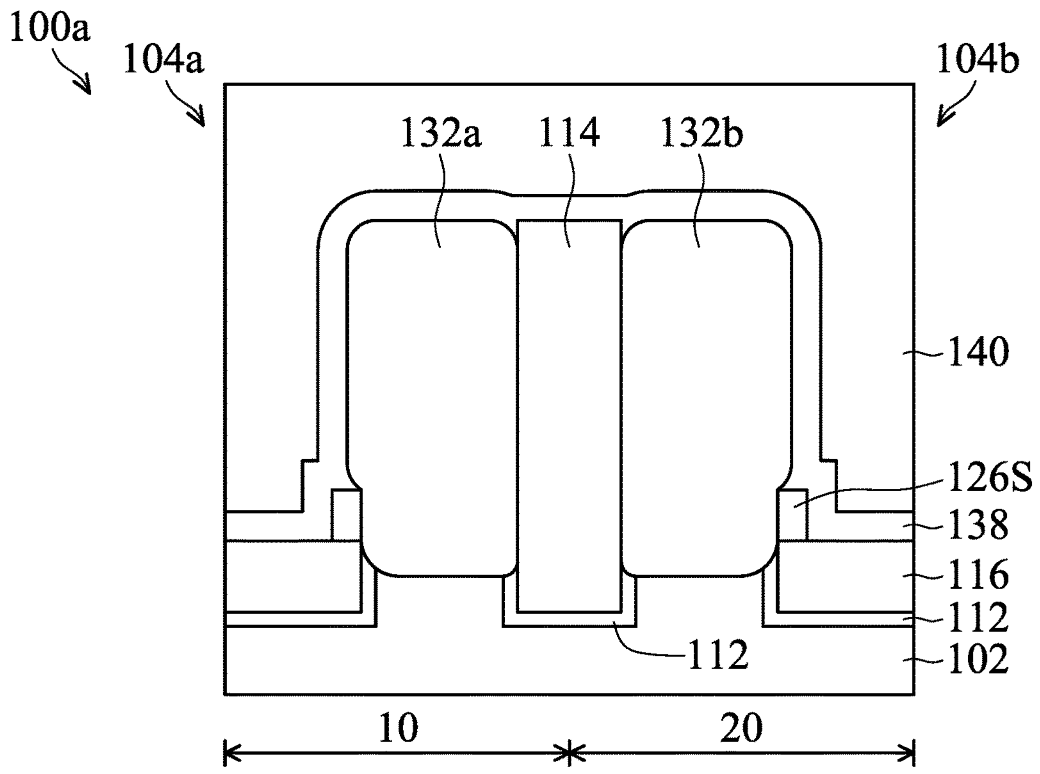
Figures 2, 2L:
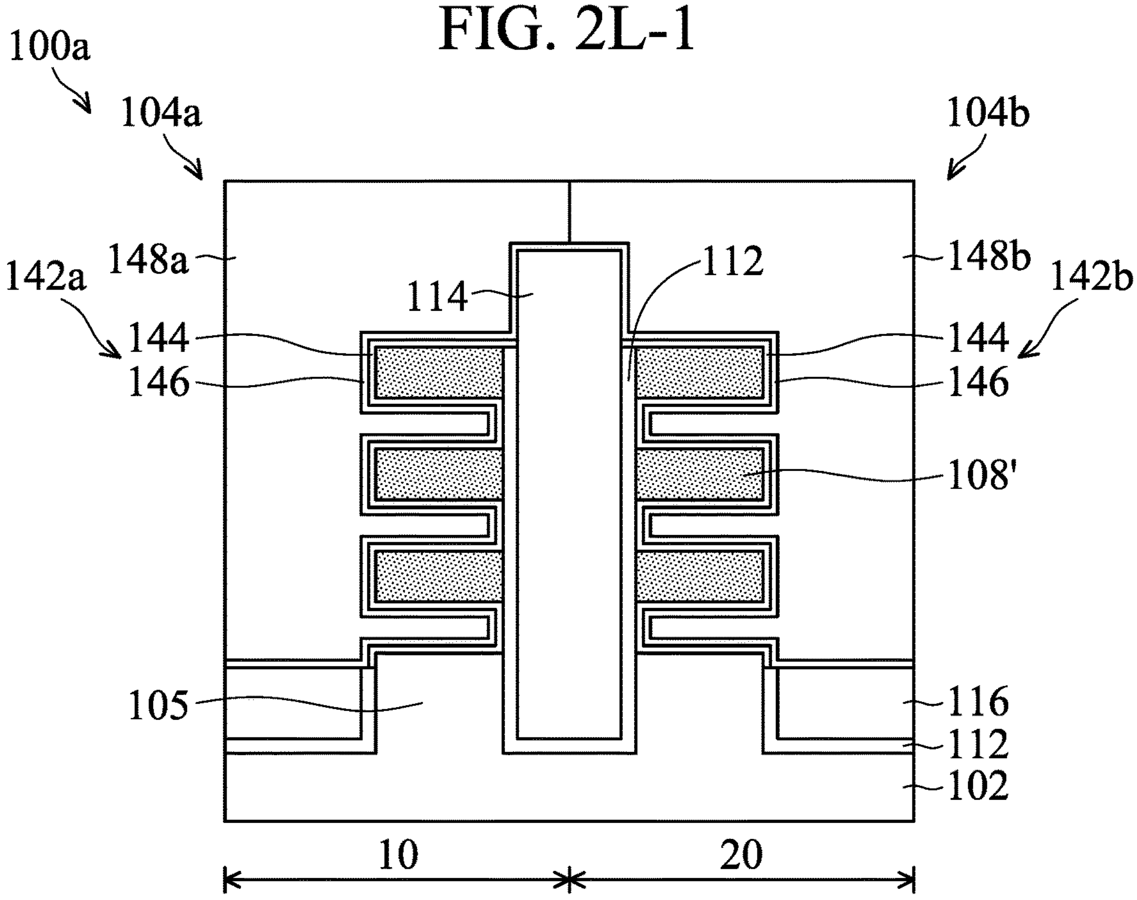
Figures 1, 2M:
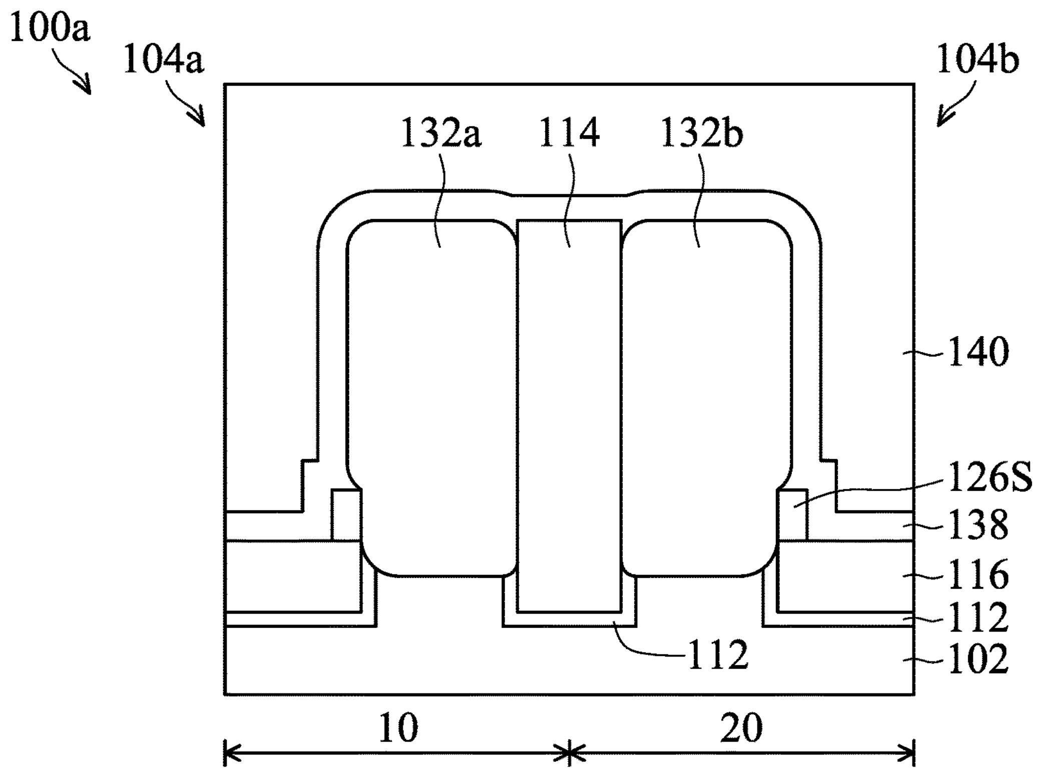
Figures 2, 2M:
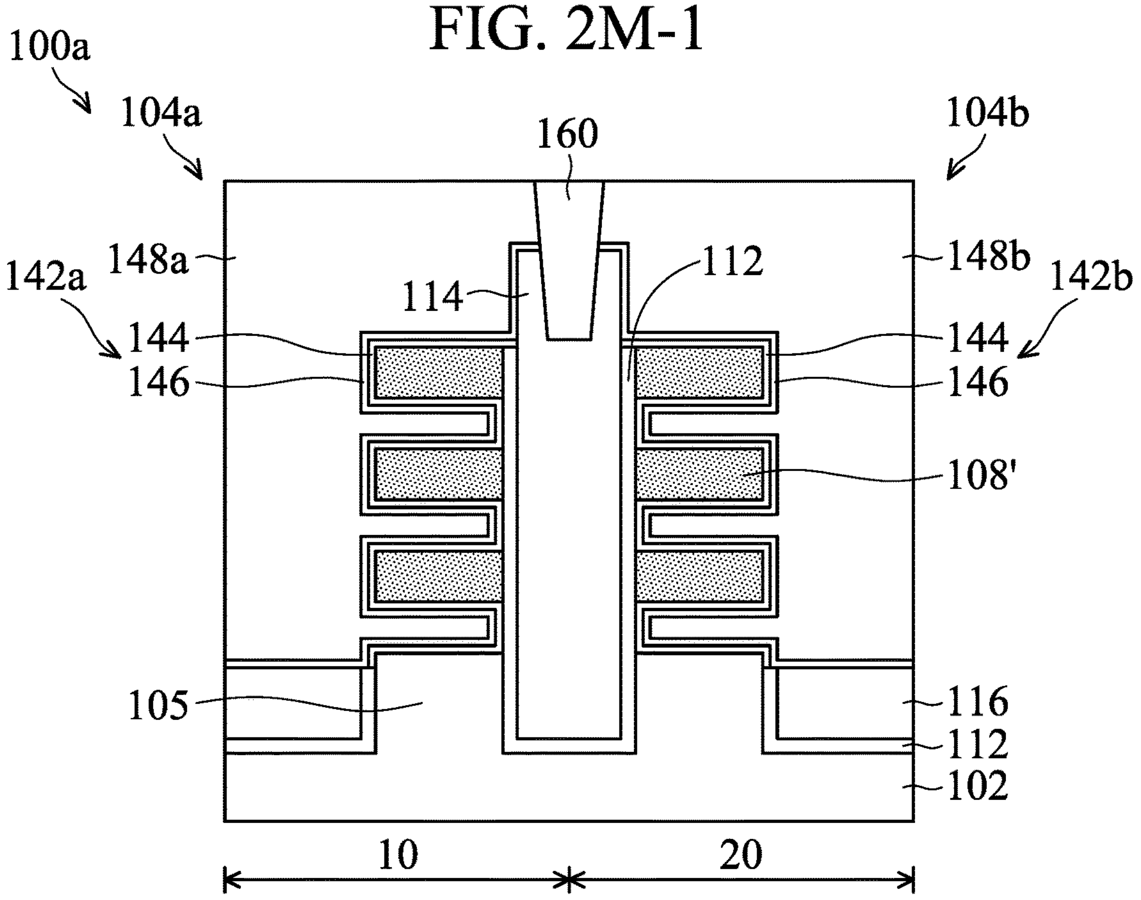
Figures 1, 2N:
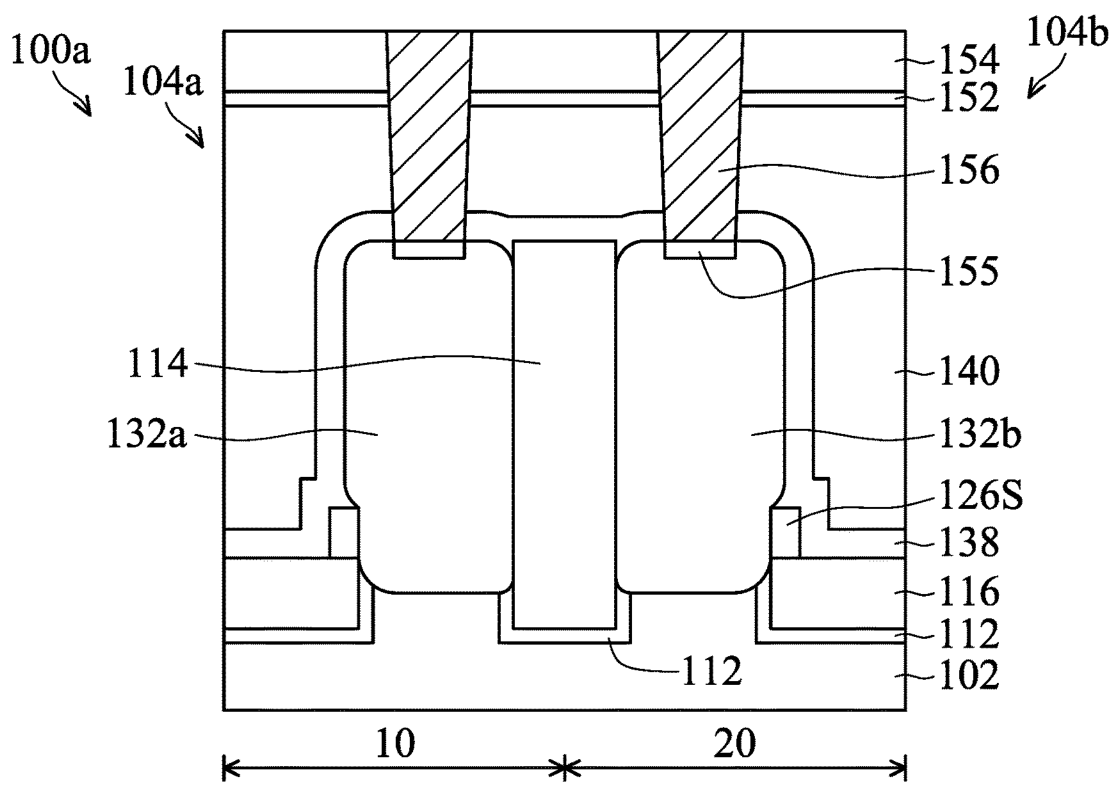
Figures 2, 2N:
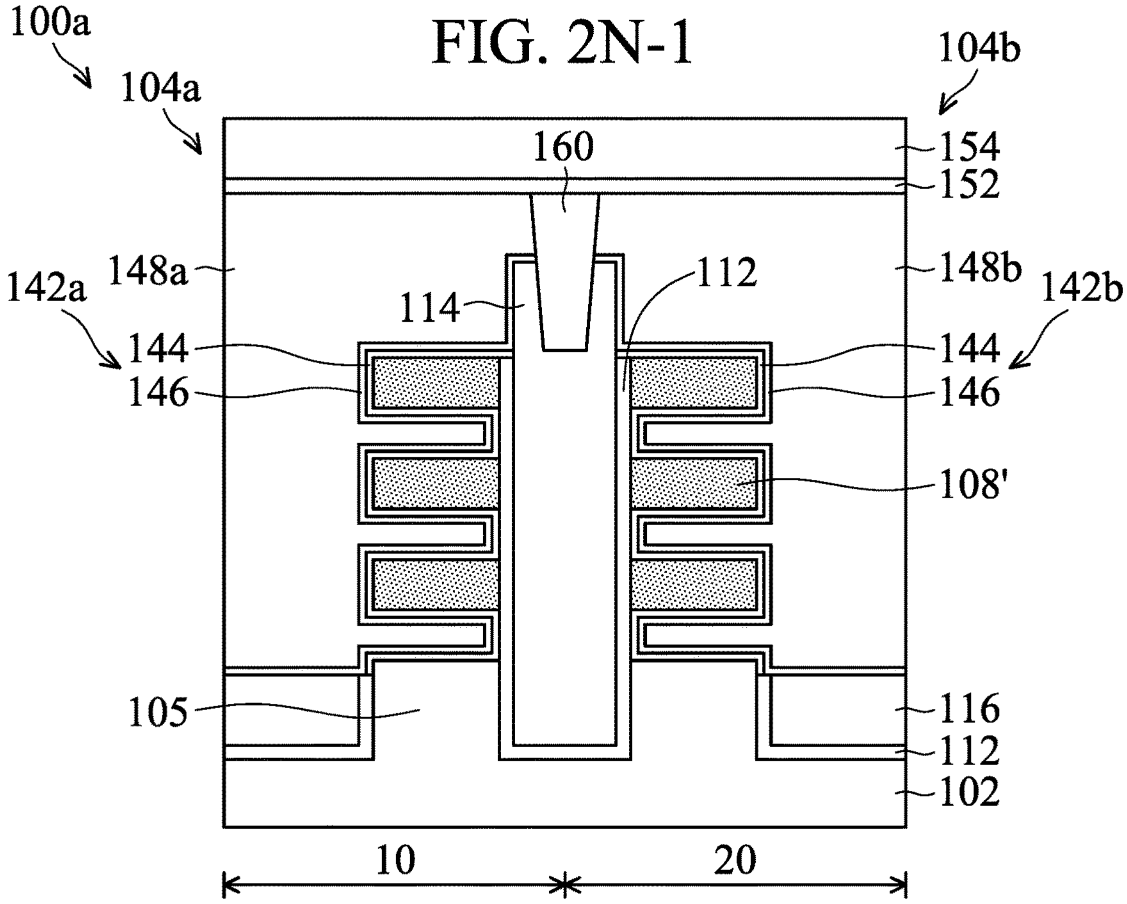

FIGS. 2A-1 to 2N-1 show cross-sectional representations of various stages of manufacturing the semiconductor structure 100*a* shown along line A-A' in FIG. 1F, in accordance with some embodiments. FIGS. 2A-2 to 2N-2 show cross-sectional representations of various stages of manufacturing the semiconductor structure 100*a* shown along line B-B' in FIG. 1F, in accordance with some embodiments. More specifically, FIG. 2A-1 shows the cross-sectional representation shown along line A-A' in FIG. 1F, in accordance with some embodiments. FIG. 2A-2 shows the cross-sectional representation shown along line B-B' in FIG. 1F, in accordance with some embodiments. FIG. 2A-1 shows an S/D region and FIG. 2A-2 shows a gate structure region.

As shown in FIGS. 2A-1 and 2A-2, the substrate 102 includes a first region 10 and a second region 20. The first stack structure 104*a* is formed in the first region 10, and the second stack structure 104*b* is formed in the second region 20. The dielectric wall 114 is between the first stack structure 104*a* and the second stack structure 104*b*. The vertical layer 112 is in direct contact with the first semiconductor layers 106 and the second semiconductor layers 108. The vertical layer 112 has a U-shaped structure. The bottommost surface of the vertical layer 112 is lower than the bottommost first semiconductor layer 106 of the first stack structure 104*a*.

The dummy gate structure 118 is formed across the first stack structure 104*a* and the second stack structure 104*b* and over the dielectric wall 114. The dummy gate structure 118 includes the dummy gate dielectric layer 120 and the dummy gate electrode layer 122.

Next, as shown in FIGS. 2B-1 and 2B-2, a spacer layer 126 is formed along and covering opposite sidewalls of the dummy gate structure 118 and are formed along and covering opposite sidewalls of the source/drain (S/D) regions of the first stack structure 104*a* and the second stack structure 104*b* and the dielectric wall 114, in accordance with some embodiments. The spacer layer 126 may be configured to constrain a lateral growth of subsequently formed source/drain (S/D) structure (formed later) and support the first stack structure 104*a* and the second stack structure 104*b*.

In some embodiments, the spacer layer 126 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the spacer layer 126 is formed by chemical vapor deposition (CVD), atomic vapor deposition (ALD), physical vapor deposition (PVD), another suitable method, or a combination thereof.

Afterwards, as shown in FIGS. 2C-1 and 2C-2, a portion of the spacer layer 126 is removed to form a shortened spacer layer 126S, and then a portion of the first stack structure 104*a* and a portion of the second stack structure 104*b* are removed, in accordance with some embodiments. As a result, a first S/D recess 127*a* and a second S/D recess 127*b* are formed, and the top surfaces of the substrate of the substrate 102 are exposed by the first S/D recess 127*a* and the second S/D recess 127*b*.

Some portions of the first stack structure 104*a* and the second stack structure 104*b* are recessed to form curved top surfaces. The curved top surfaces of the first stack structure 104*a* and the second stack structure 104*b* are lower than the top surface of the isolation structure 116, and lower than the top surface of the shortened spacer layer 126S. In some embodiments, the first stack structure 104*a* and the second stack structure 104*b* are recessed by performing an etching process. The etching process may be an anisotropic etching process, such as dry plasma etching, and the dummy gate structure 118 and the shortened spacer layer 126S are used as etching masks during the etching process.

When the top portion of the spacer layer 126 is removed to form the shortened spacer layer 126S, the top portion of the dielectric wall 114 is simultaneously removed. In addition, a portion of the isolation structure 116 is also removed.

Before the etching process, the dielectric wall 114 has a first height $H_1$ along the vertical direction (as shown in FIG. 2A-1). After the etching process, the dielectric wall 114 has a second height $H_2$ along the vertical direction (shown in FIG. 2C-1). In some embodiments, the first height $H_1$ is greater than the second height $H_2$. The shortened spacer layer 126S has a third height $H_3$ along the vertical direction. In some embodiments, the second height $H_2$ of the dielectric wall 114 is greater than the third height $H_3$ of the shortened spacer layer 126S. The top surface of the dielectric wall 114 is higher than the top surface of shortened spacer layer 126S. In other words, the top surface of shortened spacer layer 126S is lower than the top surface of the dielectric wall 114. The third height $H_3$ of the shortened spacer layer 126S is smaller than the first height $H_1$ of the dielectric wall 114. In some other embodiments, there is no spacer layer 126 adjacent to the dielectric wall 114.

Next, as shown in FIGS. 2D-1 and 2D-2, a hard mask layer 129 is formed on the shortened spacer layer 126S, the dielectric wall 114, the first stack structure 104*a*, the second stack structure 104*b*, and isolation structure 116, in accordance with some embodiments. Next, a photoresist layer 131 is formed over a portion of the hard mask layer 129. The photoresist layer 131 is patterned to form a patterned photoresist layer 131 to transfer the pattern to the hard mask layer 129. The patterned photoresist layer 131 is formed in the second region 20.

The spacer layer 126 has a high etching selectivity with respect to the hard mask layer 129. In addition, the dielectric wall 114 has a high etching selectivity with respect to the hard mask layer 129. When the hard mask layer 129 is removed, the spacer layer 126 and the dielectric wall 114 are rarely removed. In some embodiments, the hard mask layer 129 is made of nitride or oxide, such as silicon nitride or aluminum oxide ($Al_2O_3$) or another applicable material. In some embodiments, the hard mask layer 129 is formed by chemical vapor deposition (CVD), atomic vapor deposition (ALD), physical vapor deposition (PVD), another suitable method, or a combination thereof.

Afterwards, as shown in FIGS. 2E-1 and 2E-2, a portion of the hard mask layer 129 in the first region 10 which is not coved by the photoresist layer 131 is removed to expose the first S/D recess 127*a*, and then the photoresist layer 131 is removed, in accordance with some embodiments.

Next, a first S/D structure 132*a* is formed in the first S/D recess 127*a* in the first region 10, in accordance with some embodiments. In some embodiments, the first S/D structure 132*a* extends above the top surface of dielectric wall 114. In addition, the first S/D structure 132*a* is in direct contact with the dielectric wall 114. The first S/D structure 132*a* is in direct contact with the sidewall of the dielectric wall 114. Afterwards, the remaining hard mask layer 129 in the second region 20 is removed to expose the second S/D recess 127*b*.

In some embodiments, the first S/D structures 132*a* is made of any applicable material, such as Ge, Si, GaAs, AlGaAs, SiGe, GaAsP, SiP, SiC, SiCP, or a combination thereof. In some embodiments, the first S/D structure 132*a* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the first S/D structure 132*a* is in-situ doped during the epitaxial growth process. For example, the first S/D structure 132*a* may be the epitaxially grown SiGe doped with boron (B). For example, the first S/D structure 132*a* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first S/D structures 132*a* are doped in one or more implantation processes after the epitaxial growth process.

Afterwards, as shown in FIGS. 2F-1 and 2F-2, the hard mask layer 129 is again formed on the shortened spacer layer 126S, the dielectric wall 114, the isolation structure 116 and the first S/D structure 132*a*, in accordance with some embodiments. Next, the photoresist layer 131 is formed over a portion of the hard mask layer 129 in the first region 10, and the photoresist layer 131 is patterned to form a patterned photoresist layer 131. The patterned photoresist layer 131 is in the first region 10.

Next, as shown in FIGS. 2G-1 and 2G-2, a portion of the hard mask layer 129 is removed to expose the second S/D recess 127*b* in the second region 20, in accordance with some embodiments. Next, the patterned photoresist layer 131 is removed. Afterwards, a second S/D structure 132*b* is formed in the second S/D recess 127*b* in the second region 20. In some embodiments, the second S/D structure 132*b* extends above the top surface of the dielectric wall 114. In addition, the second S/D structure 132*b* is in direct contact with the dielectric wall 114. The second S/D structure 132*b* is in direct contact with the sidewalls of the dielectric wall 114. Afterwards, the remaining hard mask layer 129 which is used to protect the first S/D structure 132*a* in the first region 10 is removed.

In some embodiments, the second S/D structures 132*b* is made of any applicable material, such as Ge, Si, GaAs, AlGaAs, SiGe, GaAsP, SiP, SiC, SiCP, or a combination thereof. In some embodiments, the second S/D structure 132*b* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the second S/D structure 132*b* is in-situ doped during the epitaxial growth process. For example, the second S/D structure 132*b* may be the epitaxially grown SiGe doped with boron (B). For example, the second S/D structure 132*b* may be the epitaxially grown Si doped with carbon to form silicon:carbon (Si:C) source/drain features, phosphorous to form silicon:phosphor (Si:P)

source/drain features, or both carbon and phosphorous to form silicon carbon phosphor (SiCP) source/drain features. In some embodiments, the second S/D structures 132*b* are doped in one or more implantation processes after the epitaxial growth process.

Next, as shown in FIGS. 2H-1 and 2H-2, after the first S/D structure 132*a* and second S/D structures 132*b* are formed, a contact etch stop layer (CESL) 138 is conformally formed to cover the S/D structures 136 and an interlayer dielectric (ILD) layer 140 is formed over the CESL 138, in accordance with some embodiments. The CESL 138 is in direct contact with the top surface of the dielectric wall 114.

In some embodiments, the CESL 138 is made of a dielectric materials, such as silicon nitride, silicon oxide, silicon oxynitride, another suitable dielectric material, or a combination thereof. The dielectric material for the CESL 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the CESL 138 and the ILD layer 140 are deposited, a planarization process such as CMP or an etch-back process may be performed until the gate electrode layers 120 of the dummy gate structures 118 are exposed, as shown in FIG. 2H-2, in accordance with some embodiments.

Next, as shown in FIGS. 2I-1 and 2I-2, the dummy gate structure 118 is removed to expose the first stack structure 104*a* and the second stack structure 104*b*, in accordance with some embodiments. As a result, the dielectric wall 114 is exposed. Next, the first semiconductor material layers 106 are removed to form nanostructures 108' with the second semiconductor material layers 108, in accordance with some embodiments. In addition, the nanostructures 108' is above the fin structure 105.

It should be noted that, the dielectric wall 114 along line B-B' in FIG. 1F, is directly below the dummy gate structure 118 and protected by the dummy gate structure 118, it is not removed when the process for forming the first S/D structure 132*a* and the second S/D structure 132*b*.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

The first S/D structure 132*a* and the second S/D structure 132*b* are attached to the nanostructures 108'. The vertical layer 112 is also called as vertical channel layer or vertical nanostructure. The vertical layer 112 is connected to the dielectric wall 114. The nanostructure 108' is also called as horizontal channel layer or horizontal nanostructure. The vertical layer (or vertical nanostructure) 112 is connected to the horizontal nanostructures 108'. The vertical layer (or vertical nanostructure) 112 extends from a position which is below the top surface of the fin structure 105. The vertical layer (or vertical nanostructure) 112 extends from a position which is below the top surface of the isolation structure 116.

In some embodiments, the vertical layer (or vertical nanostructure) 112 and the nanostructure (or the horizontal nanostructure) 108' are made of different materials. In some embodiments, the vertical layer (or vertical nanostructure) 112 and the nanostructure (or the horizontal nanostructure) 108' forms an E-shaped structure. The topmost surface of the dielectric wall 114 is higher than the topmost surface of the vertical layer 112.

Since the vertical layer (or vertical nanostructure) 112 is connected to the horizontal nanostructures 108', the effective width Weff of the semiconductor structure 100*a* including the width of the vertical layer (or vertical nanostructure) 112 and width of the horizontal nanostructures 108' is increased, the on-state current (Ion) of the semiconductor structure 100*a* is improved. Therefore, the performance of the semiconductor structure 100*a* is improved.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, as shown in FIGS. 2J-1 and 2J-2, after the nanostructures 108' are formed, an interfacial layer 144 is formed to surround the nanostructures 108' and over the isolation structure 116, and a gate dielectric layer 146 is formed on the interfacial layer 144, in accordance with some embodiments. The interfacial layer 144 is in direct contact with the vertical layer 112.

In some embodiments, the interfacial layer 144 is oxide layer formed around the nanostructures 108'. In some embodiments, the interfacial layer 144 is formed by performing a thermal process. In some embodiments, the gate dielectric layers 146 are formed over the interfacial layers 144, so that the nanostructures 108' are surrounded (e.g. wrapped) by the interfacial layers 144 and gate dielectric layers 146.

In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

The nanostructure 108' has a first thickness $T_1$, and the vertical layer 112 has a second thickness $T_2$. The first thickness $T_1$ is equal to or greater than the second thickness. In some embodiments, there is a ration ($T_1/T_2$) of first thickness $T_1$ to the second thickness $T_2$ in a range from about 1 to 5.

There is a horizontal channel width $W_1$ which is measured from the outer sidewall of the nanostructure 108' to the outer sidewall of the dielectric wall 114. The horizontal channel width $W_1$ can be different for the NMOS channel and PMOS channel. In some embodiments, there is a ratio of the horizontal channel width $W_1$ in NMOS to the horizontal channel width $W_1$ in the PMOS in a range from about 0.4 to about 2.5. The dielectric wall 114 has a width $W_2$. In some embodiments, the horizontal channel width $W_1$ is in a range from about 6 nm to about 100 nm. In some embodiments, there is a ration ($W_2/W_1$) of width $W_2$ to the horizontal channel width $W_1$ is in a range from about 0.2 to 3. There is a space $S_1$ between every two adjacent nanostructures 108'. In some embodiments, the space $S_1$ is in a range from about 6 nm to about 20 nm.

Afterwards, as shown in FIGS. 2K-1 and 2K-2, a first gate electrode layer 148*a* is formed in the first region 10 and the second region 20 to surround the nanostructures 108', in accordance with some embodiments. A first gate structure 142*a* is constructed by the interfacial layer 144, the gate dielectric layer 146, and the first gate electrode layer 148*a*. Next, a hard mask layer 149 is formed over the first gate electrode layer 148*a* the first region 10.

The first gate structure 142*a* wraps around the nanostructures 108' and the vertical layer 112. In some embodiments, the first gate electrode layer 148*a* is formed on the gate dielectric layer 146. In some embodiments, the first gate electrode layer 148*a* is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate electrode layer 148*a* is formed using chemical vapor deposition (CVD), atomic layer deposition (ALD), electroplating, another applicable method, or a combination thereof.

Other conductive layers, such as work function metal layers, may also be formed in the first gate structure 142*a*, although they are not shown in the figures. In some embodiments, the n-work function layer includes tungsten (W), copper (Cu), titanium ($T_1$), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

Next, as shown in FIGS. 2L-1 and 2L-2, the portion of the first gate electrode layer 148*a* is removed in the second region 20 by using the hard mask layer 149 as the mask, and a second gate electrode layer 148*b* is formed in the second region 20 to surround the nanostructures 108', in accordance with some embodiments. A second gate structure 142*b* is constructed by the interfacial layer 144, the gate dielectric layer 146, and the second gate electrode layer 148*b*. The material of the second gate electrode layer 148*b* is different from that of the first gate electrode layer 148*a*. There is an interface between the first gate electrode layer 148*a* and the second gate electrode layer 148*b*.

The second gate structure 142*b* wraps around the nanostructures 108' and the vertical layer 112. In some embodiments, the second gate electrode layer 148*b* is formed on the gate dielectric layer 146. In some embodiments, the second gate electrode layer 148*b* is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the second gate electrode layer 148*b* is formed using chemical vapor deposition (CVD), atomic layer deposition (ALD), electroplating, another applicable method, or a combination thereof.

Next, as shown in FIGS. 2M-1 and 2M-2, a cap structure 160 is formed over the dielectric wall 114, in accordance with some embodiments. The cap structure 160 is used to separate the first gate structure 142*a* from the second gate structure 142*b*. The first gate structure 142*a* and the second gate structure 142*b* are separated by the cap structure 160 and the dielectric wall 114.

In some embodiments, the cap structure 160 is made of oxide, such as $SiO_2$, SiOCN, SiON, or the like. In some embodiments, the cap structure 160 is made of a high k dielectric material, such as $HfO_2$, $ZrO_2$, HfAlOx, HfSiOx, $Al_2O_3$, or the like. In some embodiments, the cap structure 160 is formed by performing ALD, CVD, PVD, other suitable process, or combinations thereof.

Afterwards, as shown in FIGS. 2N-1 and 2N-2, an etching stop layer 152 is formed over the ILD layer 140 and the first gate structure 142*a* and the second gate structure 142*b*, in accordance with some embodiments. Next, an ILD layer 154 is formed over the etching stop layer 152. Afterwards, a portion of the ILD layer 154, a portion of the etching stop layer 152 and a portion of the first S/D structure 152*a*, and a portion of the second S/D structure 152*b* are removed to form a trench (not shown). The top surfaces of the first S/D structure 152*a* and the top surface of the second S/D structure 152*b* are exposed by the trench. Next, a silicide layer 155 and an S/D contact structure 156 are formed over the first S/D structure 132*a* and the second S/D structure 132*b*.

In some embodiments, the trench is formed through the CESL 138, the ILD layer 140, the etching stop layer 152 and the ILD layer 154 to expose the top surfaces of the first S/D structures 132*a*, and then the silicide layer 155 and the S/D contact structure 156 is formed in the trench. The trench may be formed using a photolithography process and an etching process. In addition, some portions of the first S/D structures 132*a* exposed by the trench may also be etched during the etching process.

After the trench are formed, the silicide layer 155 may be formed by forming a metal layer over the top surface of the first S/D structures 132*a* and annealing the metal layer so the metal layer reacts with the first S/D structures 132*a* to form the silicide layer 155. The unreacted metal layer may be removed after the silicide layers 155 are formed.

The dielectric wall 114 is between the first S/D structure 132*a* and the second S/D structure 132*b*. The S/D contact structure 156 is not in direct contact with the dielectric wall 114. In some embodiments, the bottom surface of the S/D contact structure 156 is lower than the top surface of the dielectric wall 114.

The S/D contact structure 156 may include a barrier layer and a conductive layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

In some embodiments, the etching stop layer 152 is made of a dielectric materials, such as silicon nitride, silicon oxide, silicon oxynitride, another suitable dielectric material, or a combination thereof. The dielectric material for the etching stop layer 152 may be conformally deposited over the semiconductor structure by performing chemical vapor deposition (CVD), ALD, other application methods, or a combination thereof.

The ILD layer 154 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 154 may be formed by chemical vapor deposition (CVD), physical vapor deposition, (PVD), atomic layer deposition (ALD), or other applicable processes.

As shown in FIGS. 2N-1 and 2N-2, the semiconductor structure 100*a* has the horizontal nanostructures 108' and the vertical nanostructure 112, and therefore the effective width of the semiconductor structure 100*a* is increased. Accordingly, the on-state current (Ion) of the semiconductor structure is improved. Therefore, the performance of the semiconductor structure is improved.

FIGS. 3A to 3F show perspective views of intermediate stages of manufacturing a semiconductor structure 100*b*, in accordance with some embodiments. The semiconductor structure 100*b* of FIG. 3A-3F includes elements that are similar to, or the same as, elements of the semiconductor structure 100*a* of FIG. 1A-1F.

Figure 3A:
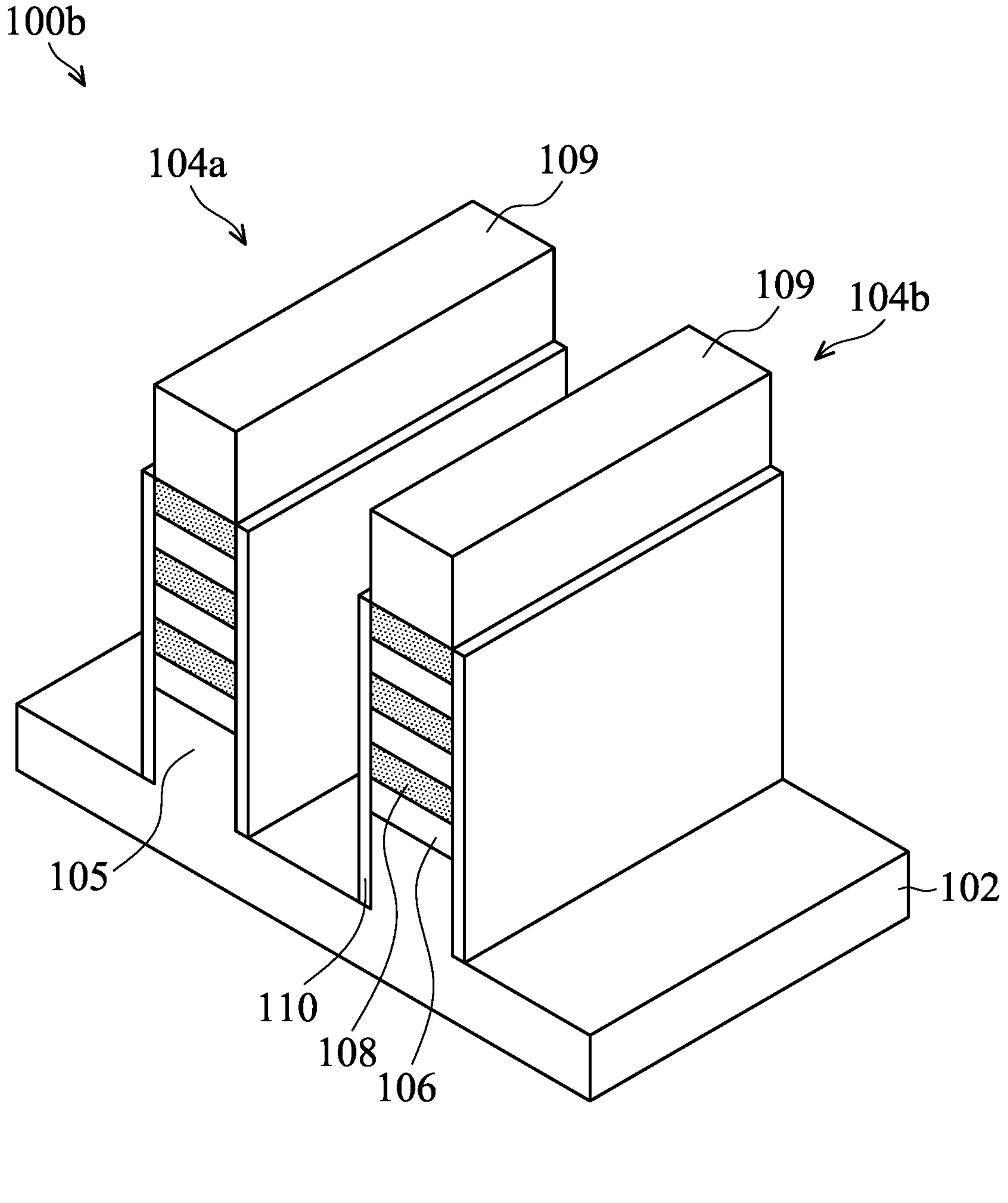
FIGS. 3A to 3F show perspective views of intermediate stages of manufacturing a semiconductor structure, in accordance with some embodiments.

As shown in FIG. 3A, the first stack structure 104*a* and the second stack structure 104*b* are formed over the fin structure 105, and the mask structure 109 is formed over the first stack structure 104*a* and the second stack structure 104*b*. Each of the first stack structure 104*a* and the second stack structure 104*b* includes the first semiconductor material layers 106 and the second semiconductor material layers 108. Next, a sacrificial layer 110 is formed on the sidewall of the first stack structure 104*a* and the second stack structure 104*b*. The sacrificial layer 110 is in direct contact with the first semiconductor material layers 106 and the second semiconductor material layers 108.

In some embodiments, the sacrificial layer 110 includes silicon ($S_1$), germanium (Ge), silicon germanium ($Si_{1-x}Gex$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the sacrificial layer 110 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 3B:
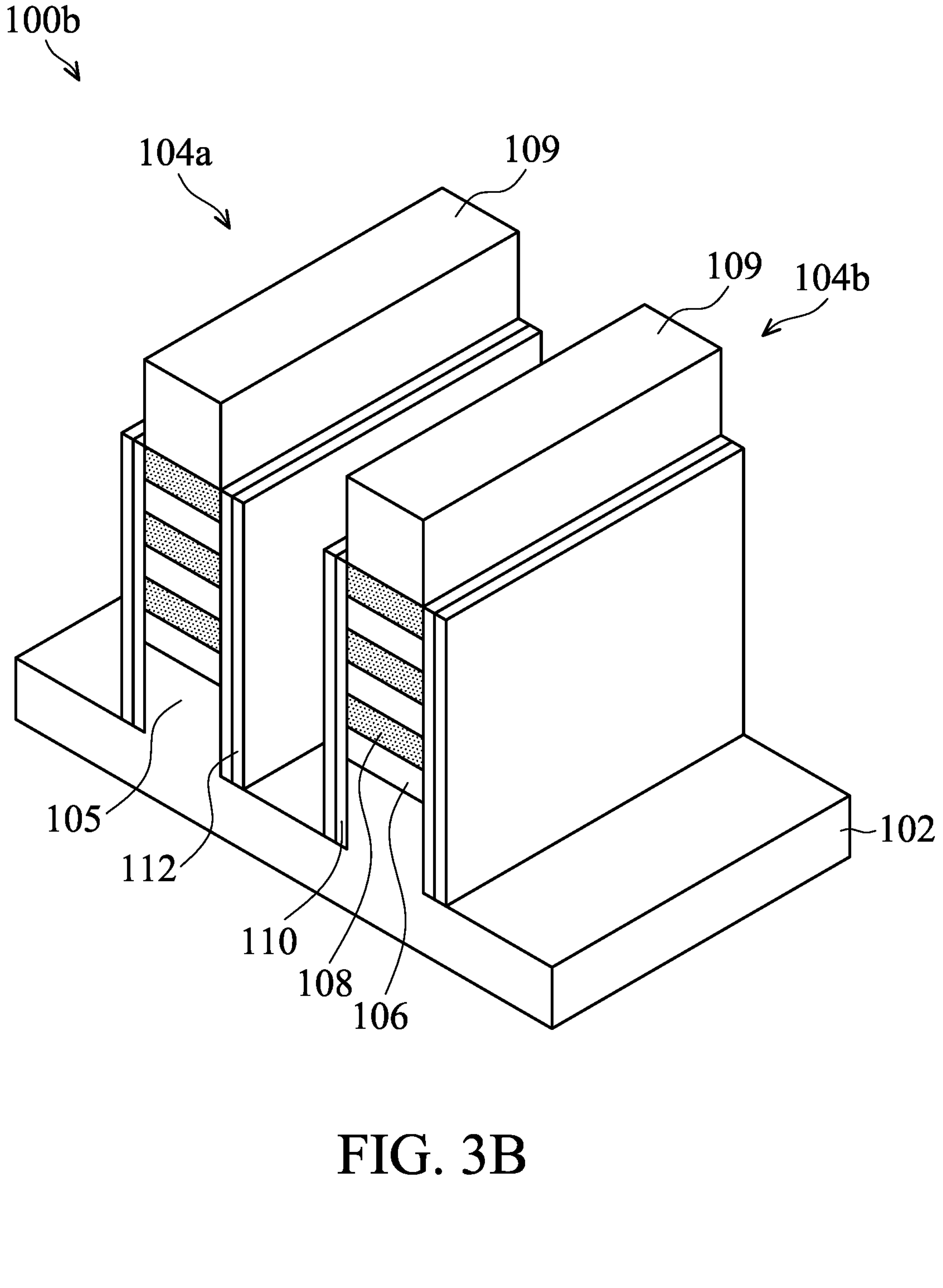

Next, as shown in FIG. 3B, the vertical layer 112 is formed over the sacrificial layer 110, in accordance with some embodiments. The vertical layer 112 and the sacrificial layer 110 are made of different materials. It should be noted that the vertical layer 112 has a higher etching selectivity with respect to the sacrificial layer 110. The sacrificial layer 110 will be removed in the subsequent process, but the vertical layer 112 is remaining.

Figure 3C:
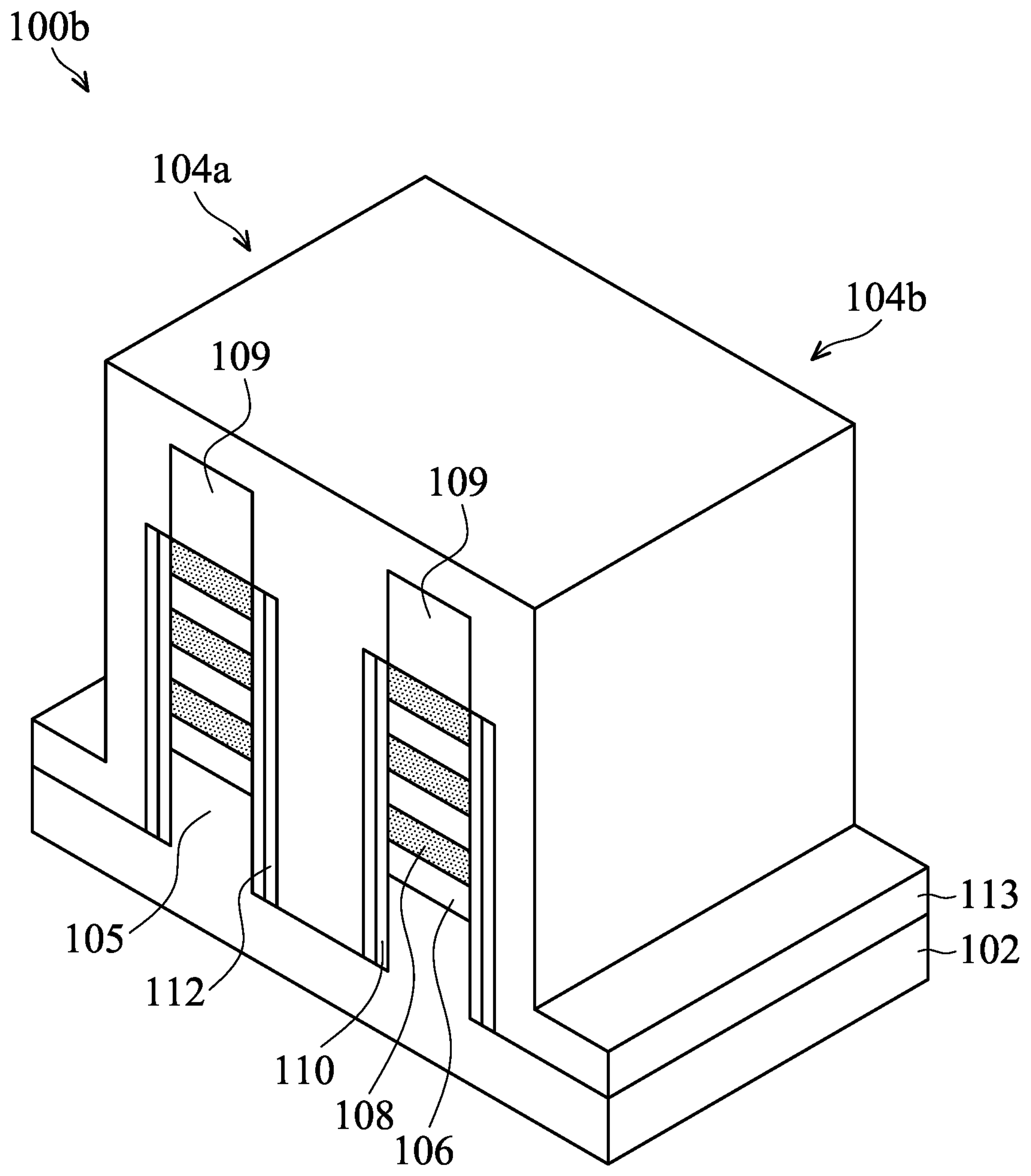

Afterwards, as shown in FIG. 3C, the dielectric layer 113 is formed over the mask structure 109, the first stack structure 104*a*, the second stack structure 104*b*, the sacrificial layer 110, the vertical layer 112, and the substrate 102, in accordance with some embodiments.

In some embodiments, the dielectric layer 113 is made of SiN, SiCN, SiOC, SiOCN or applicable material. In some embodiments, the dielectric layer 113 is formed by chemical vapor deposition (CVD), atomic vapor deposition (ALD), physical vapor deposition (PVD), another suitable method, or a combination thereof.

Figure 3D:
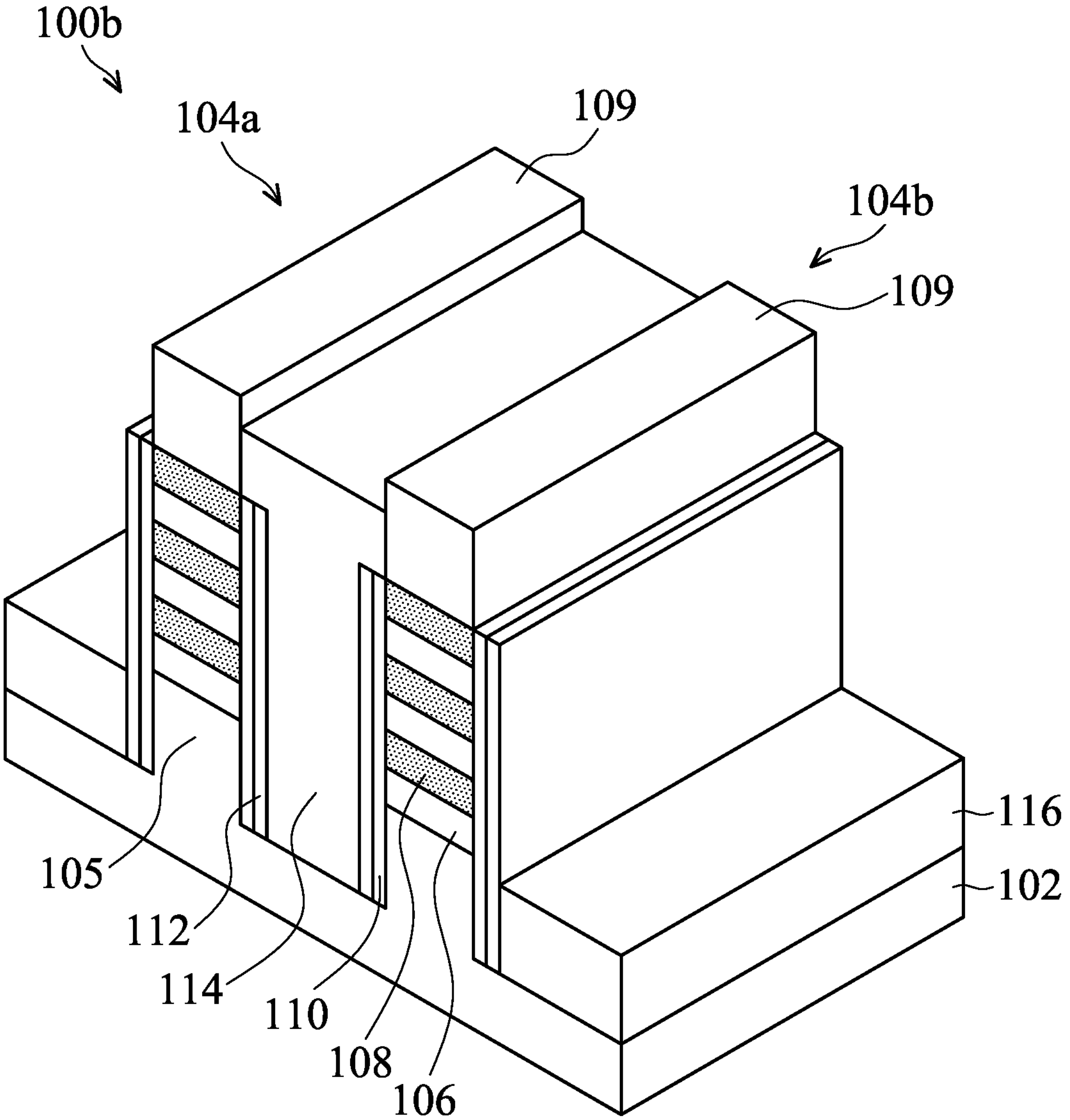

Next, as shown in FIG. 3D, a portion of the dielectric layer 113 is removed to form the dielectric wall 114 between the first stack structure 104*a* and the second stack structure 104*b*, in accordance with some embodiments. The mask structure 109 is used to protect the dielectric wall 114 from being removed. The top surface of the mask structure 109 is higher than the top surface of the dielectric wall 114.

Afterwards, the isolation structure 116 is formed around the first stack structure 104*a* and the second stack structure 104*b*, in accordance with some embodiments. The isolation structure 116 is configured to electrically isolate active regions (e.g. the first stack structure 104*a* or the second stack structure 104*b*) of the semiconductor structure 100*b* and is also referred to as shallow trench isolation (STI) feature in accordance with some embodiments.

Figure 3E:
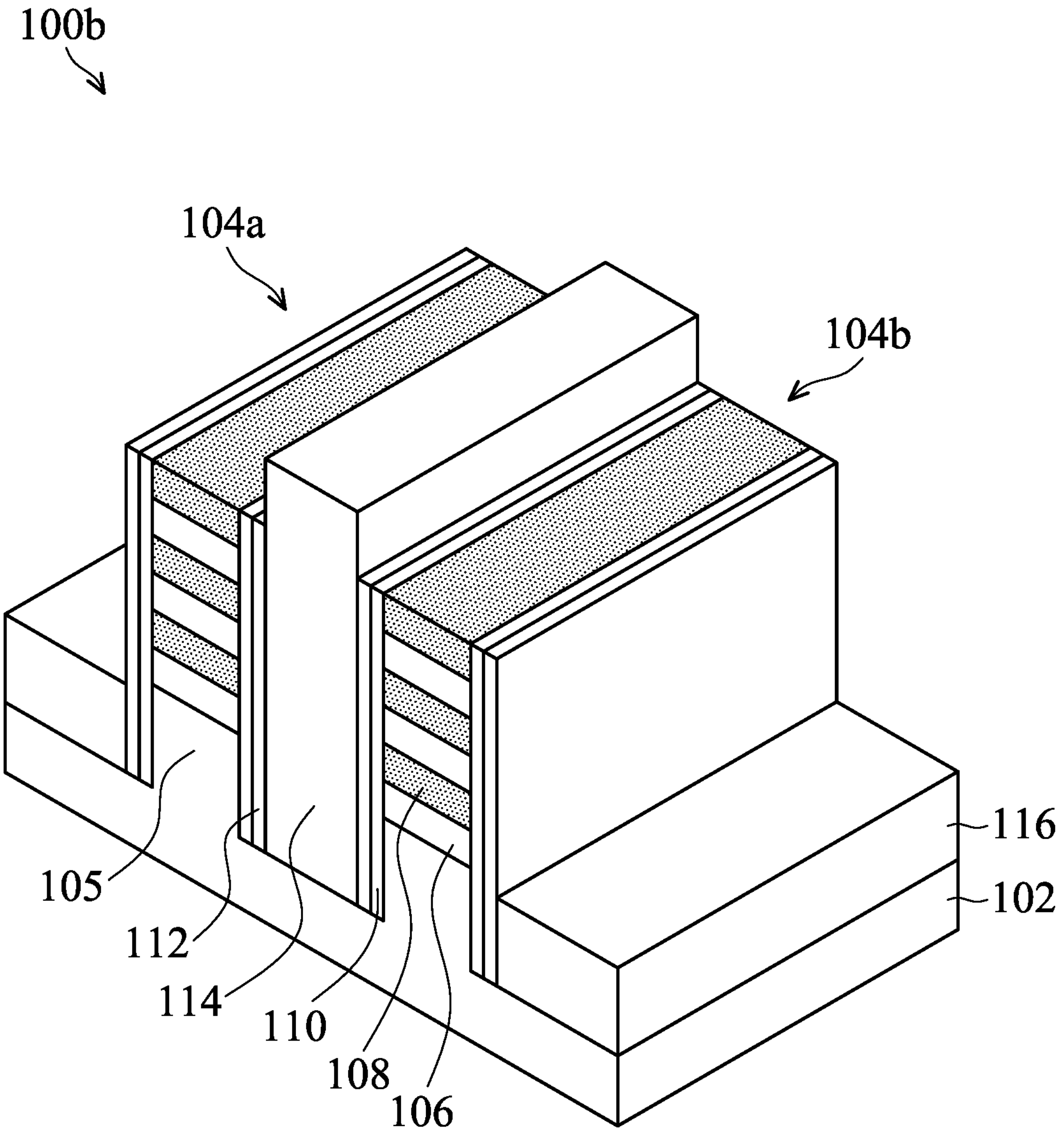

Afterwards, as shown in FIG. 3E, the mask structure 109 is removed to form the dielectric wall 114 above the first stack structure 104*a* and the second stack structure 104*b*, in accordance with some embodiments. As a result, the dielectric wall 114 is higher than the topmost first semiconductor layer 108 of the first stack structure 104*a*. In some embodiments, the mask structure 109 is removed by an etching process, such as wet etching process or dry etching process.

Figure 3F:
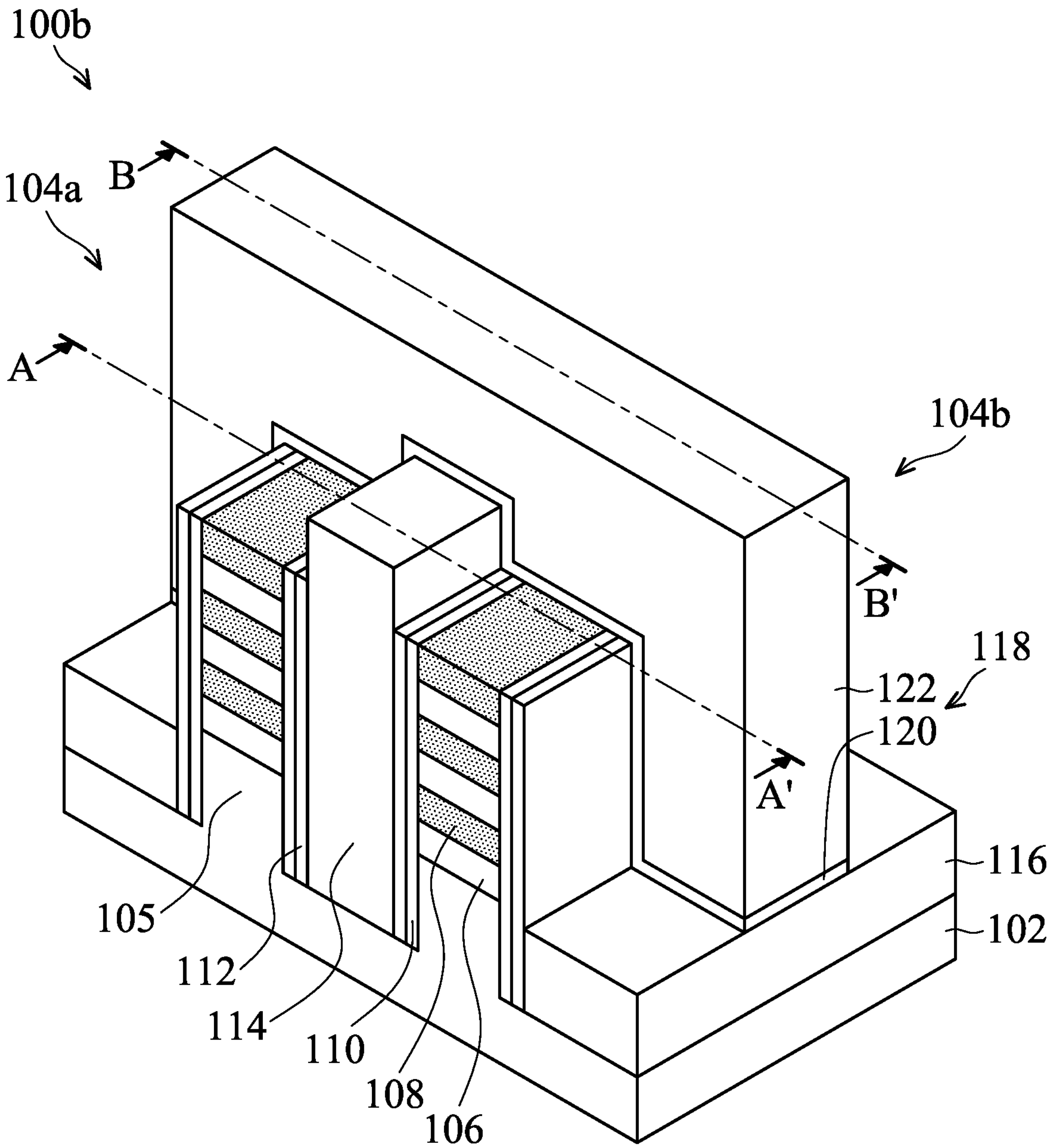

Next, as shown in FIG. 3F, the dummy gate structure 118 is formed across the first stack structure 104*a* and the second stack structure 104*b* and extends over the isolation structure 116, in accordance with some embodiments. The dummy gate structures 118 may be used to define the source/drain (S/D) regions and the channel regions of the resulting semiconductor structure 100*a*. In some embodiments, the dummy gate structures 118 include the dummy gate dielectric layer 120 and the dummy gate electrode layer 122.

Figures 1, 4A:
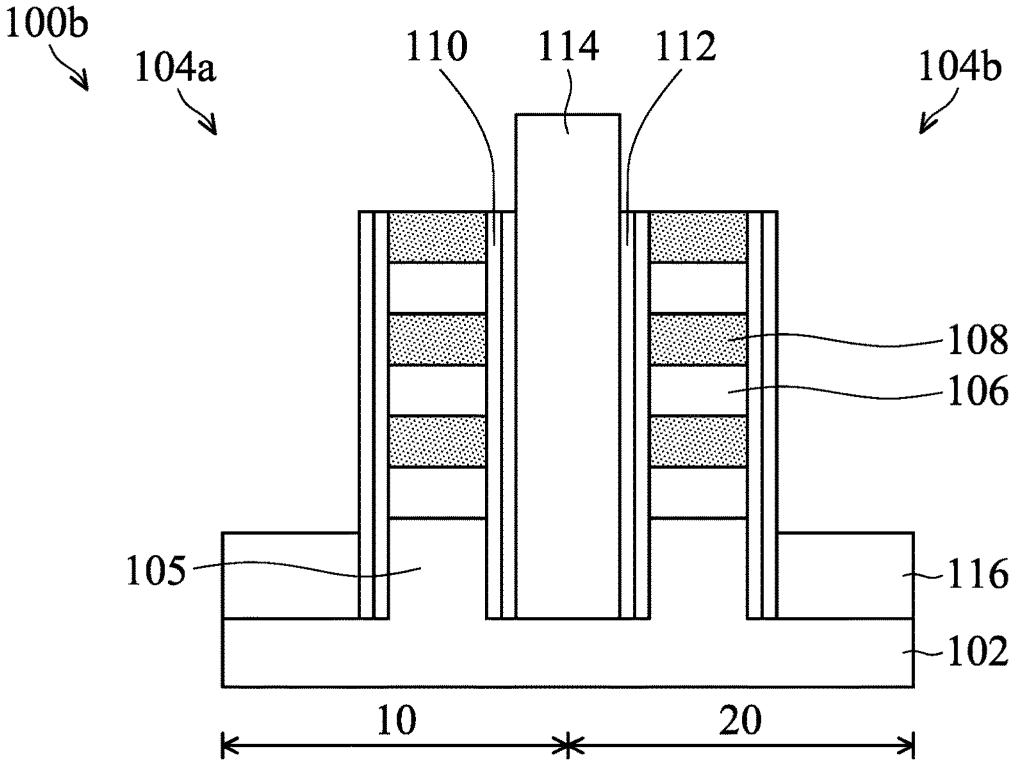
Figures 2, 4A:
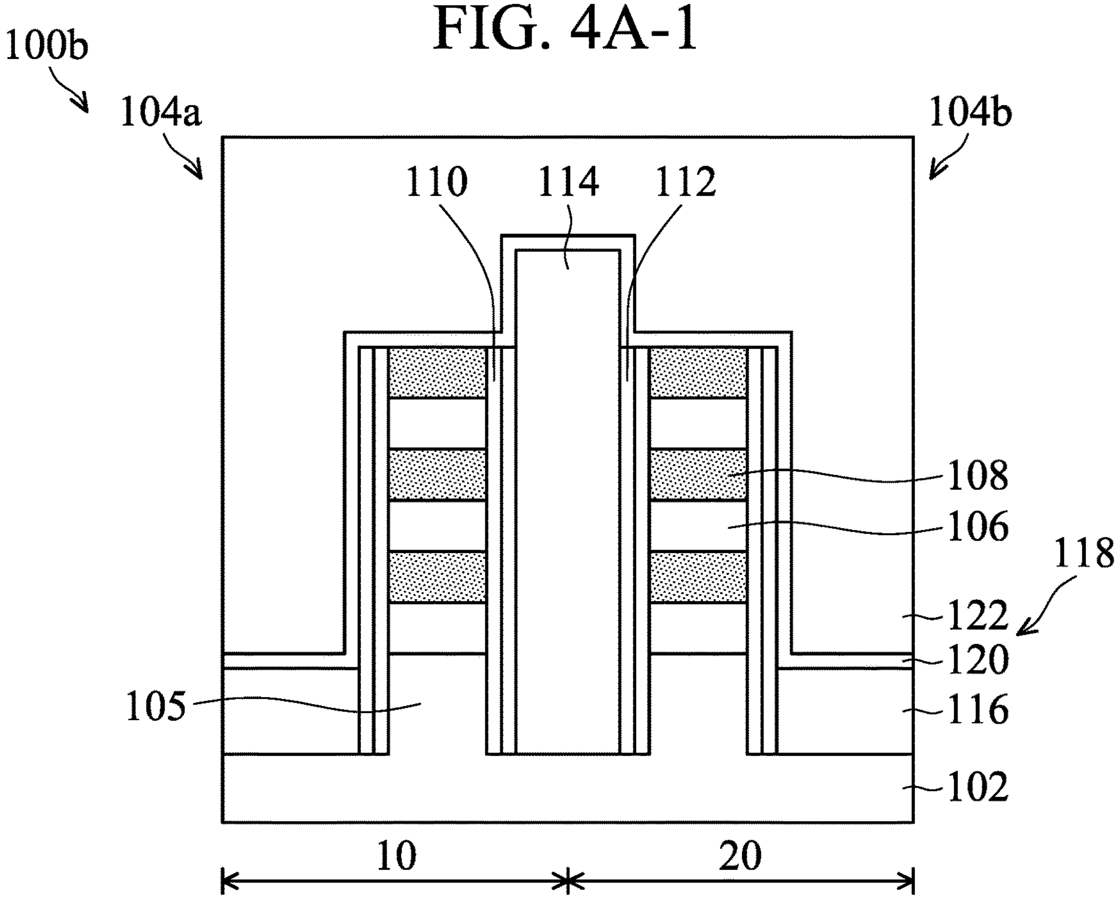
Figures 1, 4B:
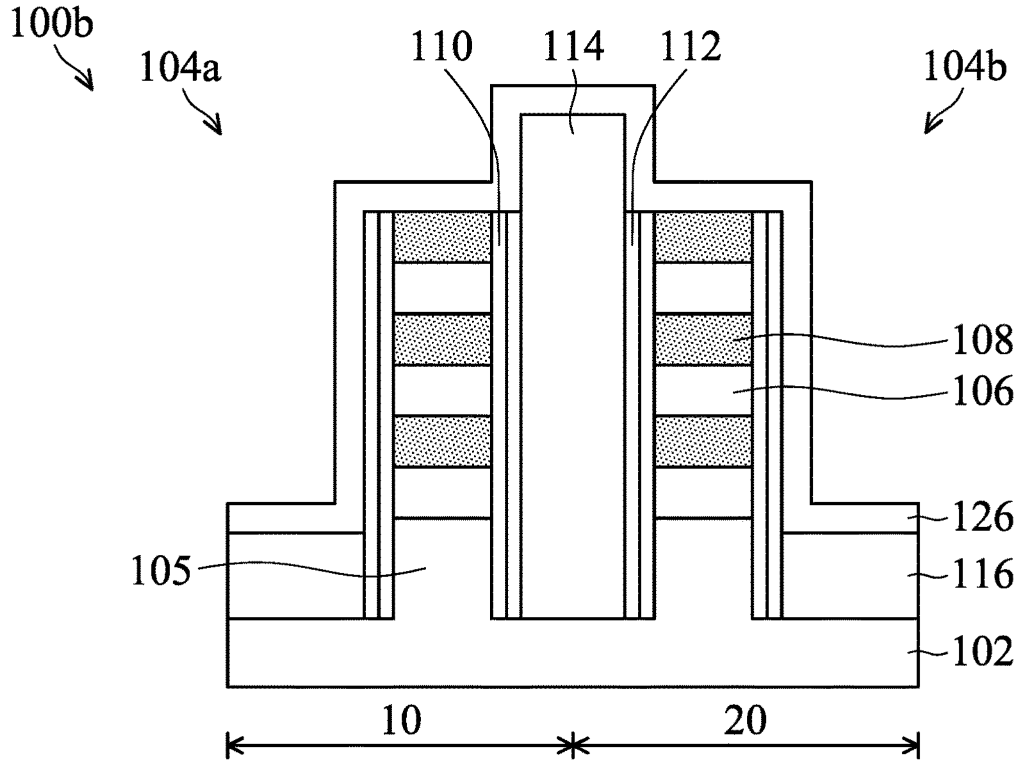
Figures 2, 4B:
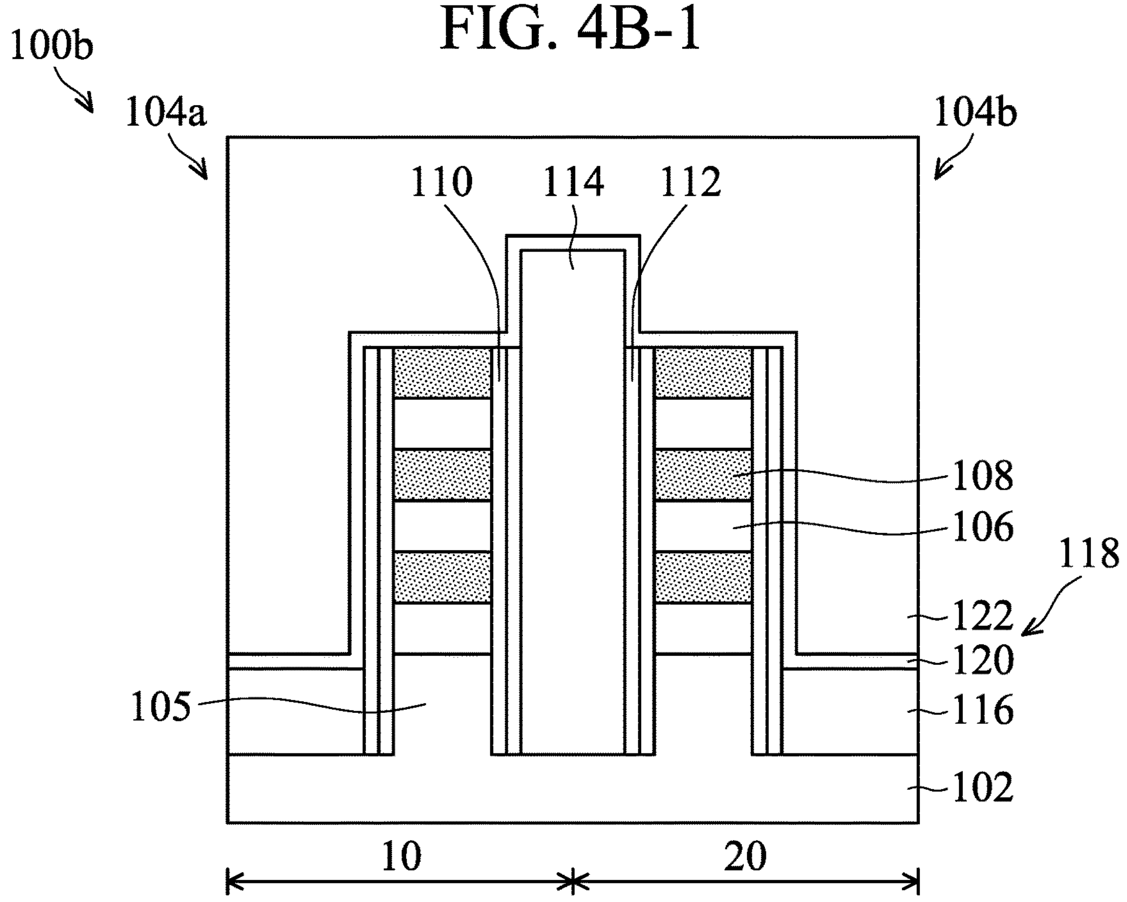
Figures 1, 4C:
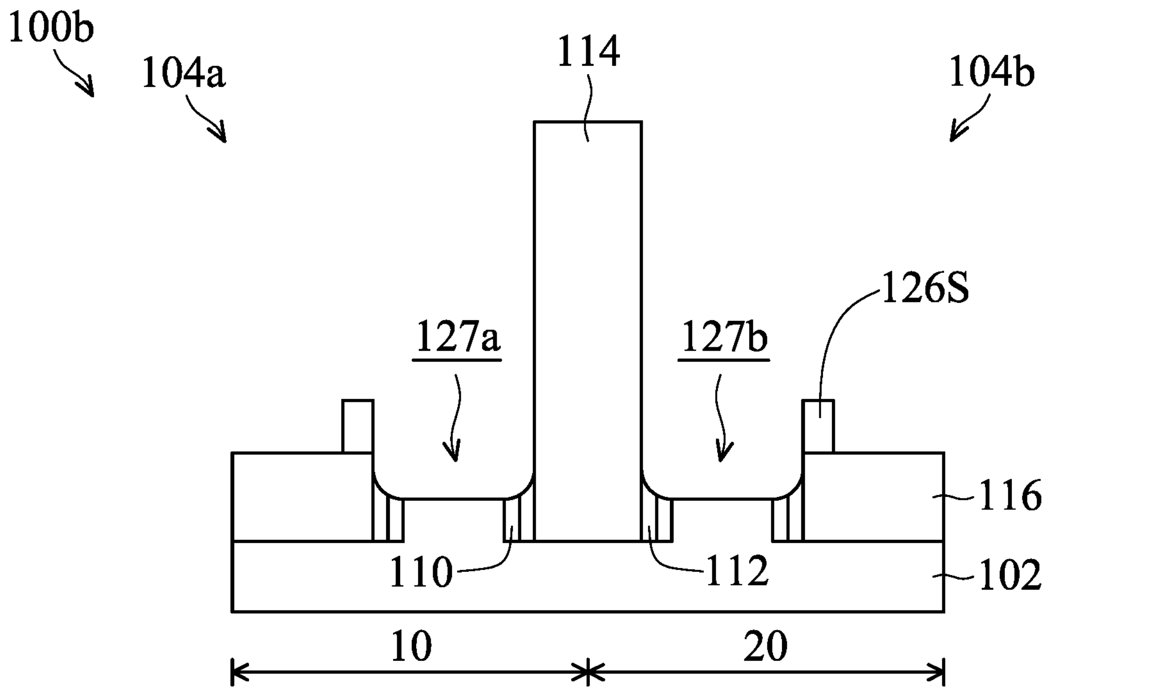
Figures 2, 4C:
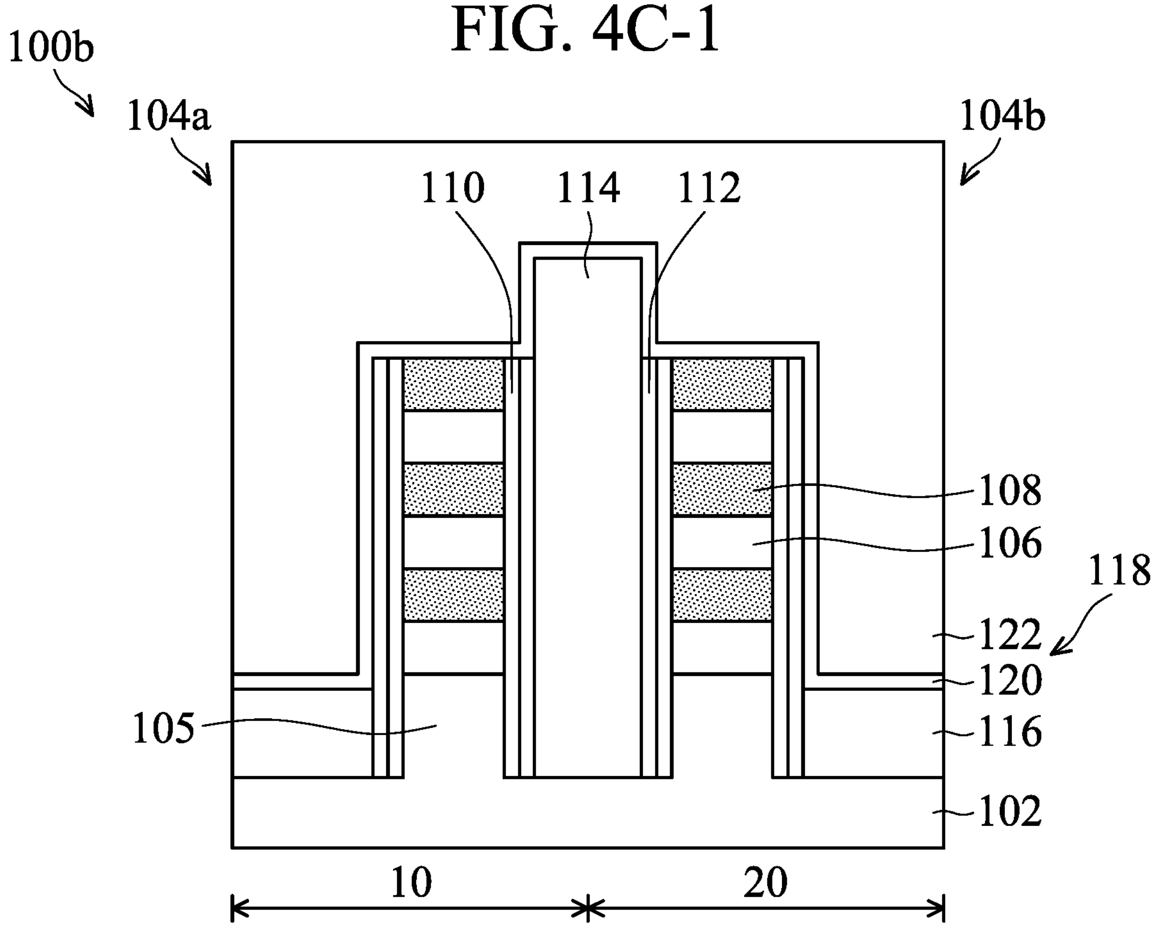
Figures 1, 4D:
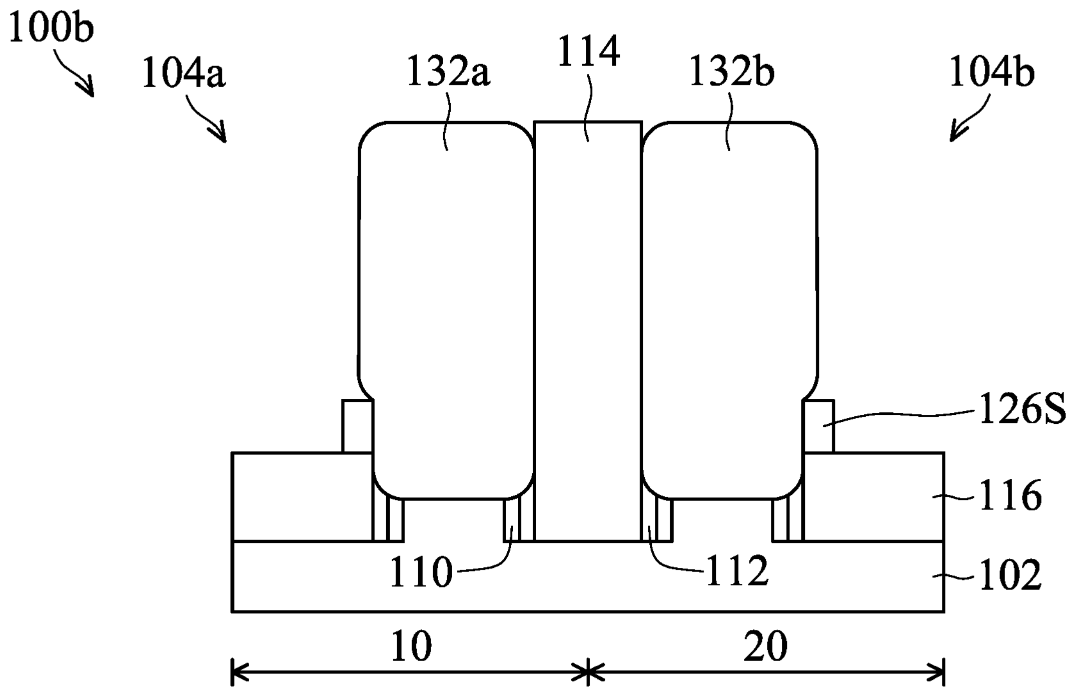
Figures 2, 4D:
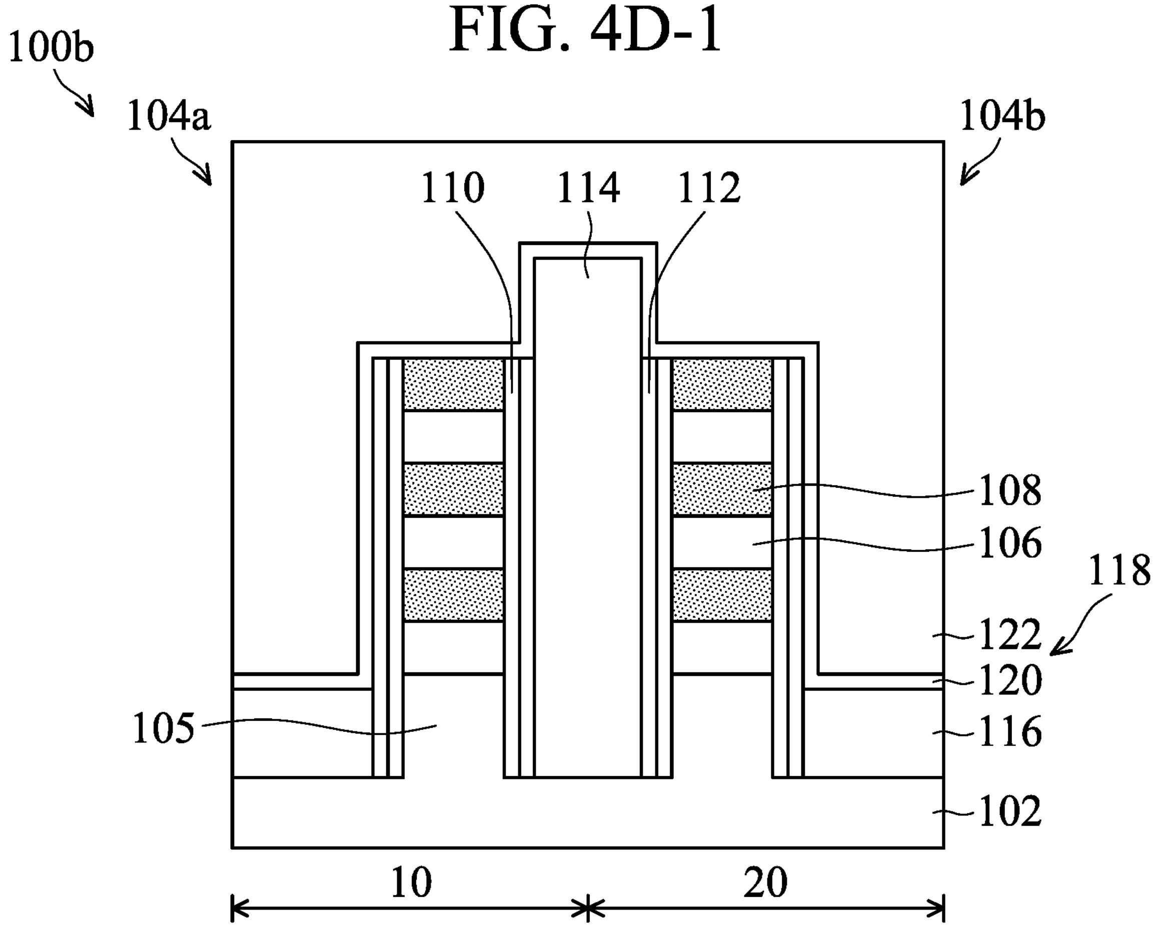
Figures 1, 4E:
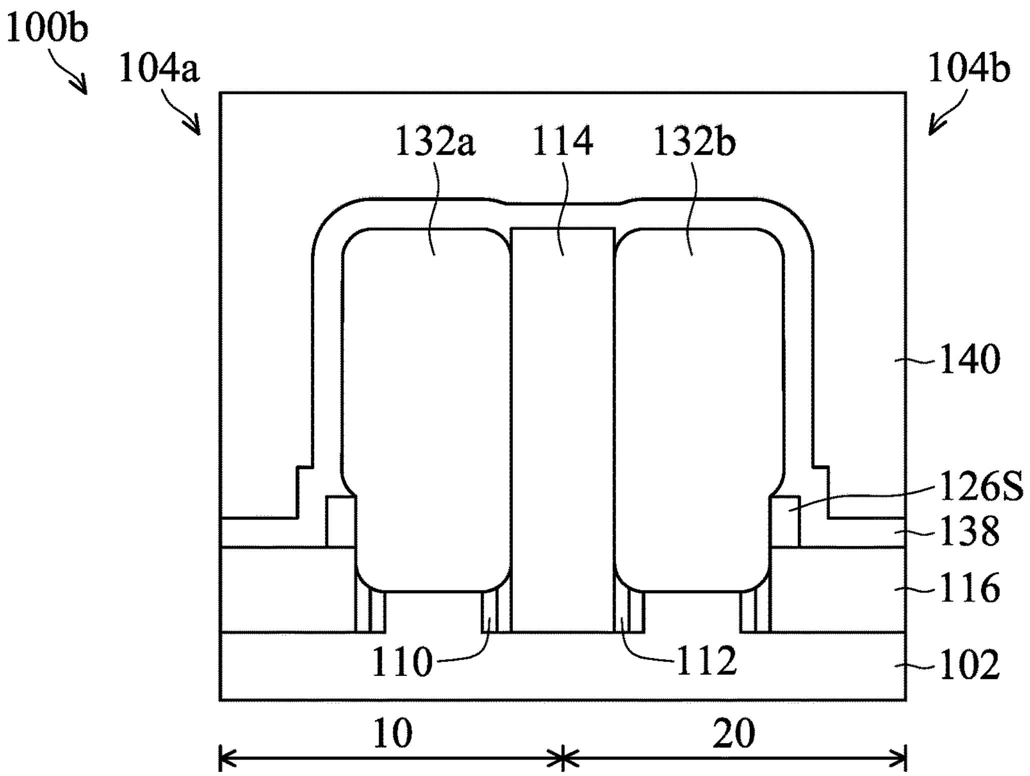
Figures 2, 4E:
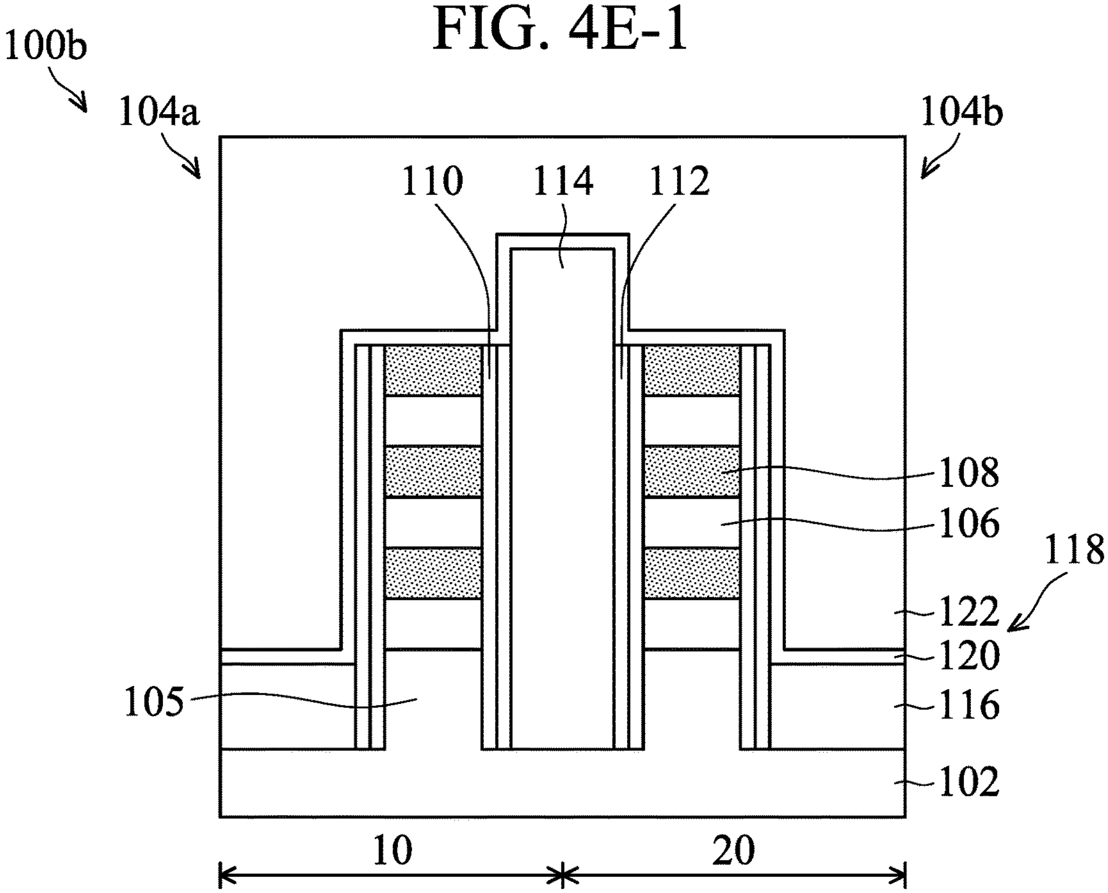
Figures 1, 4F:
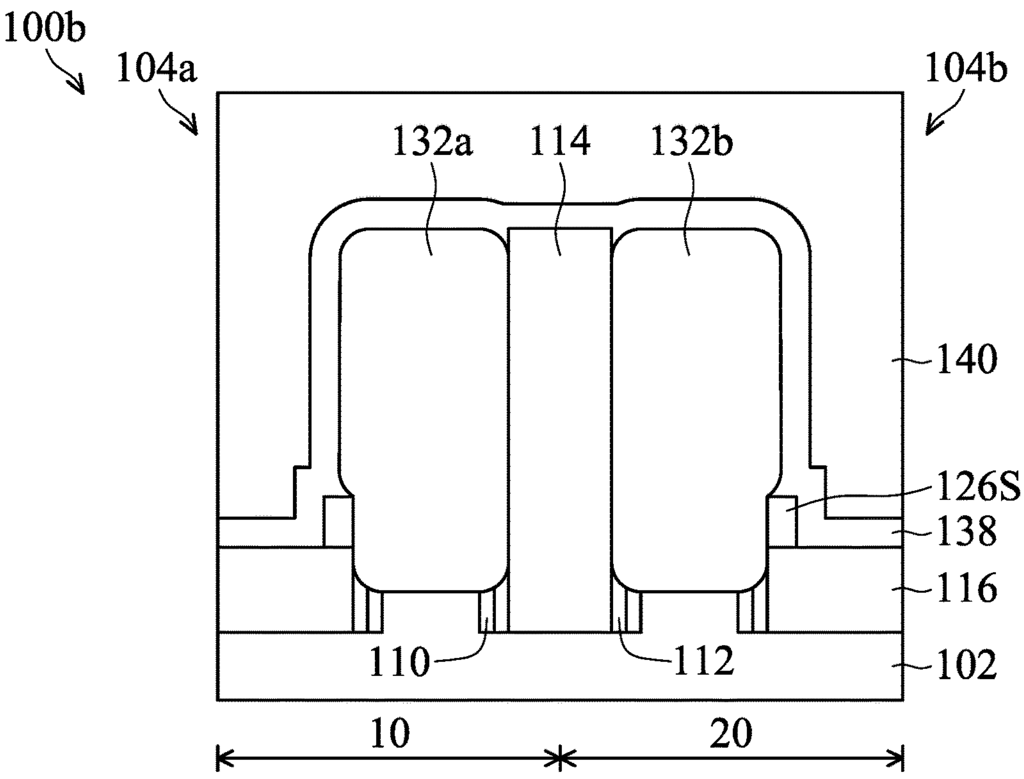
Figures 2, 4F:
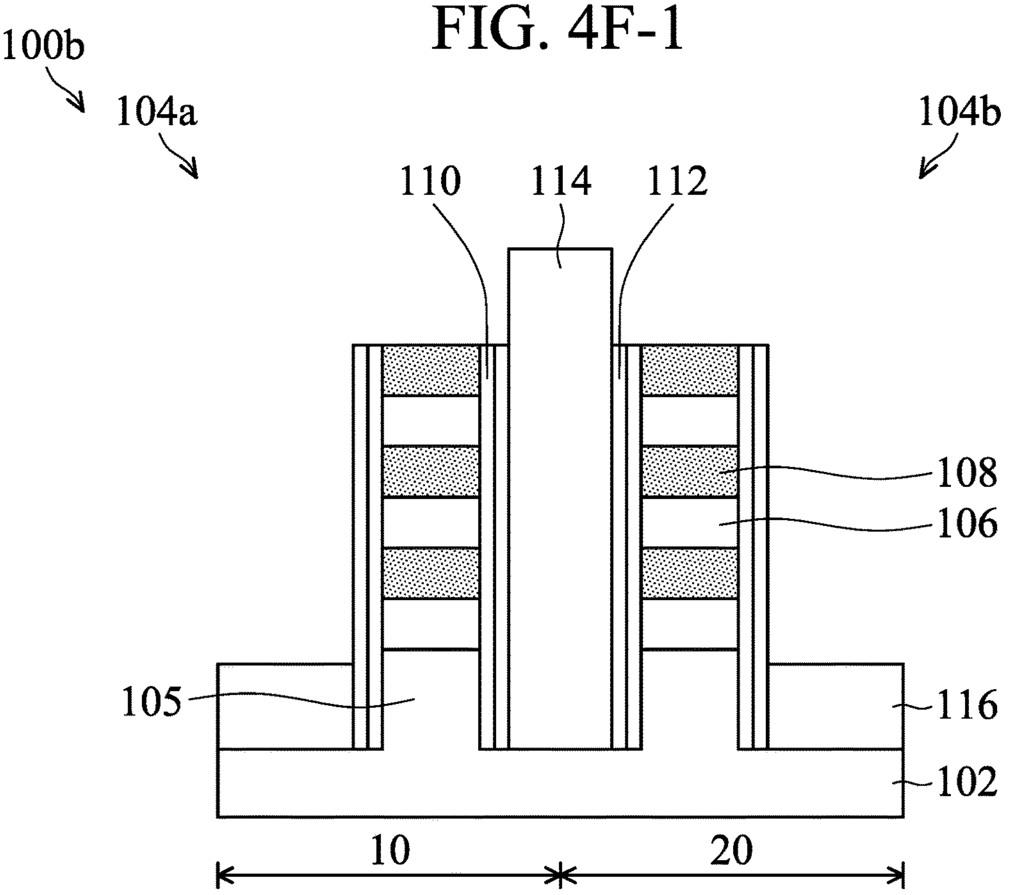
Figures 1, 4G:
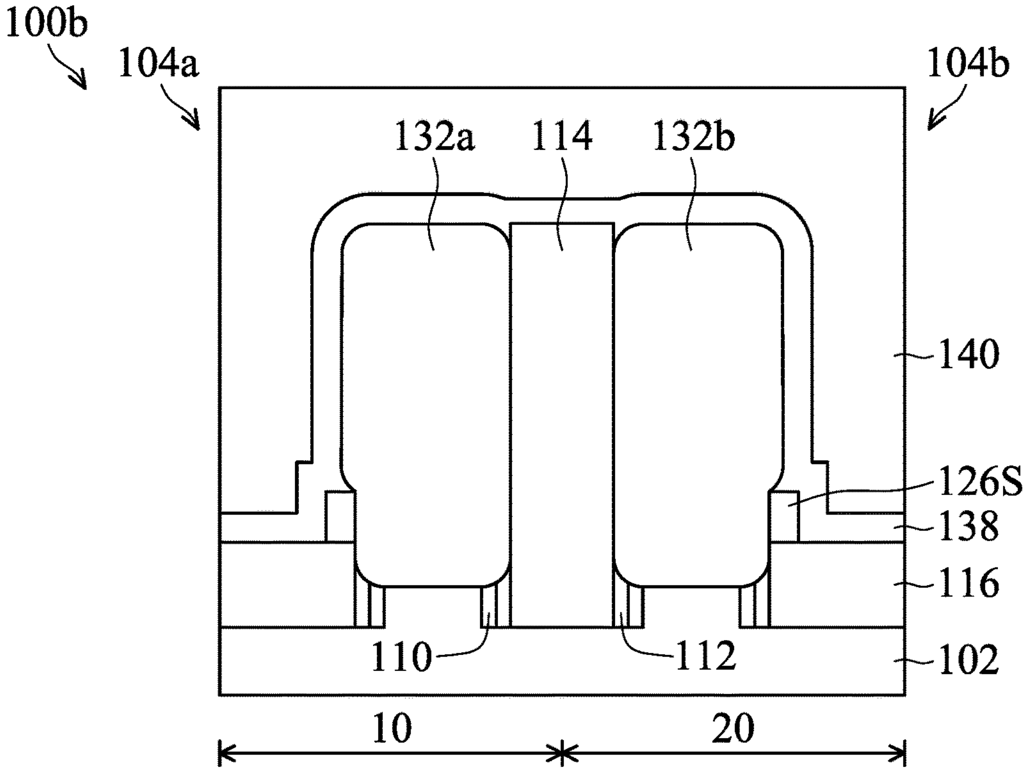
Figures 2, 4G:
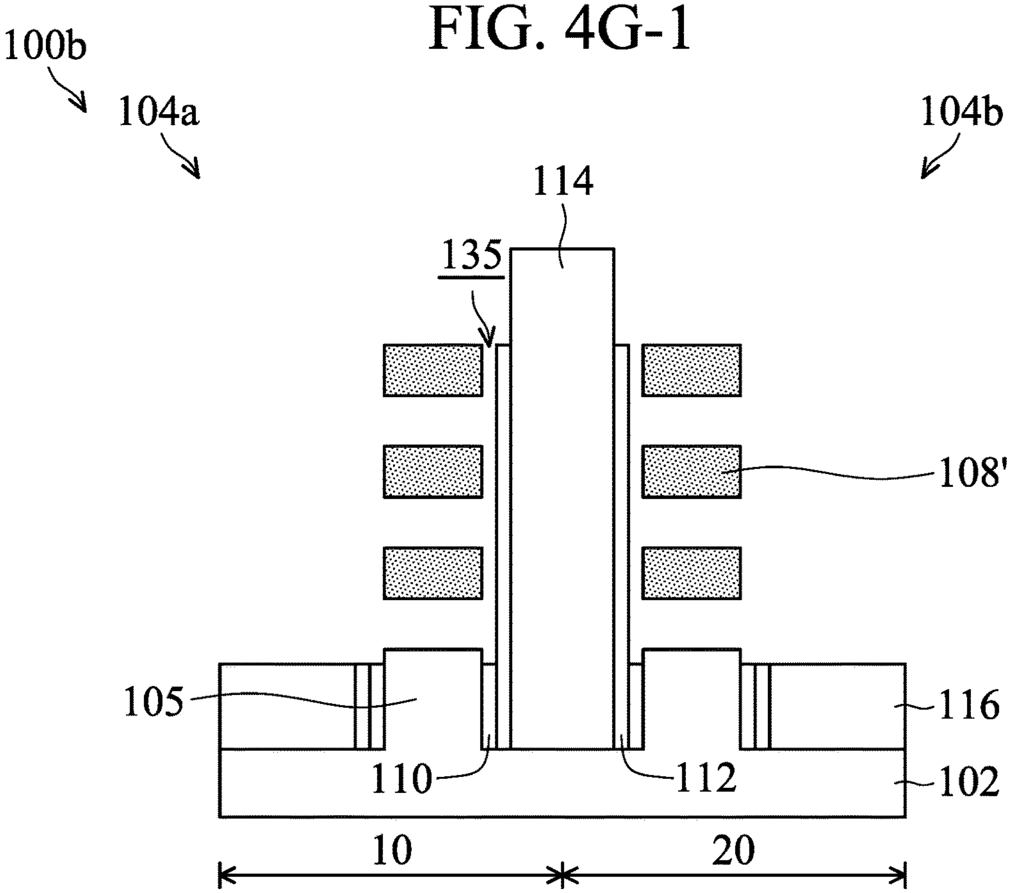
Figures 1, 4H:
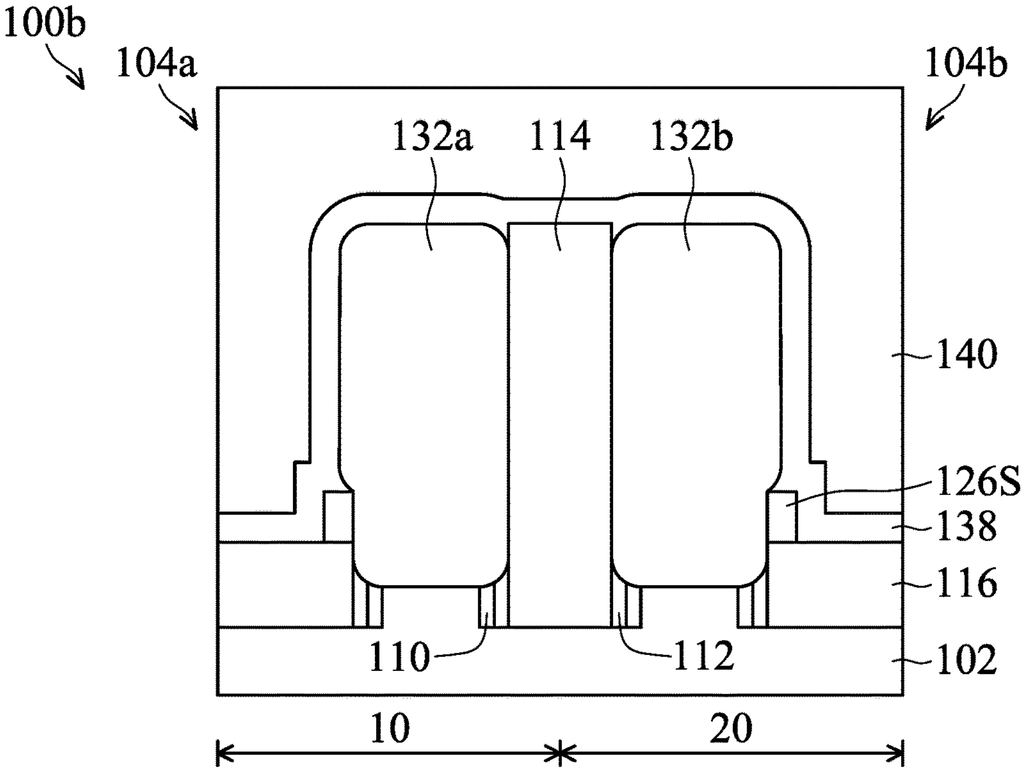
Figures 2, 4H:
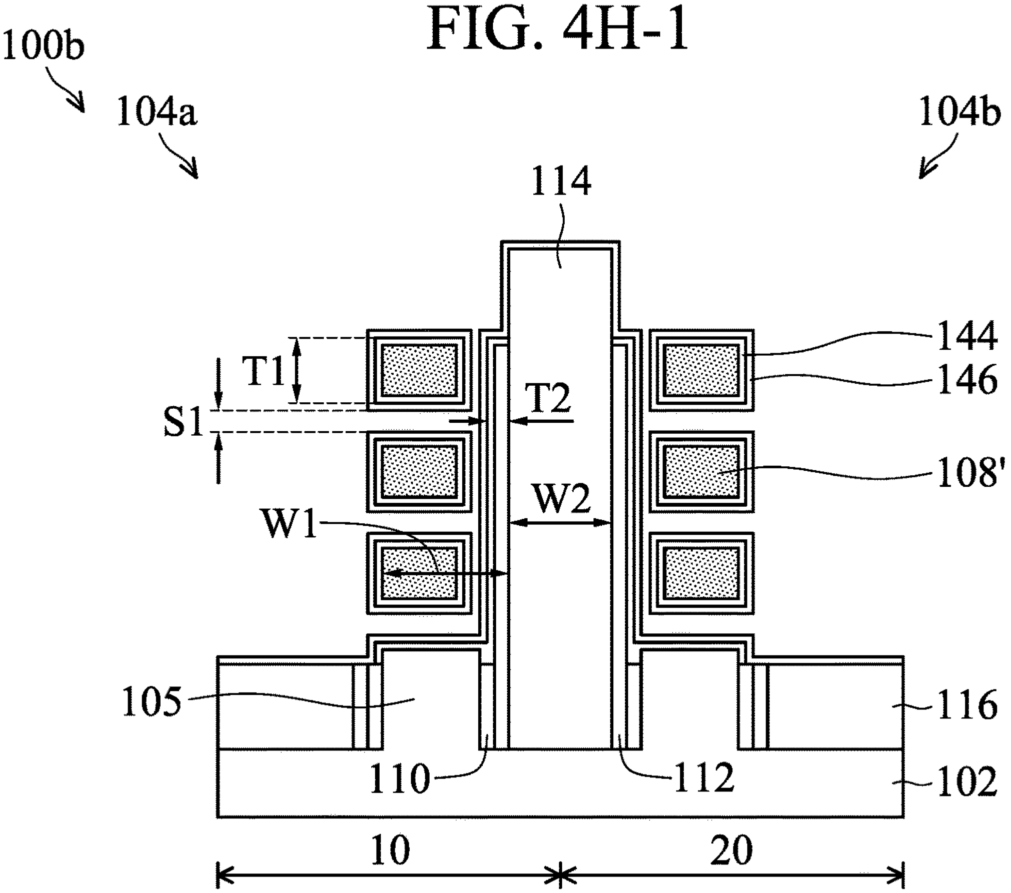
Figures 1, 4I:
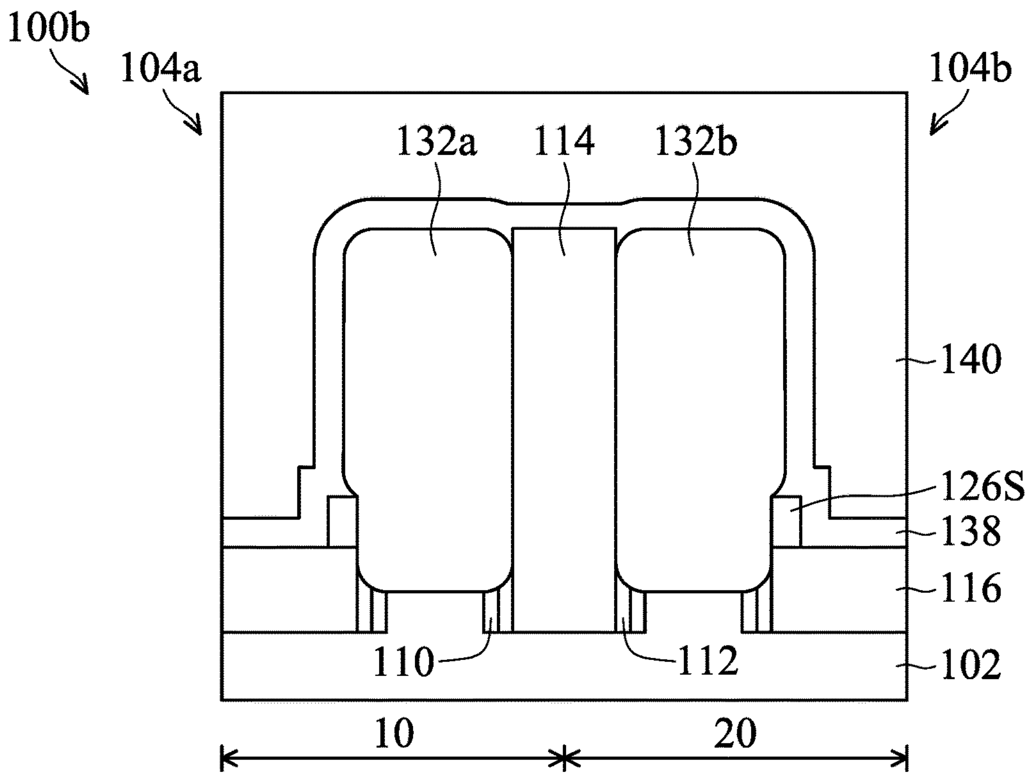
Figures 2, 4I:
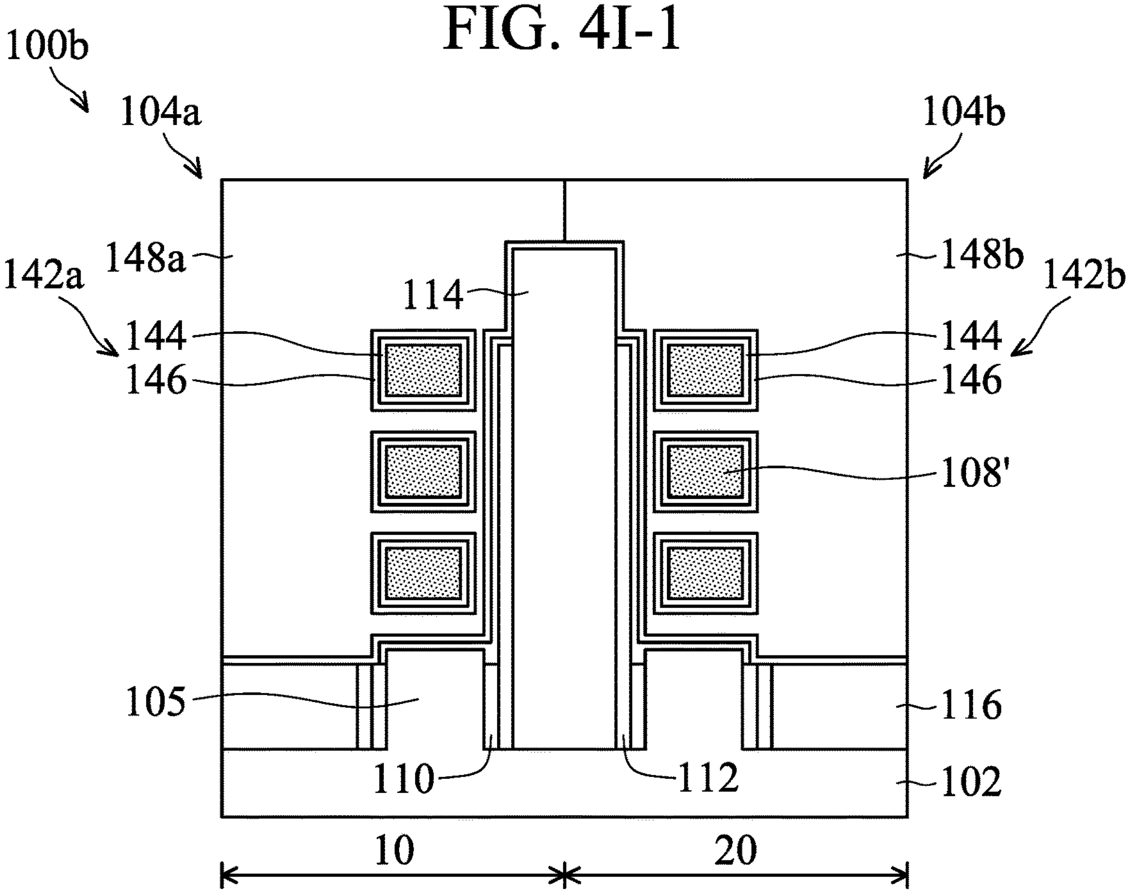
Figures 1, 4J:
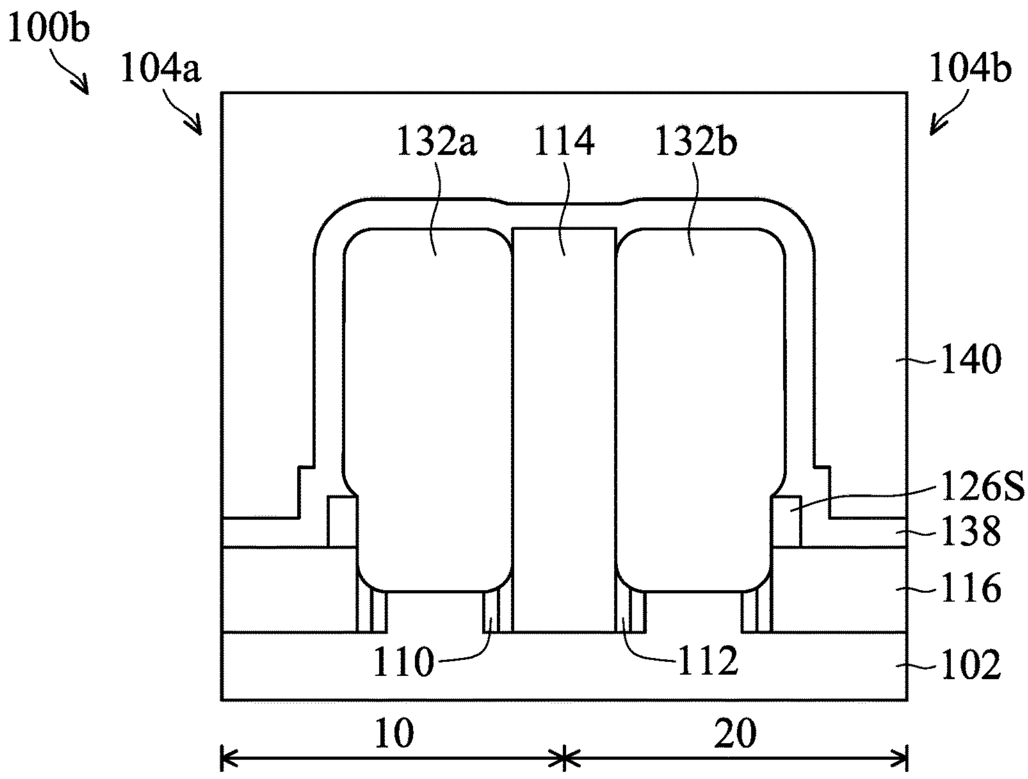
Figures 2, 4J:
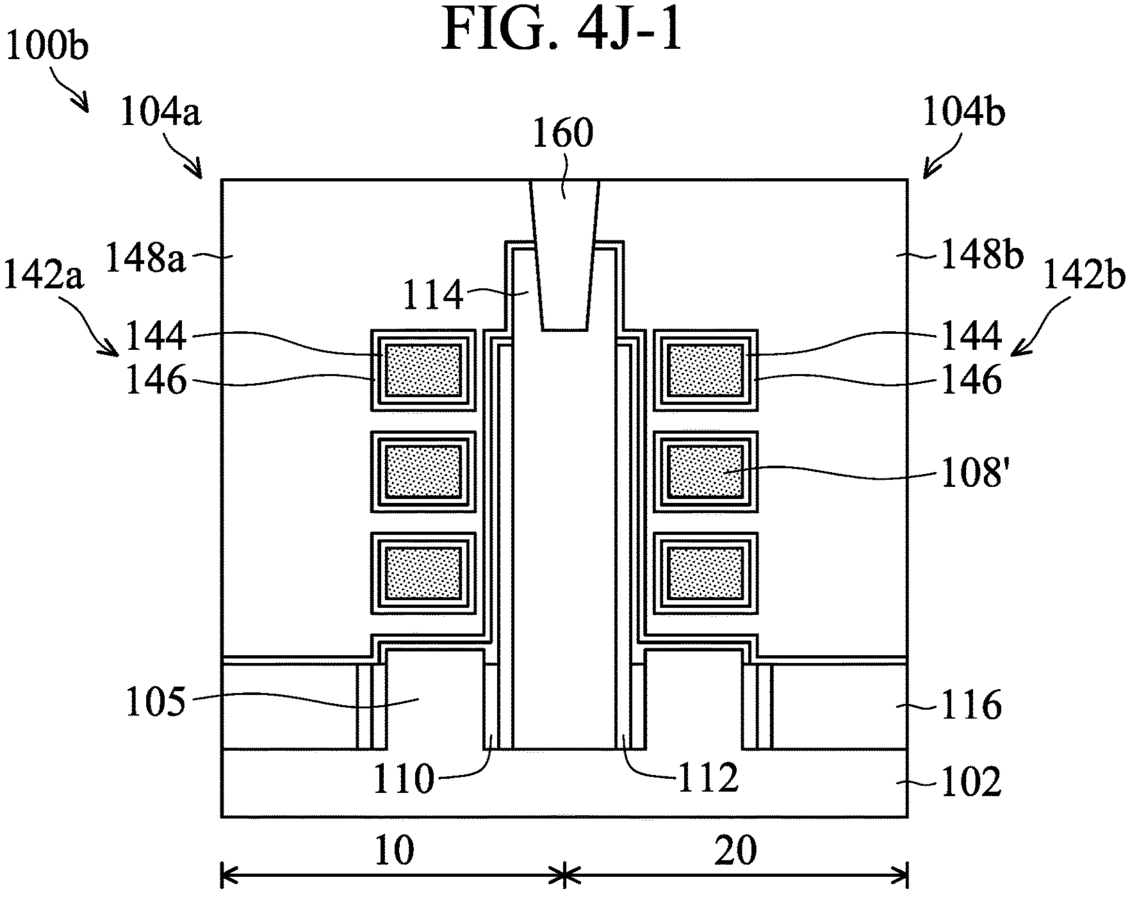
Figures 1, 4K:
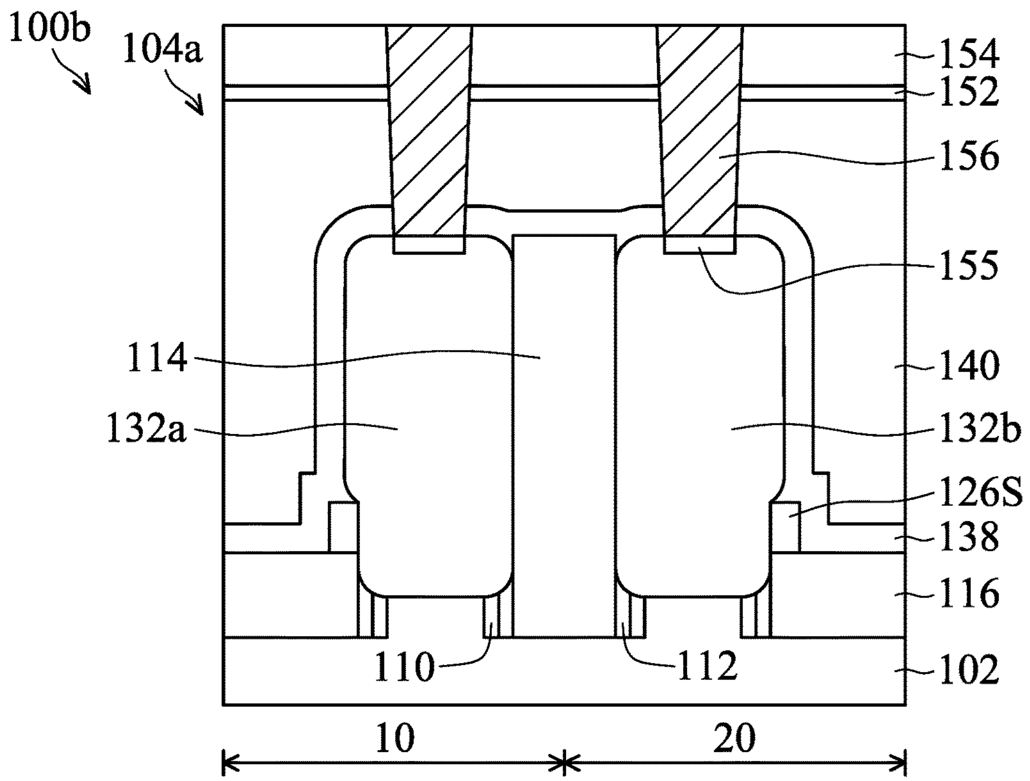
Figures 2, 4K:
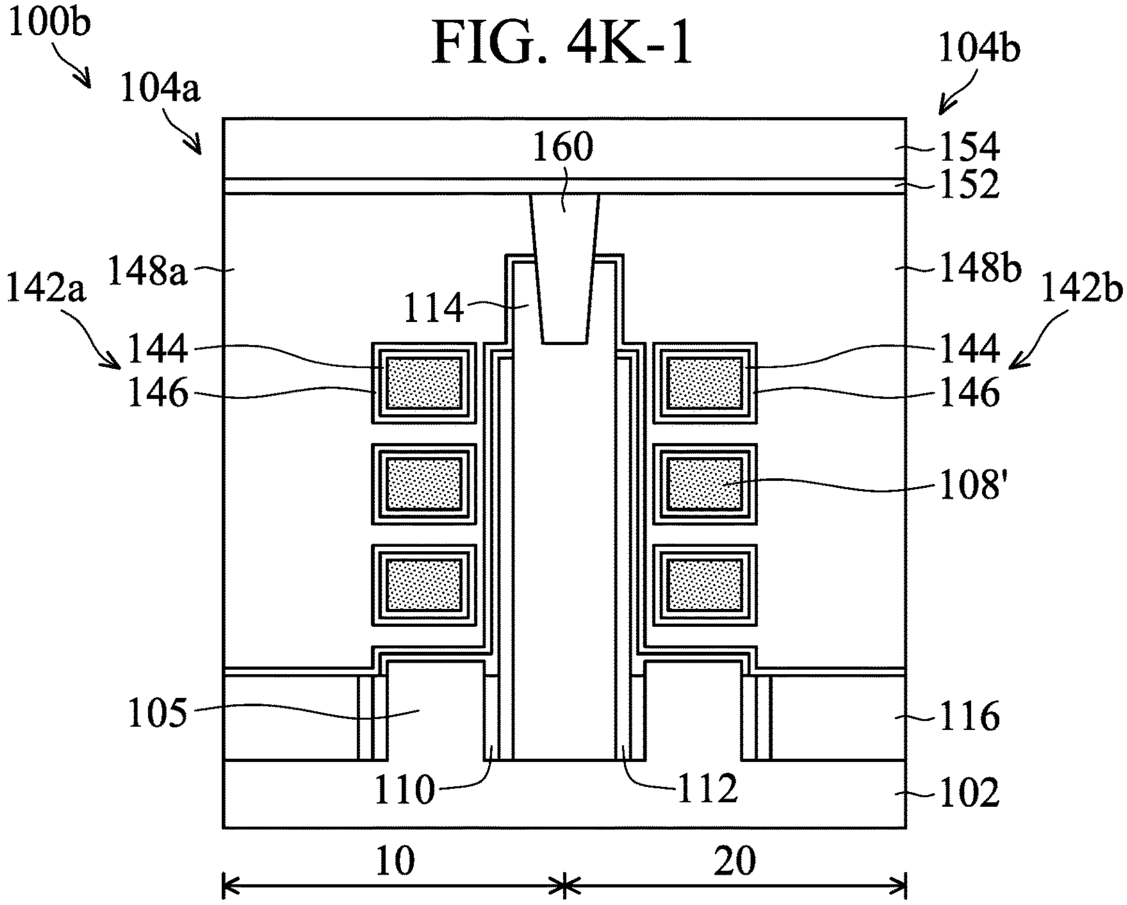
Figure 4K:
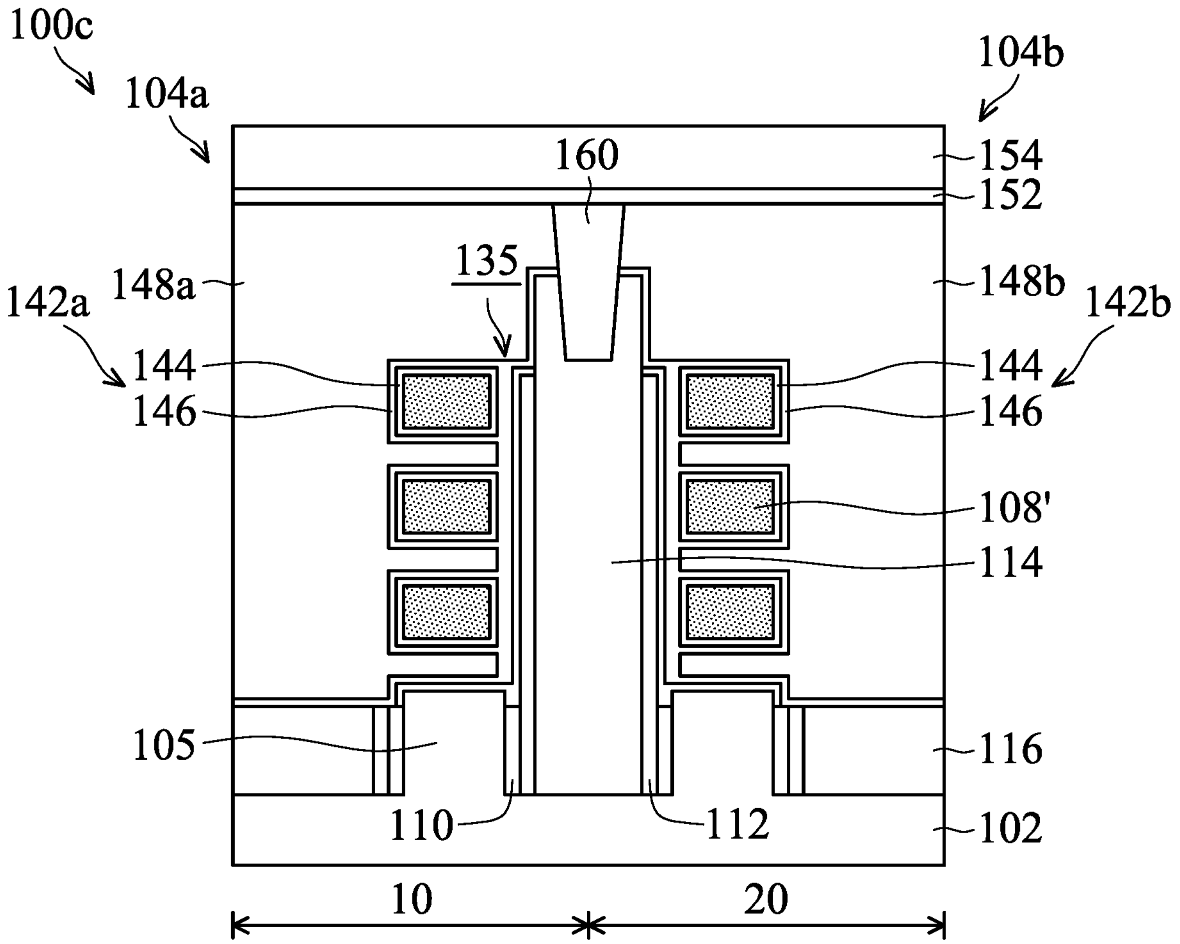

FIGS. 4A-1 to 4K-1 show cross-sectional representations of various stages of manufacturing the semiconductor structure 100*b* shown along line A-A' in FIG. 3F, in accordance with some embodiments. FIGS. 4A-2 to 4K-2 show cross-sectional representations of various stages of manufacturing the semiconductor structure 100*b* shown along line B-B' in FIG. 3F, in accordance with some embodiments. More specifically, FIG. 4A-1 shows the cross-sectional representation shown along line A-A' in FIG. 3F, in accordance with some embodiments. FIG. 4A-2 shows the cross-sectional representation shown along line B-B' in FIG. 3F, in accordance with some embodiments. FIG. 4A-1 shows an S/D region and FIG. 4A-2 shows a gate structure region.

As shown in FIGS. 4A-1 and 4A-2, the substrate 102 includes the first region 10 and the second region 20. The first stack structure 104*a* is formed in the first region 10, and the second stack structure 104*b* is formed in the second region 20. The dielectric wall 114 is between the first stack structure 104*a* and the second stack structure 104*b*. The sacrificial layer 110 is in direct contact with the first stack structure 104*a* and the second stack structure 104*b*, and the vertical layer 112 is in direct contact with the dielectric wall 114. The dummy gate structure 118 is formed across the first stack structure 104*a* and the second stack structure 104*b* and over the dielectric wall 114. The dummy gate structure 118 includes the dummy gate dielectric layer 120 and the dummy gate electrode layer 122.

Next, as shown in FIGS. 4B-1 and 4B-2, the spacer layer 126 is formed along and covering opposite sidewalls of the dummy gate structure 118 and are formed along and covering opposite sidewalls of the source/drain (S/D) regions of the first stack structure 104*a* and the second stack structure

104*b* and the dielectric wall 114, in accordance with some embodiments. The spacer layer 126 may be configured to constrain a lateral growth of subsequently formed source/drain (S/D) structure (formed later) and support the first stack structure 104*a* and the second stack structure 104*b*.

Afterwards, as shown in FIGS. 2C-1 and 2C-2, a portion of the spacer layer 126 is removed to form a shortened spacer layer 126S, and then portions of the first stack structure 104*a* and the second stack structure 104*b* are removed, in accordance with some embodiments. In addition, a portion of the sacrificial layer 110 and a portion of the vertical layer 112 are removed to form the first S/D recess 127*a* and the second S/D recess 127*b*. The top surfaces of the substrate of the substrate 102 are exposed by the first S/D recess 127*a* and the second S/D recess 127*b*.

Some portions of the first stack structure 104*a* and the second stack structure 104*b* are recessed to form curved top surfaces. The curved top surfaces of the first stack structure 104*a* and the second stack structure 104*b* are lower than the top surface of the isolation structure 116, and lower than the top surface of the shortened spacer layer 126S. In some embodiments, the first stack structure 104*a* and the second stack structure 104*b* are recessed by performing an etching process. The etching process may be an anisotropic etching process, such as dry plasma etching, and the dummy gate structure 118 and the shortened spacer layer 126S are used as etching masks during the etching process.

When the top portion of the spacer layer 126 is removed to form the shortened spacer layer 126S, the top portion of the dielectric wall 114 is simultaneously removed. In addition, a portion of the isolation structure 116 is also removed.

Next, as shown in FIGS. 4D-1 and 4D-2, the first S/D structure 132*a* is formed in the first S/D recess 127*a* in the first region 10, and the second S/D structure 132*b* is formed in the second S/D recess 127*b* in the second region 20, in accordance with some embodiments.

Afterwards, as shown in FIGS. 4E-1 and 4E-2, after the first S/D structure 132*a* and second S/D structures 132*b* are formed, the contact etch stop layer (CESL) 138 is conformally formed to cover the S/D structures 136 and the interlayer dielectric (ILD) layer 140 is formed over the CESL 138, in accordance with some embodiments. The CESL 138 is in direct contact with the top surface of the dielectric wall 114.

Next, as shown in FIGS. 4F-1 and 4F-2, the dummy gate structure 118 is removed to expose the first stack structure 104*a*, the second stack structure 104*b* and the dielectric wall 114, in accordance with some embodiments. In addition, the top surface of the sacrificial layer 110 and the top surface of the vertical layer 112 are exposed.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Afterwards, as shown in FIGS. 4G-1 and 4G-2, the first semiconductor material layers 106 are removed to form nanostructures 108' with the second semiconductor material layers 108, and a portion of the sacrificial layer 110 is removed to form an opening 135, in accordance with some embodiments. In addition, the nanostructures 108' is above the fin structure 105. The bottom portion of the sacrificial layer 110 is remaining, and the remaining sacrificial layer 110 is between and in direct contact with the vertical layer 112 and the fin structure 105.

The vertical layer 112 is also called as vertical channel layer or vertical nanostructure. The vertical layer 112 is connected to the dielectric wall 114. The nanostructure 108' is also called as horizontal channel layer or horizontal nanostructure. The vertical layer (or vertical nanostructure) 112 is separated from the horizontal nanostructures 108'. The vertical layer (or vertical nanostructure) 112 extends from a position which is below the top surface of the fin structure 105. The vertical layer (or vertical nanostructure) 112 extends from a position which is below the top surface of the isolation structure 116. In some embodiments, the vertical layer (or vertical nanostructure) 112 and the nanostructure (or the horizontal nanostructure) 108' are made of different materials.

Next, as shown in FIGS. 411-1 and 411-2, after the nanostructures 108' are formed, the interfacial layer 144 is formed to surround the nanostructures 108' and over the isolation structure 116, and the gate dielectric layer 146 is formed on the interfacial layer 144, in accordance with some embodiments. The interfacial layer 144 is in direct contact with the vertical layer 112. It should be noted that the opening 135 is not completely filled with the interfacial layers 144 and the gate dielectric layers 146.

In some embodiments, the interfacial layer 144 is oxide layer formed around the nanostructures 108'. In some embodiments, the interfacial layer 144 is formed by performing a thermal process. In some embodiments, the gate dielectric layers 146 are formed over the interfacial layers 144, so that the nanostructures 108' are surrounded (e.g. wrapped) by the interfacial layers 144 and gate dielectric layers 146. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

The nanostructure 108' has a first thickness $T_1$, and the vertical layer 112 has a second thickness $T_2$. In some embodiments, there is a ration ($T_1/T_2$) of first thickness $T_1$ to the second thickness $T_2$ in a range from about 1 to 5. There is a horizontal channel width $W_1$ which is measured from the outer sidewall of the nanostructure 108' to the outer sidewall of the dielectric wall 114. The horizontal channel width $W_1$ can be different for the NMOS channel and PMOS channel. In some embodiments, there is a ratio of the horizontal channel width $W_1$ in NMOS to the horizontal channel width $W_1$ in the PMOS in a range from about 0.4 to about 2.5. The dielectric wall 114 has a width $W_2$. In some embodiments, the horizontal channel width $W_1$ is in a range from about 6 nm to about 100 nm. In some embodiments, there is a ration ($W_2/W_1$) of width $W_2$ to the horizontal channel width $W_1$ is in a range from about 0.2 to 3. There is a space $S_1$ between every two adjacent nanostructures 108'. In some embodiments, the space $S_1$ is in a range from about 6 nm to about 20 nm.

Next, as shown in FIGS. 4I-1 and 4I-2, the first gate electrode layer 148*a* is formed in the first region 10, and the second gate electrode layer 148*b* is formed in the second region 20 to surround the nanostructures 108', in accordance with some embodiments. The first gate structure 142*a* is constructed by the interfacial layer 144, the gate dielectric layer 146, and the first gate electrode layer 148*a*. The second gate structure 142*b* is constructed by the interfacial layer 144, the gate dielectric layer 146, and the second gate electrode layer 148*b*.

It should be noted that the vertical layer (or vertical nanostructure) 112 is separated from the horizontal nanostructures 108' by the first gate structure 142*a* or the second gate structure 142*b*. More specifically, the vertical layer (or vertical nanostructure) 112 is separated from the horizontal nanostructures 108' by the interfacial layer 144, the gate dielectric layer 146, the first gate electrode layer 148*a* and the second gate electrode layer 148*b*.

Afterwards, as shown in FIGS. 4J-1 and 4J-2, the cap structure 160 is formed over the dielectric wall 114, in accordance with some embodiments. The cap structure 160 is used to separate the first gate structure 142*a* from the second gate structure 142*b*. The first gate structure 142*a* and the second gate structure 142*b* are separated by the cap structure 160 and the dielectric wall 114.

In some embodiments, the cap structure 160 is made of oxide, such as $SiO_2$, SiOCN, SiON, or the like. In some embodiments, the cap structure 160 is made of a high k dielectric material, such as $HfO_2$, $ZrO_2$, HfAlOx, $HfSiO_x$, $Al_2O_3$, or the like. In some embodiments, the cap structure 160 is formed by performing ALD, CVD, PVD, other suitable process, or combinations thereof.

Next, as shown in FIGS. 4K-1 and 4K-2, the etching stop layer 152 is formed over the ILD layer 140 and the first gate structure 142*a* and the second gate structure 142*b*, in accordance with some embodiments. Next, the ILD layer 154 is formed over the etching stop layer 152. Afterwards, a portion of the ILD layer 154, a portion of the etching stop layer 152 and a portion of the first S/D structure 152*a*, and a portion of the second S/D structure 152*b* are removed to form a trench (not shown). The top surfaces of the first S/D structure 152*a* and the top surface of the second S/D structure 152*b* are exposed by the trench. Next, the silicide layer 155 and the S/D contact structure 156 are formed over the first S/D structure 132*a* and the second S/D structure 132*b*.

FIG. 4K'-2 shows a cross-sectional view of a semiconductor structure 100*c*, in accordance with some embodiments. The semiconductor structure 100*c* of FIG. 4K'-2 includes elements that are similar to, or the same as, elements of the semiconductor structure 100*b* of FIG. 4K-2. The difference between the FIG. 4K'-2 and FIG. 4K-2 is that the space between the nanostructures 108' and the vertical layer (or vertical nanostructure) 112 is filled with a portion of the first gate structure 142*a* and a portion of the second gate structure 142*b*. More specifically, the vertical layer (or vertical nanostructure) 112 is separated from the horizontal nanostructures 108' by the interfacial layer 144 and the gate dielectric layer 146. It should be noted that the opening 135 is completely filled with the interfacial layers 144 and the gate dielectric layers 146.

Figure 5A:
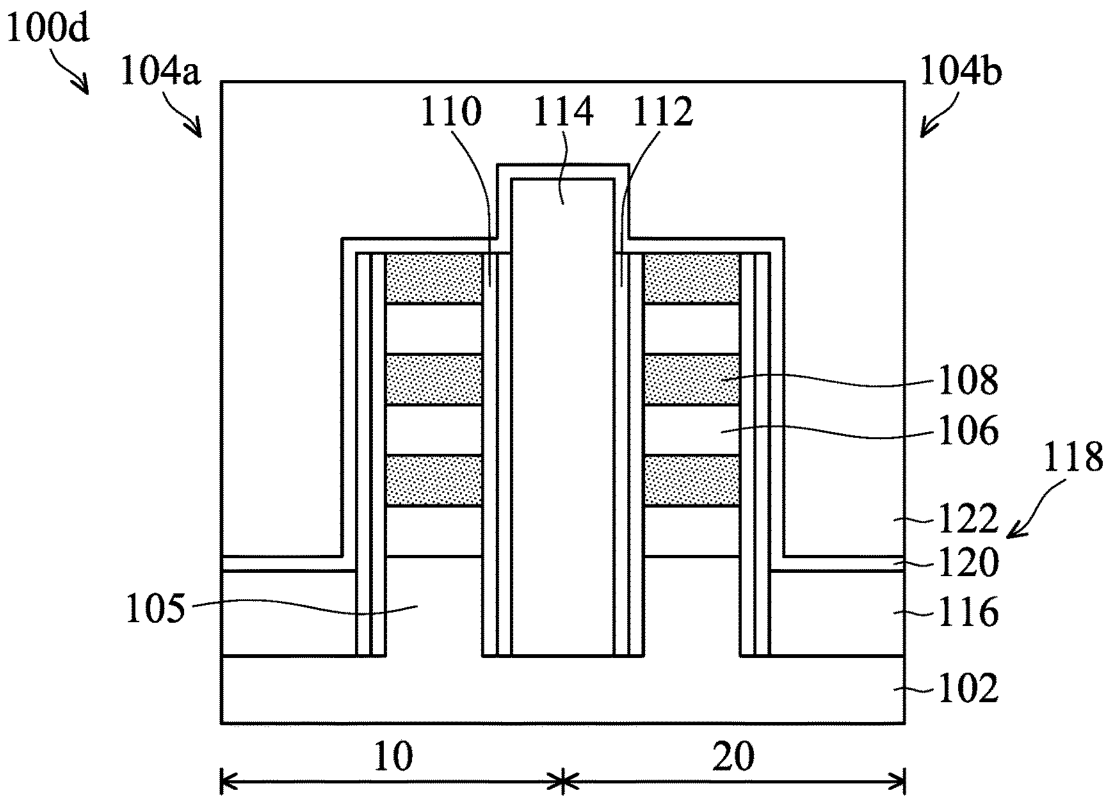
FIGS. 5A to 5E show cross-sectional representations of various stages of manufacturing a semiconductor structure shown along line B-B' in FIG. 3F, in accordance with some embodiments.

FIGS. 5A to 5E show cross-sectional representations of various stages of manufacturing a semiconductor structure 100*d* shown along line B-B' in FIG. 3F, in accordance with some embodiments. More specifically, FIG. 5A shows the cross-sectional representation shown along line B-B' in FIG. 3F, in accordance with some embodiments. FIG. 5A shows a gate structure region. The semiconductor structure 100*d* of FIG. 5A-5E includes elements that are similar to, or the same as, elements of the semiconductor structure 100*a* of FIGS. 1A-1F, 2A-1 to 2N-1, and 2A-2 to 2N-2.

As shown in FIG. 5A, the dummy gate structure 118 is formed across the first stack structure 104*a* and the second stack structure 104*b* and extends over the isolation structure 116, in accordance with some embodiments. The dummy gate structures 118 may be used to define the source/drain (S/D) regions and the channel regions of the resulting semiconductor structure 100*a*. In some embodiments, the dummy gate structures 118 include the dummy gate dielectric layer 120 and the dummy gate electrode layer 122.

Figure 5B:
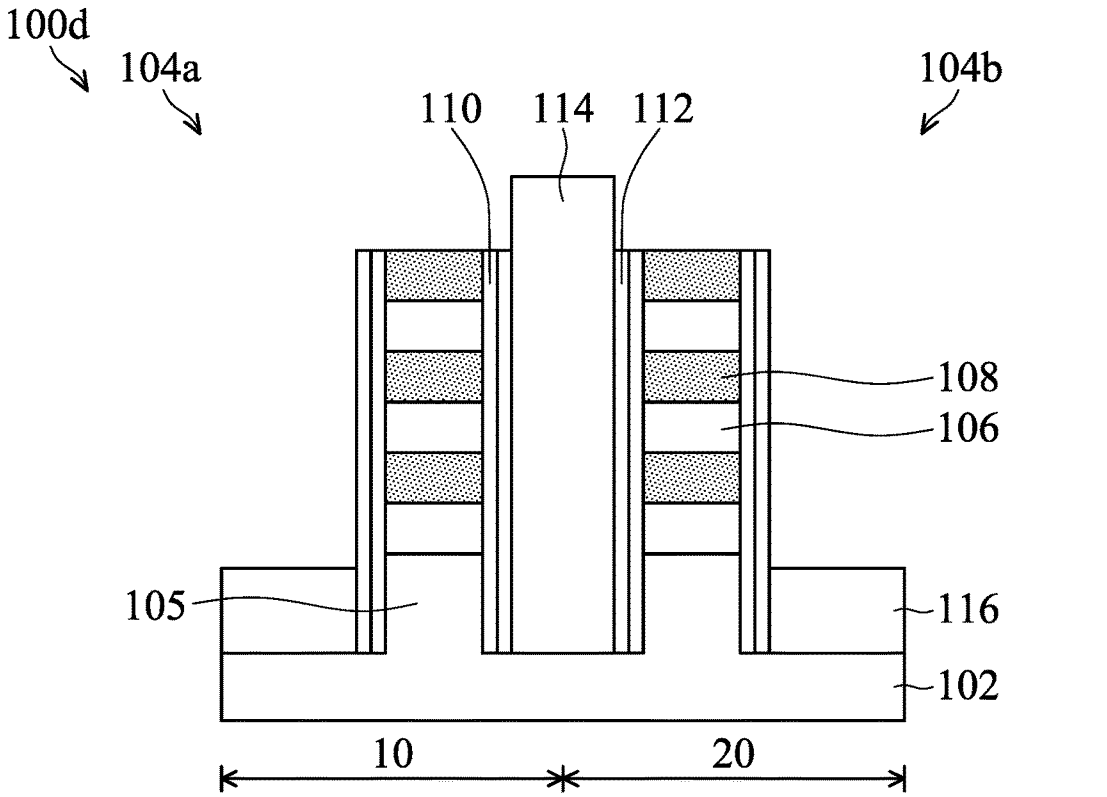

Next, as shown in FIG. 5B, the dummy gate structure 118 is removed to expose the first stack structure 104, the second stack structure 104*b* and the dielectric wall 114, in accordance with some embodiments. In addition, the top surface of the sacrificial layer 110 and the top surface of the vertical layer 112 are exposed.

Figure 5C:
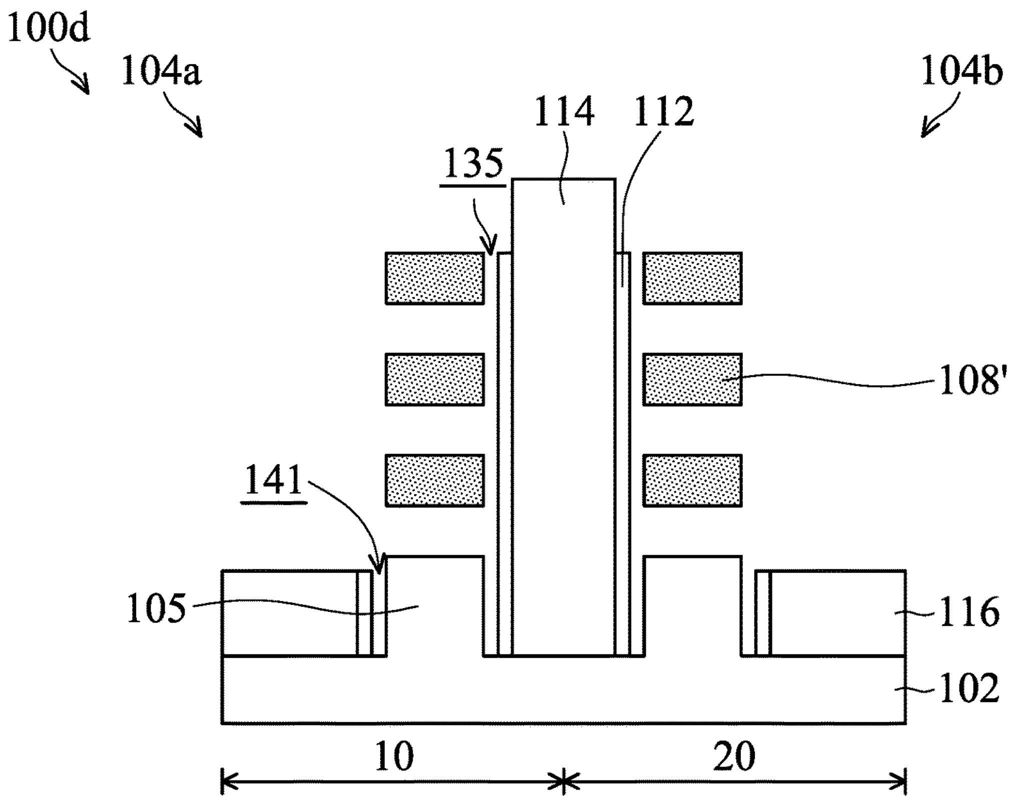

Afterwards, as show in FIG. 5C, the first semiconductor material layers 106 are removed to form nanostructures 108' with the second semiconductor material layers 108, and the sacrificial layer 110 is removed to form the opening 135 and a recess 141, in accordance with some embodiments. It should be noted that the recess 141 is below the top surface of the isolation structure 116.

The vertical layer 112 is also called as vertical channel layer or vertical nanostructure. The vertical layer 112 is connected to the dielectric wall 114. The nanostructure 108' is also called as horizontal channel layer or horizontal nanostructure. The vertical layer (or vertical nanostructure) 112 is separated from the horizontal nanostructures 108'.

Figure 5D:
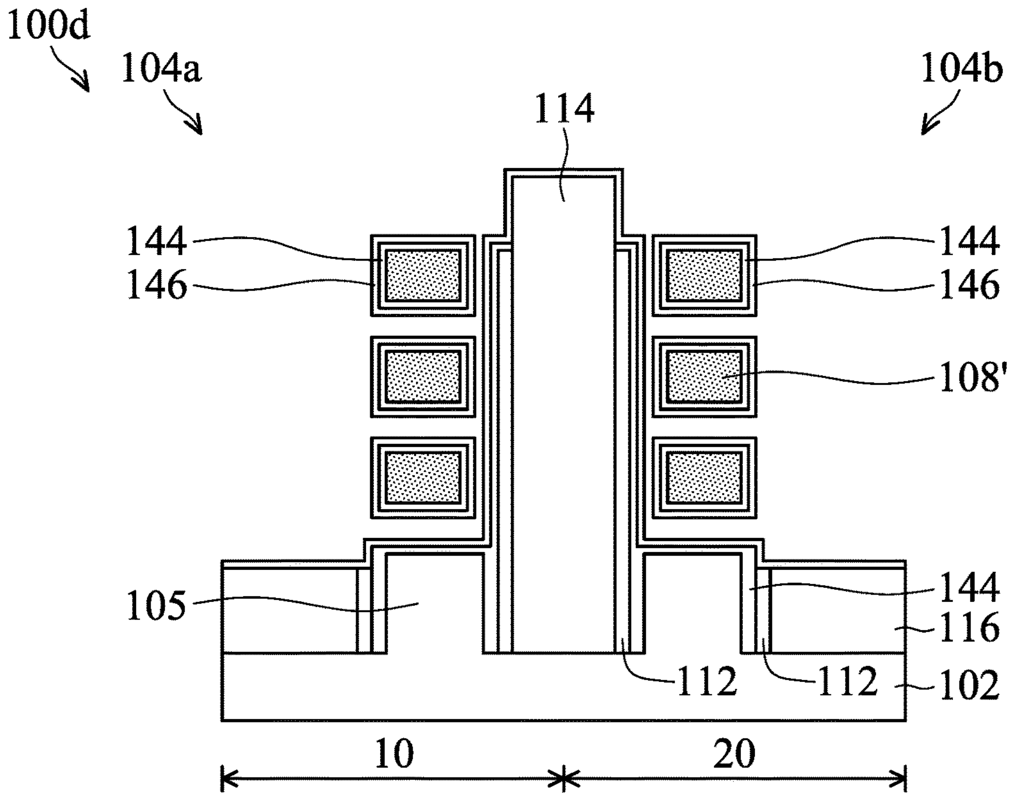

Next, as shown in FIG. 5D, the interfacial layer 144 is filled into the opening 135 and the recess 141, and the gate dielectric layer 146 is formed over the interfacial layer 144, in accordance with some embodiments. Therefore, a portion of the interfacial layer 144 is lower than the top surface of the isolation structure 116.

Figure 5E:
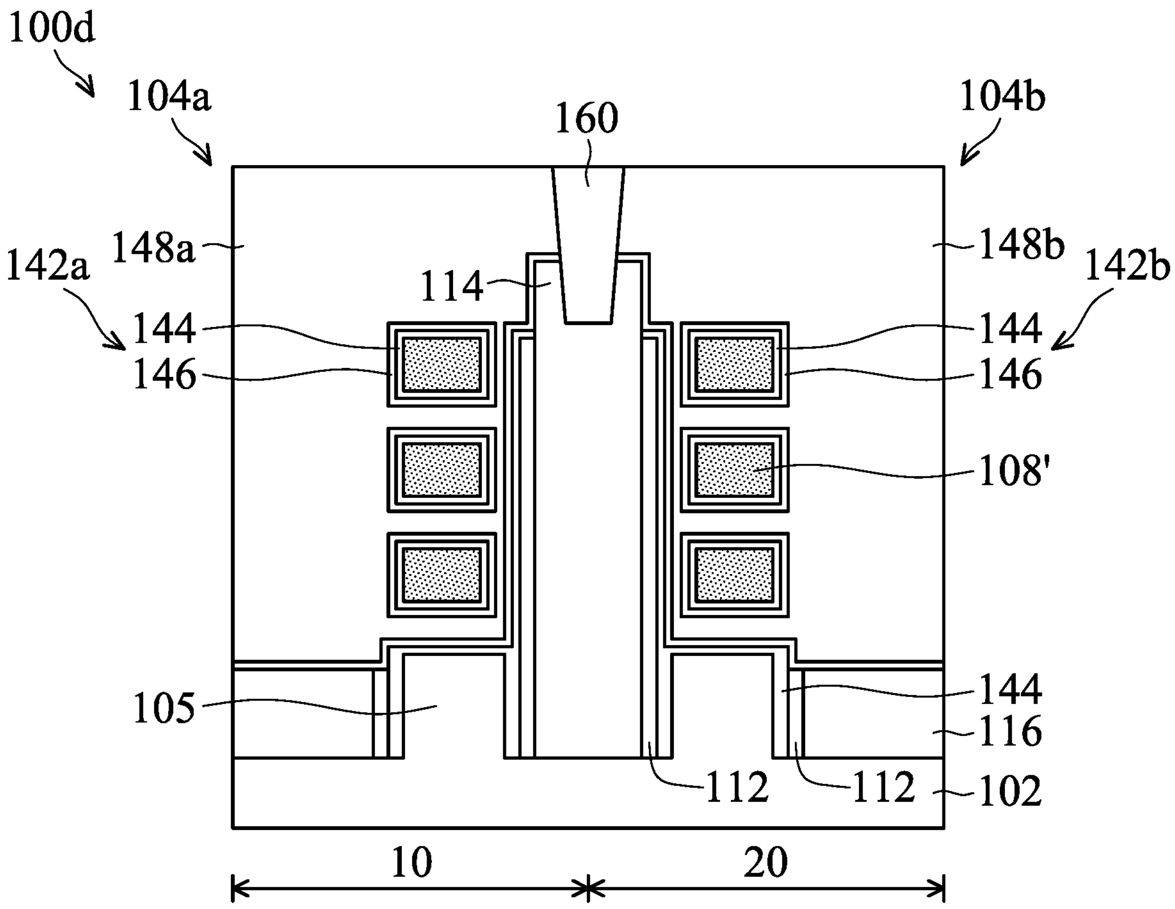

Afterwards, as show in FIG. 5E, the first gate structure 142*a* is formed in the first region 10, and the second gate structure 142*b* is formed in the second region 20, in accordance with some embodiments. Next, the cap structure 160 is formed over the dielectric wall 114. It should be noted that a portion of the first gate structure 142*a* is lower than the top surface of the isolation structure 116.

Figure 6A:
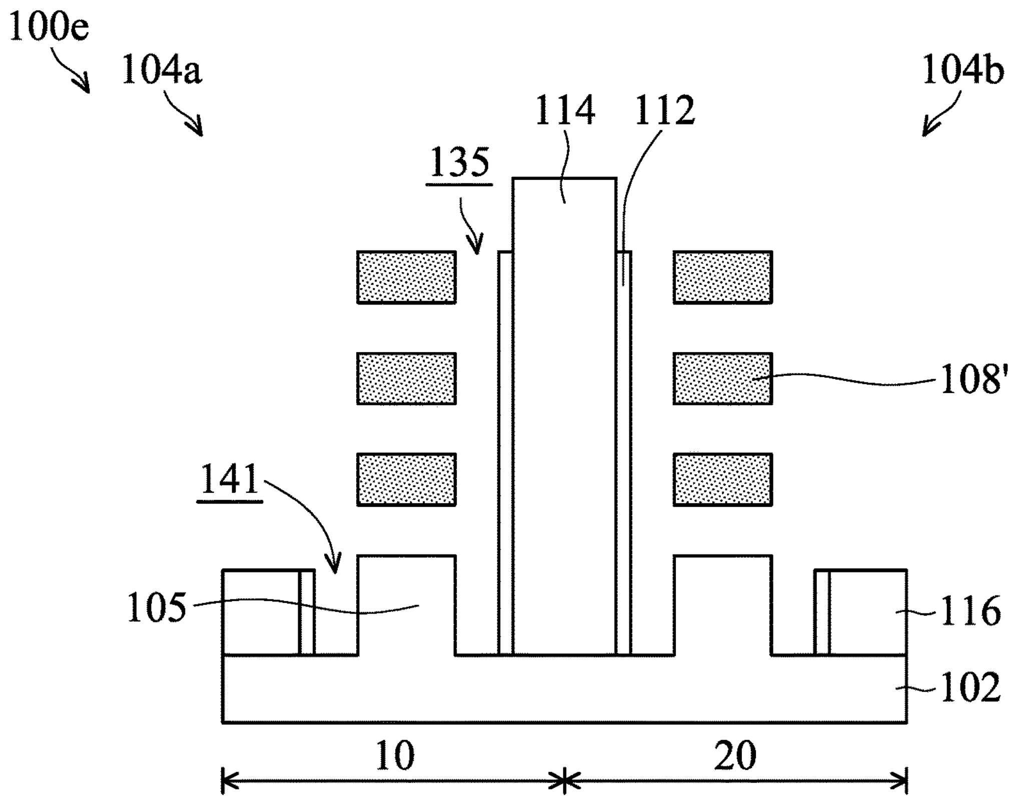
FIGS. 6A to 6B show cross-sectional representations of various stages of manufacturing a semiconductor structure, in accordance with some embodiments.
Figure 6B:
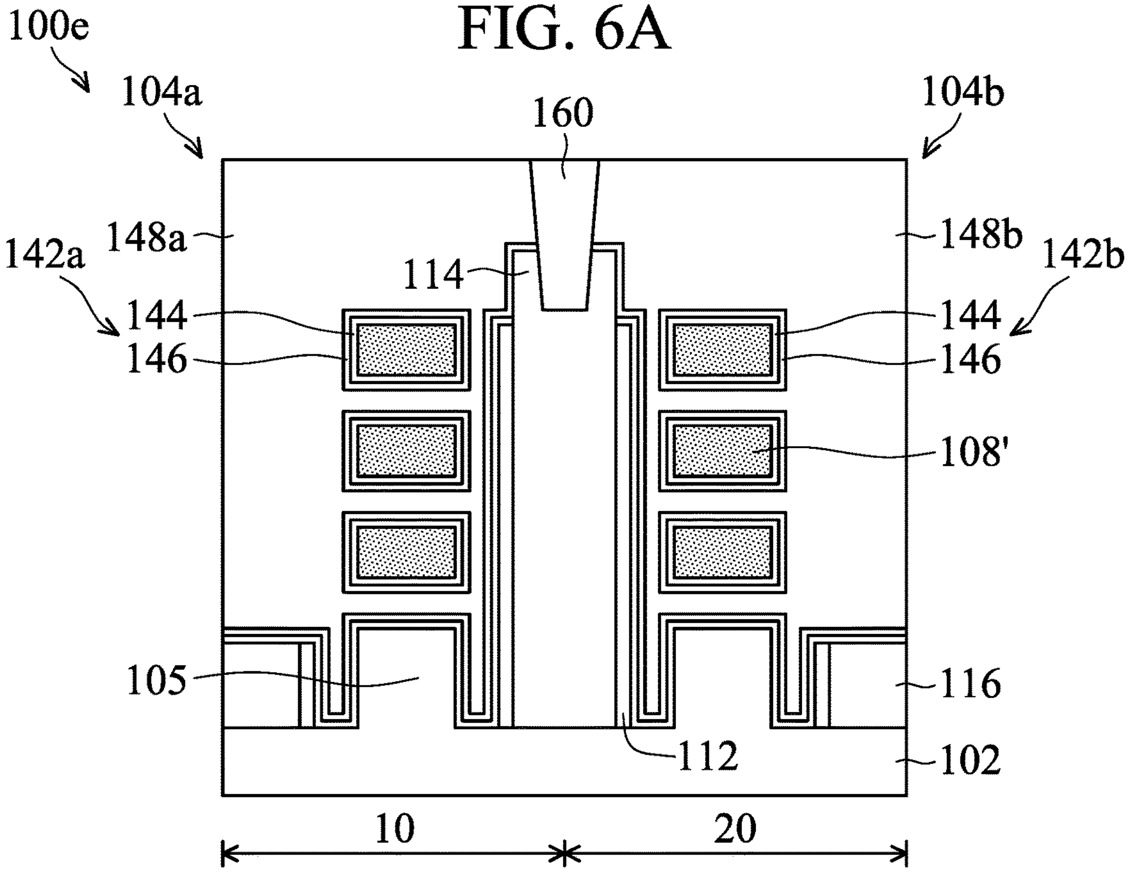

FIGS. 6A to 6B show cross-sectional representations of various stages of manufacturing a semiconductor structure 100*e*, in accordance with some embodiments. The semiconductor structure 100*e* of FIG. 6A-6B includes elements that are similar to, or the same as, elements of the semiconductor structure 100*d* of FIGS. 5A-5E.

As shown in FIG. 6A, the first semiconductor material layers 106 are removed to form nanostructures 108' with the second semiconductor material layers 108, and all of the sacrificial layer 110 is removed to form the opening 135 and the recess 141, in accordance with some embodiments. In addition, the nanostructures 108' is above the fin structure 105.

Afterwards, as shown in FIG. 6B, the interfacial layer 144 is filled into the opening 135 and the recess 141, and the gate dielectric layer 146 is formed over the interfacial layer 144, in accordance with some embodiments. Afterwards, the first gate electrode layer 148*a* and the second gate electrode layer 148*b* are filled into the opening 135 and the recess 141. Next, the cap structure 160 is formed over the dielectric wall 114.

It should be noted that the opening 135 and the recess 141 are filled with the interfacial layer 144, the gate dielectric layer 146, the first gate electrode layer 148*a* and the second gate electrode layer 148*b*. Therefore, a portion of the first gate structure 142*a* is lower than the top surface of the isolation structure 116. The portion of the first gate structure 142*a* is lower than the top surface of the fin structure 105.

FIGS. 7A to 7H show cross-sectional representations of various stages of manufacturing a semiconductor structure 100*f*, in accordance with some embodiments. The semiconductor structure 100*f* of FIG. 7A-7H includes elements that are similar to, or the same as, elements of the semiconductor structure 100*b* of FIGS. 3A-3F, 4A-1 to 4K-1, and 4A-2 to 4-2.

Figure 7A:
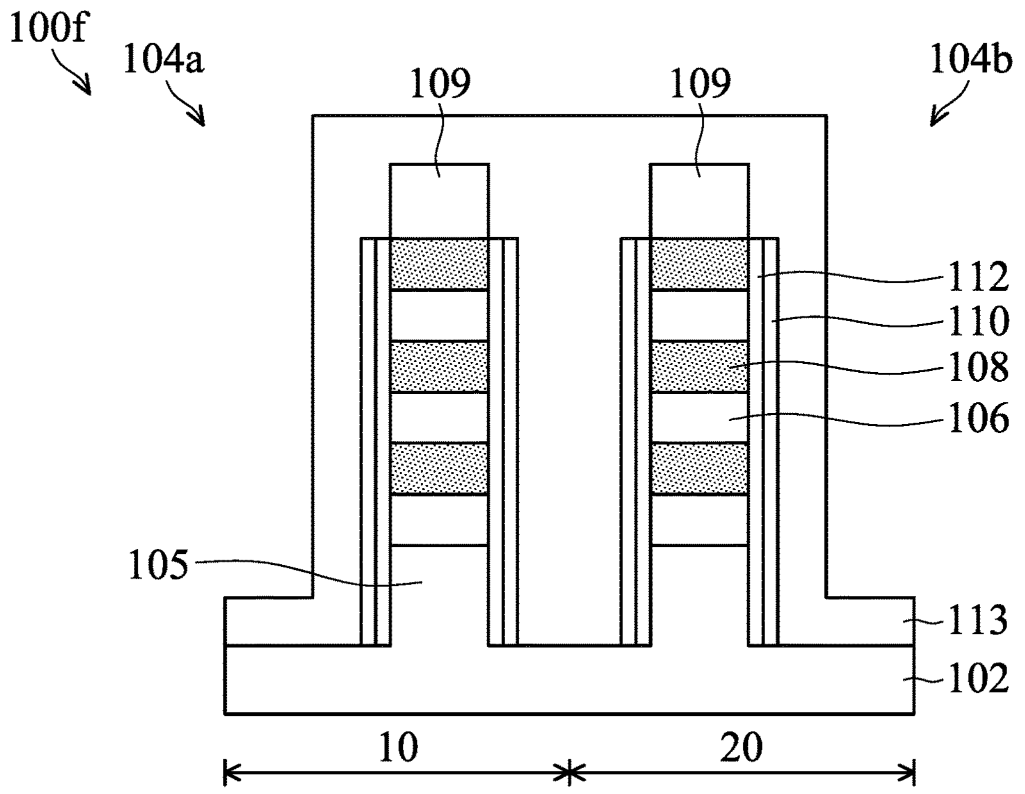
FIGS. 7A to 7H show cross-sectional representations of various stages of manufacturing a semiconductor structure, in accordance with some embodiments.

The semiconductor structure 100*f* in FIG. 7A is similar to, or the same as, elements of the semiconductor structure 100*b* in FIG. 3C. The dielectric layer 113 is formed over the mask structure 109, the first stack structure 104*a*, the second stack structure 104*b*, the sacrificial layer 110 and the vertical layer 112.

Figure 7B:
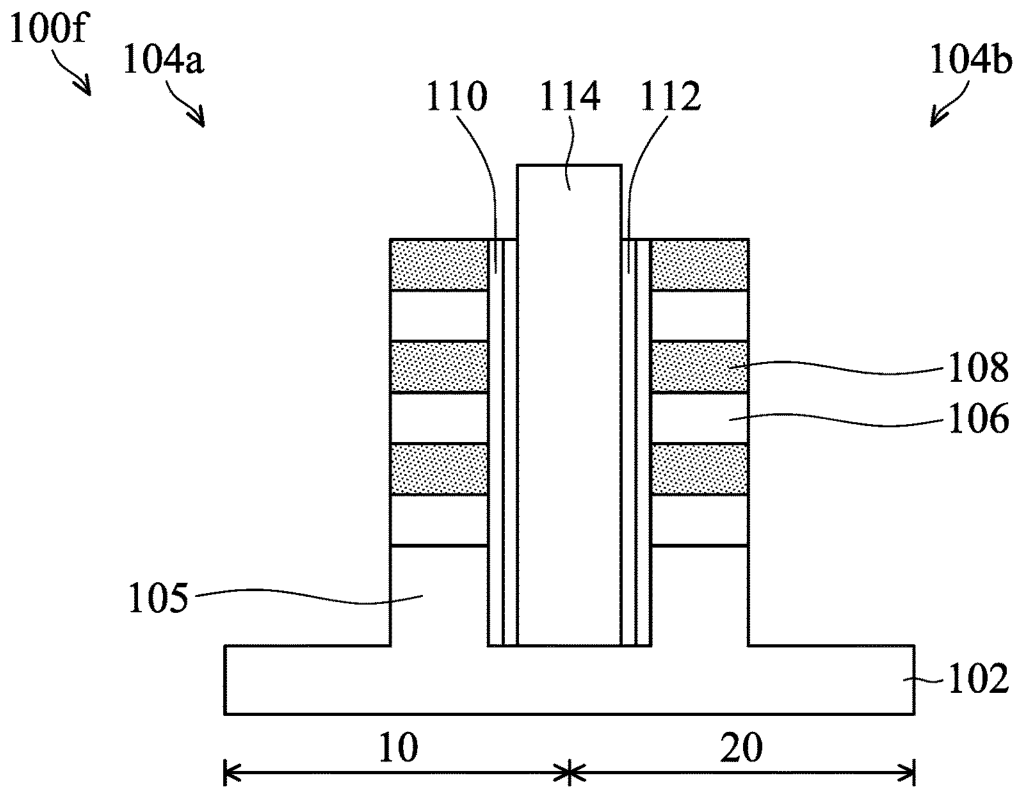

Next, as shown in FIG. 7B, a portion of the dielectric layer 113 is removed to form the dielectric wall 114 between the first stack structure 104*a* and the second stack structure 104*b*, in accordance with some embodiments. In addition, the outer sacrificial layer 110 and the outer vertical layer 112 are removed to expose outer sidewalls of the first stack structure 104*a*, the outer sidewalls of the second stack structure 104*b* the outer sidewalls of the fin structure 105. Afterwards, the mask structure 109 is removed.

The outer sidewalls of the first stack structure 104*a* are far away from the dielectric wall 114 relative to the inner sidewalls of the first stack structure 104*a*. The outer sidewalls of the second stack structure 104*b* are far away from the dielectric wall 114 relative to the inner sidewalls of the second stack structure 104*b*. The outer sidewalls of the fin structure 105 are far away from the dielectric wall 114 relative to the inner sidewalls of the fin structure 105.

Figure 7C:
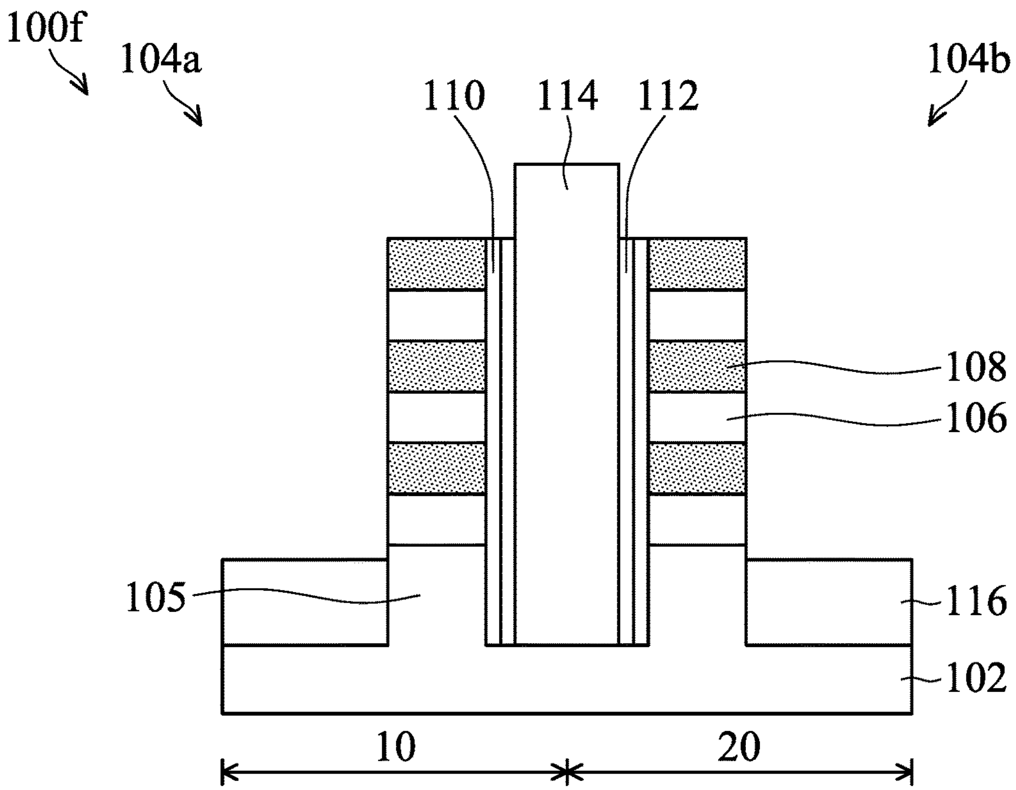

Afterwards, as shown in FIG. 7C, the isolation structure 116 is formed around the first stack structure 104*a* and the second stack structure 104*b*, in accordance with some embodiments.

Figure 7D:
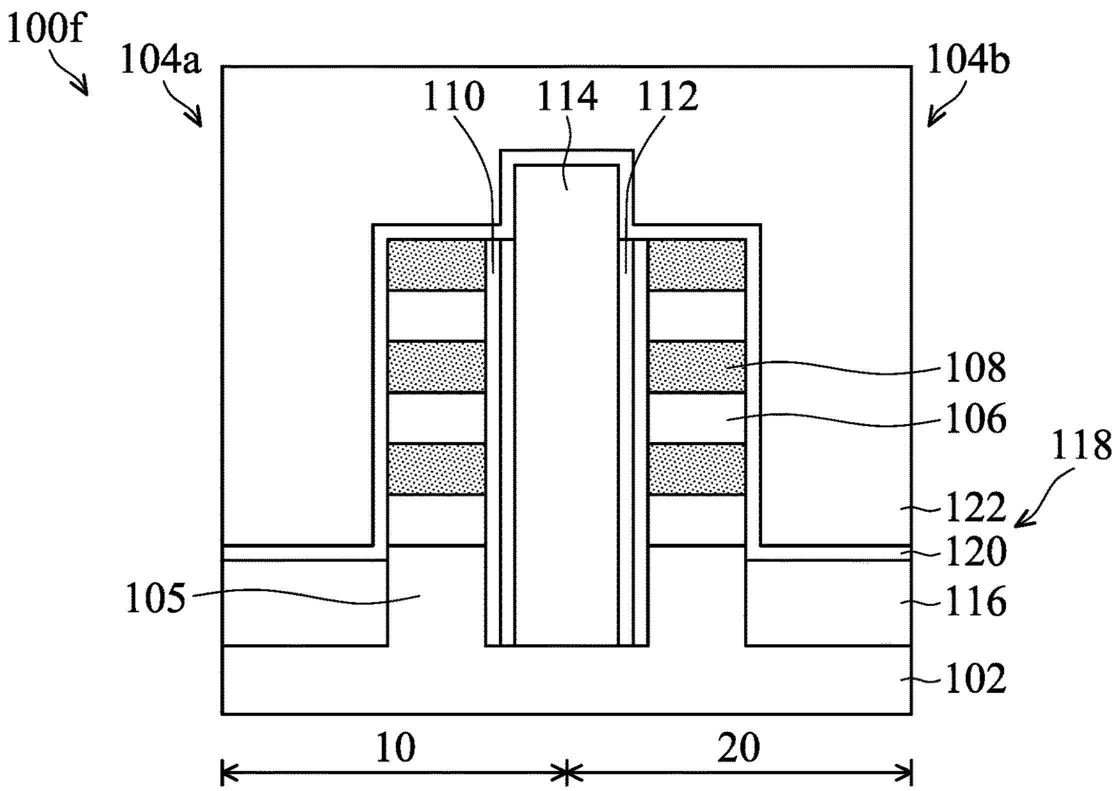

Next, as shown in FIG. 7D, the dummy gate structure 118 is formed across the first stack structure 104*a* and the second stack structure 104*b* and extends over the isolation structure 116, in accordance with some embodiments. The dummy gate structure 118 includes the dummy gate dielectric layer 120 and the dummy gate electrode layer 122.

Figure 7E:
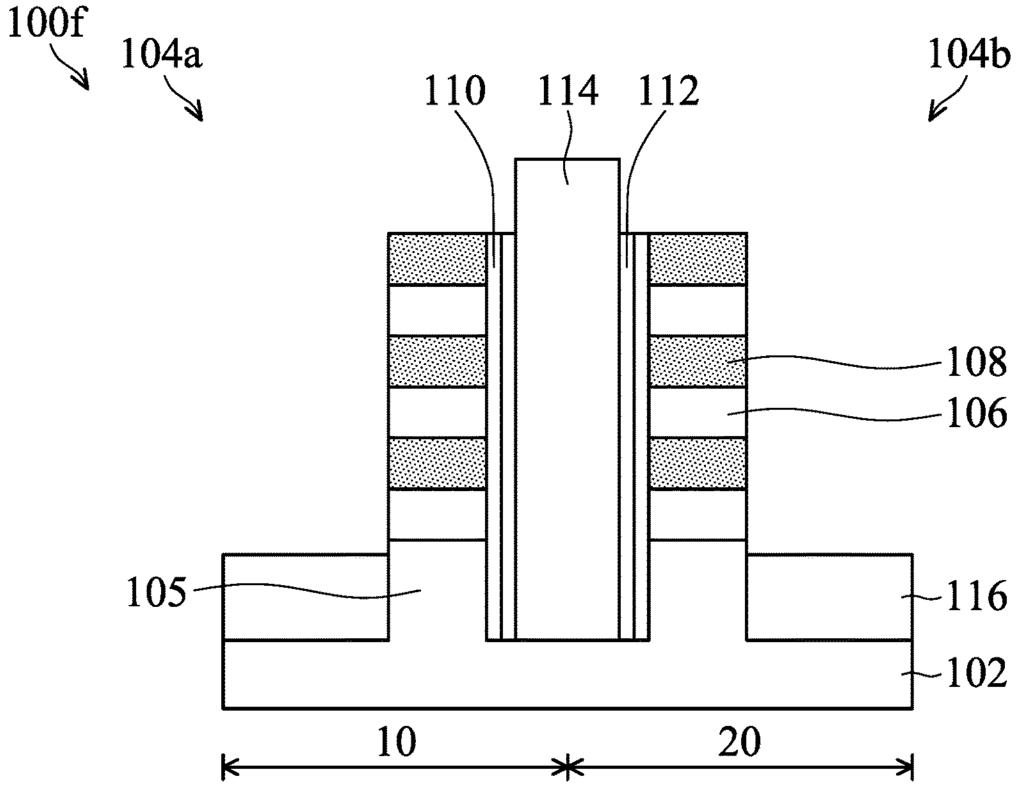

Next, as shown in FIG. 7E, the dummy gate structure 118 is removed to expose the first stack structure 104*a* and the second stack structure 104*b*, in accordance with some embodiments. As a result, the dielectric wall 114 is exposed. In addition, the top surface of the sacrificial layer 110 and the top surface of the vertical layer 112 are exposed.

Figure 7F:
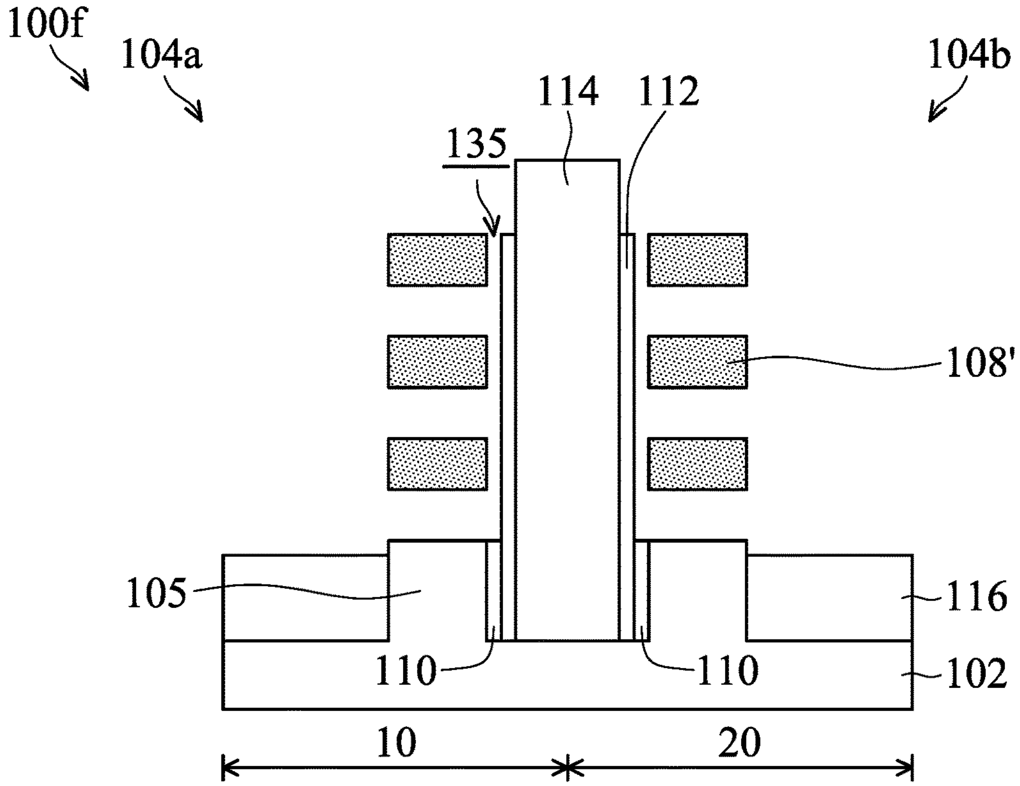

Next, as shown in FIG. 7F, the first semiconductor material layers 106 are removed to form nanostructures 108' with the second semiconductor material layers 108, and a portion of the sacrificial layer 110 is removed to form the opening 135, in accordance with some embodiments.

It should be noted that a bottom portion of the sacrificial layer 110 is remaining, and the remaining sacrificial layer 110 is between the vertical layer 112 and the fin structure 105. In some embodiments, the top surface of the sacrificial layer 110 is substantially leveled with the top surface of the isolation structure 116. In some embodiments, the top surface of the sacrificial layer 110 is substantially leveled with the top surface of the fin structure 105.

Figure 7G:
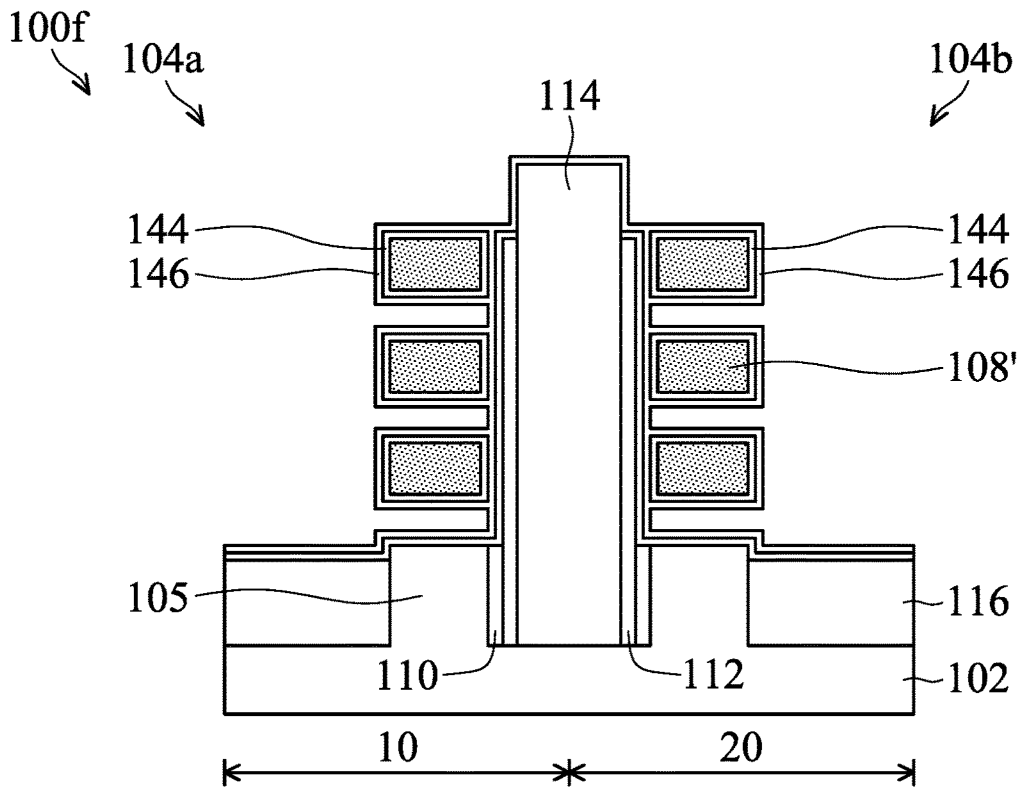

Afterwards, as shown in FIG. 7G, after the nanostructures 108' are formed, the interfacial layer 144 is formed to surround the nanostructures 108' and over the isolation structure 116, and the gate dielectric layer 146 is formed on the interfacial layer 144, in accordance with some embodiments. The interfacial layer 144 is in direct contact with the vertical layer 112.

It should be noted that the opening 135 is completely filled with the interfacial layers 144 and the gate dielectric layers 146. In some other embodiments, the opening 135 is not completely filled with the interfacial layers 144 and the gate dielectric layers 146.

It should be noted that the vertical layer (or vertical nanostructure) 112 is separated from the horizontal nanostructures 108' by the first gate structure 142*a* or the second gate structure 142*b*. More specifically, the vertical layer (or vertical nanostructure) 112 is separated from the horizontal nanostructures 108' by the interfacial layer 144 and the gate dielectric layer 146.

Figure 7H:
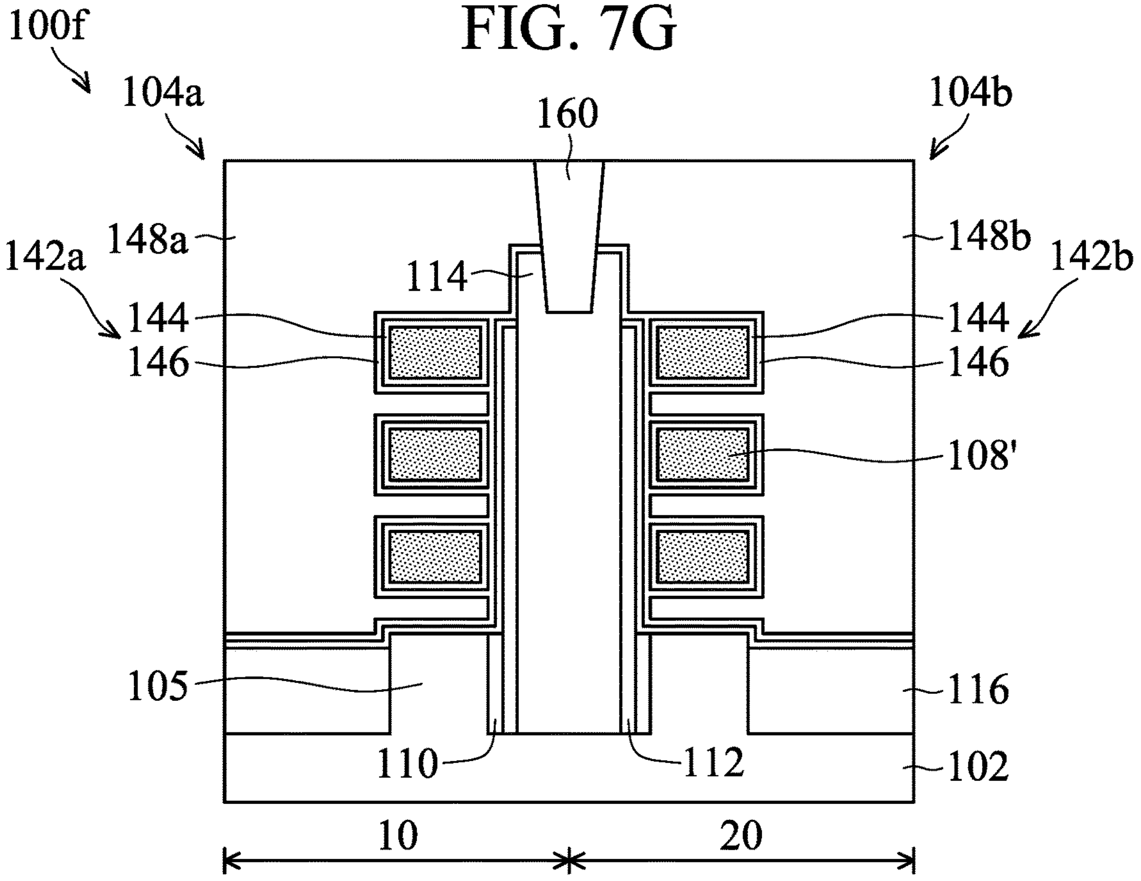

Afterwards, as shown in FIG. 7H, the first gate structure 142*a* is formed in the first region 10, and the second gate structure 142*b* is formed in the second region 20, in accordance with some embodiments. Next, the cap structure 160 is formed over the dielectric wall 114. The first gate structure 142*a* is separated from the second gate structure 142*b* by the dielectric wall 114 and the cap structure 160.

Figure 8A:
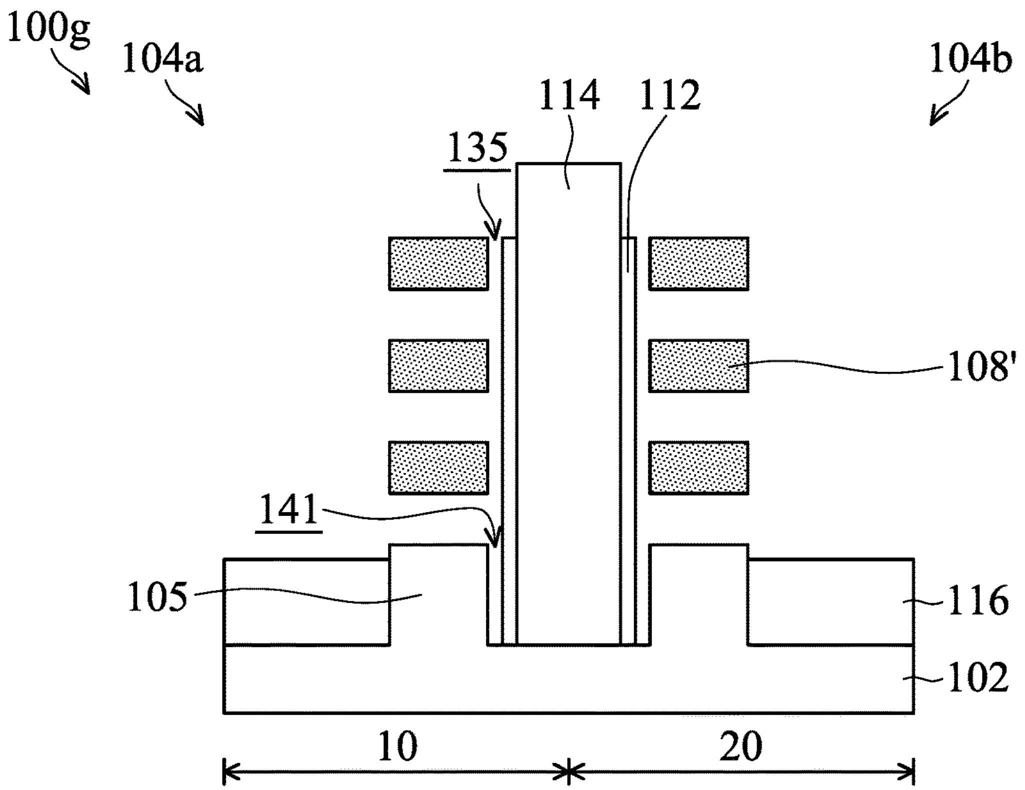
FIGS. 8A to 8B show cross-sectional representations of various stages of manufacturing a semiconductor structure, in accordance with some embodiments.
Figure 8B:
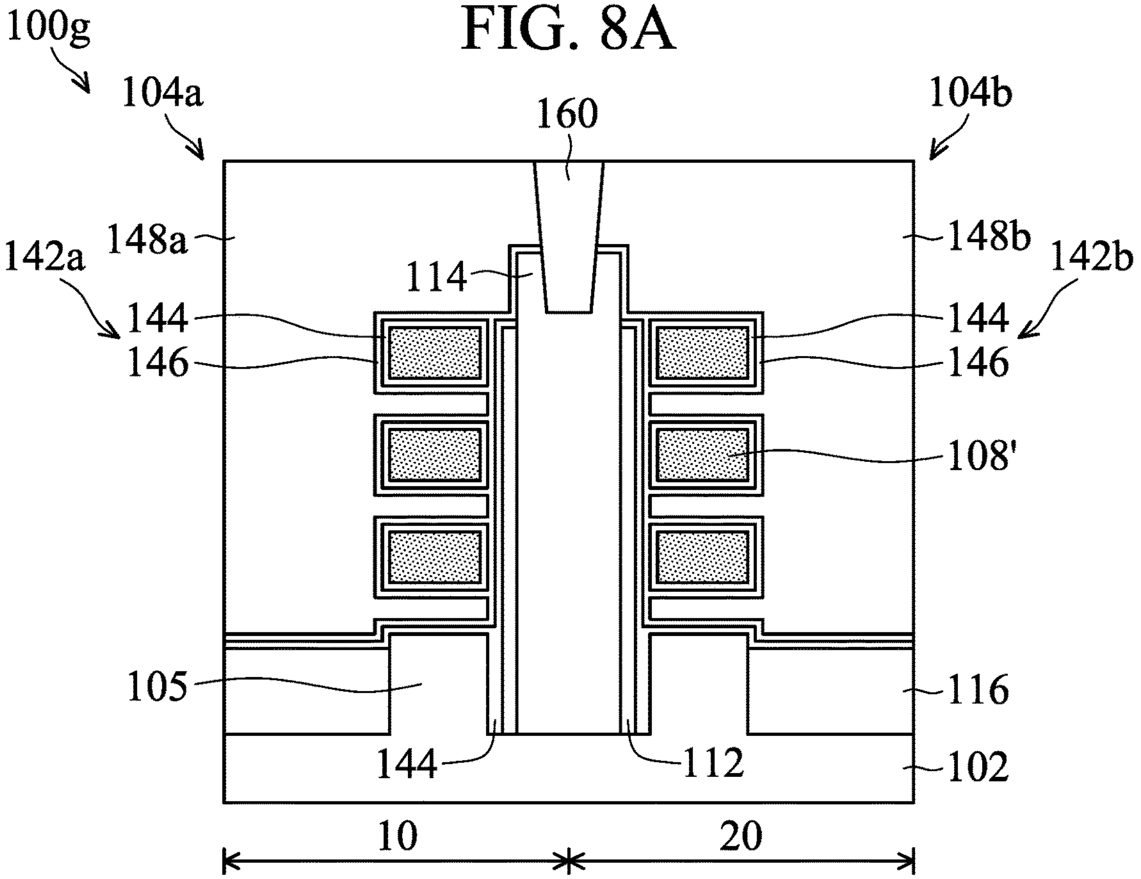

FIGS. 8A to 8B show cross-sectional representations of various stages of manufacturing a semiconductor structure 100*g*, in accordance with some embodiments. The semiconductor structure 100*g* of FIG. 8A-8B includes elements that are similar to, or the same as, elements of the semiconductor structure 100*f* of FIGS. 7A-7H.

As shown in FIG. 8A, the first semiconductor material layers 106 are removed to form nanostructures 108' with the second semiconductor material layers 108, and the sacrificial layer 110 is removed to form the opening 135 and the recess 141, in accordance with some embodiments. It should be noted that the recess 141 is below the top surface of the isolation structure 116. The recess 141 is between the fin structure 105 and the vertical layer 112.

Next, as shown in FIG. 8B, the interfacial layer 144 is filled into the opening 135 and the recess 141, and the gate dielectric layer 146 is formed over the interfacial layer 144, in accordance with some embodiments. Therefore, a portion of the interfacial layer 144 is lower than the top surface of the isolation structure 116.

Afterwards, the first gate structure 142*a* is formed in the first region 10, and the second gate structure 142*b* is formed in the second region 20, in accordance with some embodiments. Next, the cap structure 160 is formed over the dielectric wall 114. It should be noted that a portion of the first gate structure 142*a* is lower than the top surface of the isolation structure 116. In some other embodiments, a portion of the gate dielectric layer 146 is below the top surface of the isolation structure 116.

Figure 9A:
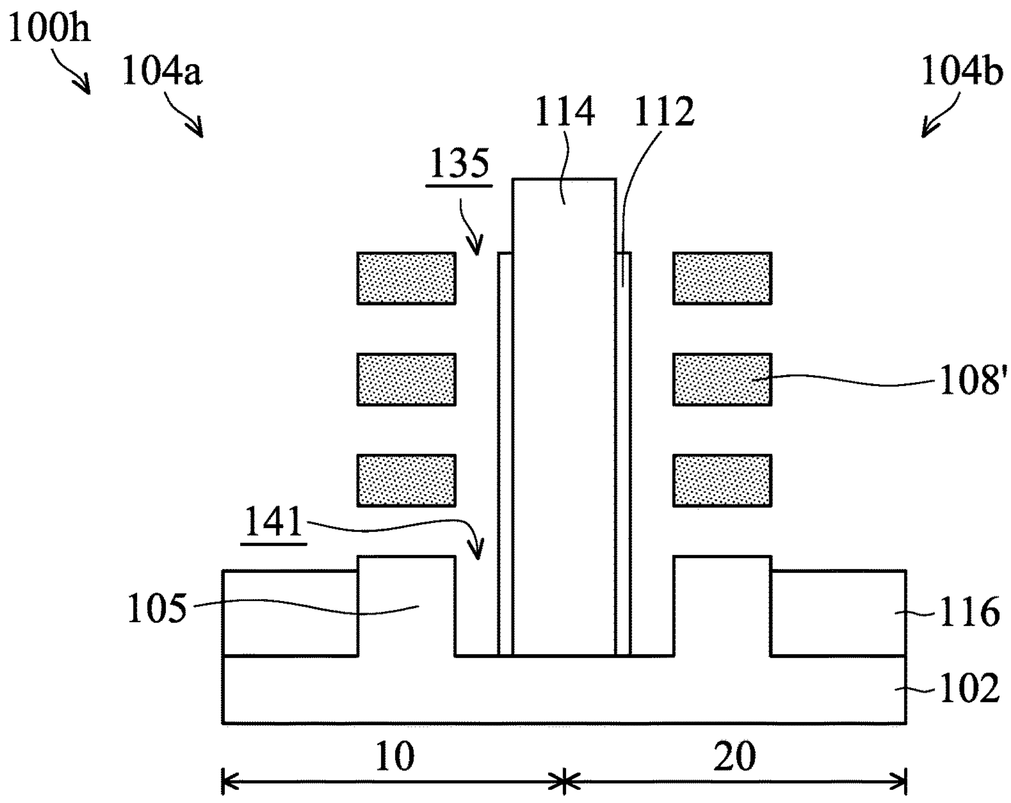
FIGS. 9A to 9B show cross-sectional representations of various stages of manufacturing a semiconductor structure, in accordance with some embodiments.
Figure 9B:
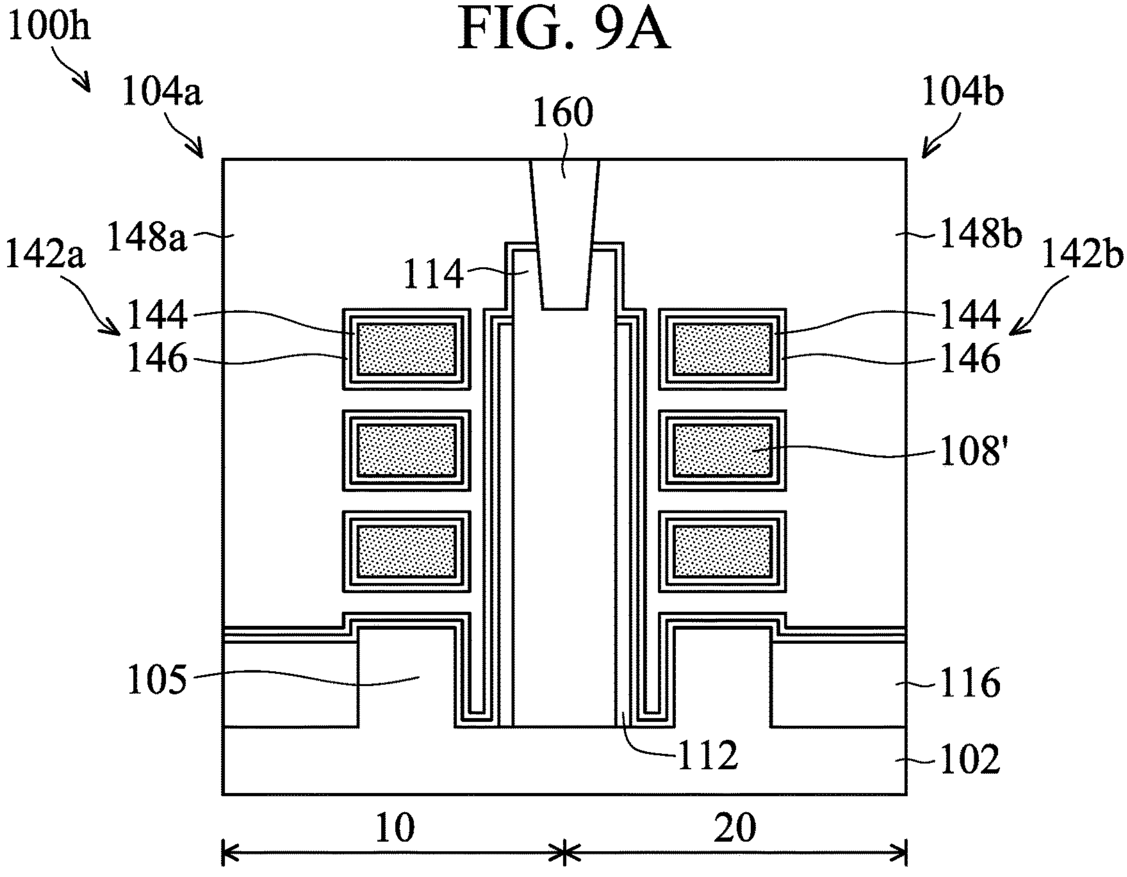

FIGS. 9A to 9B show cross-sectional representations of various stages of manufacturing a semiconductor structure 100*h*, in accordance with some embodiments. The semiconductor structure 100*h* of FIG. 9A-9B includes elements that are similar to, or the same as, elements of the semiconductor structure 100*g* of FIGS. 8A-8B.

The semiconductor structure 100*h* in FIG. 9A is similar to, or the same as, elements of the semiconductor structure 100*g* in FIG. 8A. The difference between FIG. 9A and FIG. 8A is that the opening 135 and the recess 141 in FIG. 9A are greater than the opening 135 and the recess 141 in FIG. 8A.

Next, as shown in FIG. 9B, the interfacial layer 144 is filled into the opening 135 and the recess 141, and the gate dielectric layer 146 is formed over the interfacial layer 144, in accordance with some embodiments. Afterwards, the first gate electrode layer 148*a* and the second gate electrode layer 148*b* are filled into the opening 135 and the recess 141. Next, the cap structure 160 is formed over the dielectric wall 114.

It should be noted that the opening 135 and the recess 141 are filled with the interfacial layer 144, the gate dielectric layer 146, the first gate electrode layer 148*a* and the second gate electrode layer 148*b*. Therefore, a portion of the first gate structure 142*a* is lower than the top surface of the isolation structure 116. The portion of the first gate structure 142*a* is lower than the top surface of the fin structure 105.

It should be noted that the semiconductor structures 100*a*-100*h* described above includes a number of vertical layers (or vertical nanostructures) 112 and a number of the horizontal nanostructures 108. The vertical layers (or vertical nanostructures) 112 are connected and in direct contact with the dielectric wall 114. In some embodiments, the vertical layers (or vertical nanostructures) 112 are connected to and in direct contact with the horizontal nanostructures 108. In some embodiments, the vertical layers (or vertical nanostructures) 112 are separated from the horizontal nanostructures 108. The effective width of the semiconductor structures 100*a*-100*h* is increased due to adding of the vertical layers (or vertical nanostructures) 112. Therefore, the on-state current (Ion) of the semiconductor structure and the performance of the semiconductor structure are improved.

It should be appreciated that the semiconductor structures 100*a* to 100*h* having the vertical layer 112 connected to the dielectric wall 114 between the first fin structure 104*a* and the second fin structure 104*b* described above may also be applied to FinFET structures, although not shown in the figures.

It should be noted that same elements in FIGS. 1A to 9B may be designated by the same numerals and may include similar or the same materials and may be formed by similar or the same processes; therefore such redundant details are omitted in the interest of brevity. In addition, although FIGS. 1A to 9B are described in relation to the method, it will be appreciated that the structures disclosed in FIGS. 1A to 9B are not limited to the method but may stand alone as structures independent of the method. Similarly, although the methods shown in FIGS. 1A to 9B are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a first stack structure and a second stack structure over a substrate. A dielectric wall is formed between the first stack structure and the second stack structure. A vertical layer is formed between the first stack structure and the dielectric wall. A portion of the first stack structure is removed to form a number of horizontal nanostructures. The horizontal nanostructures and the vertical layer are the channel layers of the semiconductor structure. The effective width of the semiconductor structure is increased by adding of the vertical layer. Therefore, the performance of the semiconductor structure is improved.

In some embodiments, a semiconductor structure is provided. The semiconductor structure includes a plurality of first horizontal nanostructures formed over a substrate, and a plurality of second horizontal nanostructures adjacent to the first horizontal nanostructures. The semiconductor structure includes a dielectric wall formed between the first horizontal nanostructures and the second horizontal nanostructures. The semiconductor structure also includes a vertical nanostructure between the dielectric wall and the first horizontal nanostructures, and the vertical nanostructure is in direct contact with the dielectric wall. The semiconductor structure includes a gate structure surrounding the first horizontal nanostructures, the second horizontal nanostructures and the vertical nanostructure.

In some embodiments, a semiconductor structure is provided. The semiconductor structure includes an isolation structure formed over a substrate, and a first fin structure formed adjacent to the isolation structure. The semiconductor structure includes a dielectric wall extending above the isolation structure, and a bottom surface of the dielectric wall is lower than a top surface of the isolation structure. The semiconductor structure includes a plurality of first horizontal channels formed over the first fin structure. The semiconductor structure includes a vertical channel formed adjacent to the dielectric wall, and the vertical channel is in direct contact with the dielectric wall, and the vertical channel extends from a position which is below a top surface of the fin structure. The semiconductor structure includes a gate structure surrounding the first horizontal channels and the vertical channel.

In some embodiments, a method for forming a semiconductor structure is provided. The method includes forming a first stack structure and a second stack structure over a substrate, and forming a vertical layer adjacent to the first stack structure and the second stack structure. The method includes forming a dielectric wall between the first stack structure and the second stack structure, and the dielectric wall is in direct contact with the vertical layer. The method includes removing a portion of the first stack structure to form a plurality of first nanostructures, and removing a portion of the second stack structure to form a plurality of second nanostructures. The method includes forming a gate structure to surround the vertical layer, the first nanostructures and the second nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate;

a first fin structure extending vertically above the substrate;

a second fin structure extending vertically above the substrate adjacent the first fin structure;

a plurality of first horizontal nanostructures formed over the first fin structure;

a plurality of second horizontal nanostructures adjacent to the first horizontal nanostructures and formed over the second fin structure;

a dielectric wall formed between the first horizontal nanostructures, the second horizontal nanostructures, the first fin structure, and the second fin structure;

a vertical nanostructure between the dielectric wall and the first horizontal nanostructures, the vertical nanostructure comprising a semiconductor horizontal portion extending continuously between the first fin structure and the second fin structure, wherein the vertical nanostructure is in direct contact with the dielectric wall and a portion of the dielectric wall nearest the substrate overlies the semiconductor horizontal portion; and a gate structure surrounding the first horizontal nanostructures, the second horizontal nanostructures and the vertical nanostructure.

2. The semiconductor structure as claimed in claim 1, wherein the vertical nanostructure is connected to the first horizontal nanostructures.

3. The semiconductor structure as claimed in claim 1, wherein the vertical nanostructure is separated from the first horizontal nanostructures.

4. The semiconductor structure as claimed in claim 3, wherein the vertical nanostructure is separated from the first horizontal nanostructures by a portion of the gate structure.

5. The semiconductor structure as claimed in claim 1, further comprising:

an isolation structure formed over the substrate, wherein a portion of the dielectric wall is lower than a top surface of the isolation structure.

6. The semiconductor structure as claimed in claim 5, wherein a portion of the gate structure is lower than the top surface of the isolation structure.

7. The semiconductor structure as claimed in claim 1, further comprising:

a first source/drain (S/D) structure connected to the first horizontal nanostructures; and a spacer layer adjacent to the first S/D structure, wherein a top surface of the spacer layer is lower than a top surface of the dielectric wall.

8. The semiconductor structure as claimed in claim 1, wherein the first horizontal nanostructures and the vertical nanostructure form an E-shaped structure.

9. The semiconductor structure as claimed in claim 1, wherein the first horizontal nanostructures and the vertical nanostructure are made of different materials.

10. A semiconductor structure, comprising: an isolation structure formed over a substrate; a first fin structure formed adjacent to the isolation structure; a dielectric wall extending above the isolation structure, wherein a bottom surface of the dielectric wall is lower than a top surface of the isolation structure; a plurality of first horizontal channels formed over the first fin structure; a semiconductor vertical channel layer comprising: a vertical channel formed adjacent to the dielectric wall, wherein the vertical channel is in direct contact with the dielectric wall, and the vertical channel extends from a position which is below a top surface of the first fin structure; and a layer portion of the semiconductor vertical channel layer underlying the isolation structure; and a gate structure surrounding the first horizontal channels and the vertical channel.

11. The semiconductor structure as claimed in claim 10, further comprising:

a second fin structure formed adjacent to the isolation structure; and a plurality of second horizontal channels formed over the second fin structure, wherein the dielectric wall is between the first horizontal channels and the second horizontal channels.

12. The semiconductor structure as claimed in claim 10, further comprising:

a sacrificial layer formed between and in direct contact with the first fin structure and the vertical channel.

13. The semiconductor structure as claimed in claim 10, wherein a portion of the gate structure is lower than a top surface of the first fin structure.

14. The semiconductor structure as claimed in claim 10, wherein the first horizontal channels and the vertical channel forms an E-shaped structure.

15. The semiconductor structure as claimed in claim 10, wherein each of the first horizontal channels has a first thickness, the vertical channel has a second thickness, and the first thickness is greater than or equal to the second thickness.

16. A semiconductor structure, comprising:

a substrate;

a stack of nanostructure channels above the substrate, the stack comprising a first nanostructure channel and a second nanostructure channel over the first nanostructure channel;

a first source/drain (S/D) structure on the substrate and adjacent the stack of nanostructure channels along a first direction;

a second S/D structure on the substrate and adjacent the first S/D structure along a second direction different than the first direction;

a dielectric wall between the first S/D structure and the second S/D structure;

a vertical layer comprising a semiconductor material and positioned between the stack of nanostructure channels and the dielectric wall along the second direction; and a gate structure comprising a gate electrode layer overlying the vertical layer and the dielectric wall, the gate structure having a portion in contact with an uppermost surface of the first nanostructure channel and a bottommost surface of the second nanostructure channel along a third direction different than the first direction.

17. The semiconductor structure as claimed in claim 16, wherein the gate structure further comprises:

an interfacial layer disposed between the vertical layer and the gate electrode layer.

18. The semiconductor structure as claimed in claim 17, wherein the gate structure further comprises:

a gate dielectric layer disposed between the interfacial layer and the gate electrode layer.

19. The semiconductor structure as claimed in claim 18, wherein the vertical layer is in contact with the interfacial layer and the gate dielectric layer.

20. The semiconductor structure as claimed in claim 16, further comprising:

a horizontal channel contacting the first S/D structure, wherein the vertical layer is disposed between the dielectric wall and the horizontal channel.

* * * * *